United States Patent
Kishino et al.

(10) Patent No.: US 9,960,370 B2
(45) Date of Patent: May 1, 2018

(54) ORGANIC LIGHT-EMITTING DEVICE AND DISPLAY APPARATUS

(71) Applicant: CANON KABUSHIKI KAISHA, Tokyo (JP)

(72) Inventors: Kengo Kishino, Tokyo (JP); Akihito Saitoh, Gotemba (JP); Jun Kamatani, Tokyo (JP); Naoki Yamada, Inagi (JP); Tetsuya Kosuge, Yokohama (JP); Takayuki Horiuchi, Tokyo (JP); Shigemoto Abe, Yokohama (JP); Yosuke Nishide, Kawasaki (JP); Hirokazu Miyashita, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 323 days.

(21) Appl. No.: 14/648,095

(22) PCT Filed: Dec. 25, 2013

(86) PCT No.: PCT/JP2013/085323
§ 371 (c)(1),
(2) Date: May 28, 2015

(87) PCT Pub. No.: WO2014/104395
PCT Pub. Date: Jul. 3, 2014

(65) Prior Publication Data
US 2015/0303386 A1    Oct. 22, 2015

(30) Foreign Application Priority Data

Dec. 27, 2012 (JP) ................. 2012-285620
Dec. 20, 2013 (JP) ................. 2013-264147

(51) Int. Cl.
*H01L 51/00* (2006.01)
*C09K 11/06* (2006.01)
(Continued)

(52) U.S. Cl.
CPC .......... *H01L 51/0085* (2013.01); *C09K 11/06* (2013.01); *H01L 27/322* (2013.01);
(Continued)

(58) Field of Classification Search
None
See application file for complete search history.

(56) References Cited

U.S. PATENT DOCUMENTS

| 6,824,894 B2 | 11/2004 | Takiguchi et al. |
| 7,078,115 B2 | 7/2006 | Takiguchi et al. |

(Continued)

FOREIGN PATENT DOCUMENTS

| CN | 101945839 A | 1/2011 |
| EP | 2062958 A1 | 5/2009 |

(Continued)

OTHER PUBLICATIONS

Chinese Office Action dated May 5, 2016, in corresponding CN Application No. 201380067403.1 (22 pages including translation).

(Continued)

*Primary Examiner* — Robert S Loewe
(74) *Attorney, Agent, or Firm* — Fitzpatrick, Cella, Harper & Scinto

(57) ABSTRACT

Provided is an organic light-emitting device improved in emission efficiency and lifetime. The organic light-emitting device includes a pair of electrodes and an organic compound layer disposed between the pair of electrodes, in which: the organic compound layer includes a benzo[f] isoquinoline iridium complex of a specific structure and a hydrocarbon compound of a specific structure; and the hydrocarbon compound is a compound formed only of an $SP^2$ carbon atom and a hydrogen atom.

26 Claims, 2 Drawing Sheets

(51) Int. Cl.
*H01L 27/32* (2006.01)
*H01L 51/50* (2006.01)
*H01L 51/52* (2006.01)

(52) U.S. Cl.
CPC ...... *H01L 27/3248* (2013.01); *H01L 51/0054* (2013.01); *H01L 51/0058* (2013.01); *C09K 2211/1011* (2013.01); *C09K 2211/1029* (2013.01); *C09K 2211/185* (2013.01); *H01L 51/5004* (2013.01); *H01L 51/5016* (2013.01); *H01L 51/5028* (2013.01); *H01L 51/5206* (2013.01); *H01L 51/5221* (2013.01); *H01L 2251/5384* (2013.01); *H01L 2251/552* (2013.01)

(56) References Cited

U.S. PATENT DOCUMENTS

| | | | |
|---|---|---|---|
| 7,232,618 B2 | 6/2007 | Yamada et al. | |
| 7,976,958 B2 | 7/2011 | Takiguchi et al. | |
| 8,076,681 B2* | 12/2011 | Mori | H01L 51/5016 257/103 |
| 8,211,552 B2* | 7/2012 | Nishimura | C09K 11/06 257/40 |
| 8,330,153 B2 | 12/2012 | Ooishi et al. | |
| 8,426,036 B2 | 4/2013 | Nishimura et al. | |
| 8,729,541 B2 | 5/2014 | Kosuge et al. | |
| 8,835,637 B2 | 9/2014 | Cysewski et al. | |
| 2006/0280965 A1* | 12/2006 | Kwong | C07C 13/62 428/690 |
| 2008/0210930 A1 | 9/2008 | Kamatani et al. | |
| 2009/0159130 A1 | 6/2009 | Eum et al. | |
| 2009/0174313 A1 | 7/2009 | Nishimura et al. | |
| 2010/0219407 A1 | 9/2010 | Kamarani et al. | |
| 2010/0289406 A1* | 11/2010 | Ma | C07D 221/18 313/504 |
| 2010/0292481 A1 | 11/2010 | Oda et al. | |
| 2010/0295027 A1 | 11/2010 | Kawamura et al. | |
| 2010/0331585 A1* | 12/2010 | Kawamura | C07C 13/567 585/26 |
| 2011/0001130 A1* | 1/2011 | Nishimura | C09K 11/06 257/40 |
| 2011/0001864 A1* | 1/2011 | Okinaka | H01L 51/5012 348/333.01 |
| 2011/0227049 A1 | 9/2011 | Xia et al. | |
| 2012/0104364 A1* | 5/2012 | Cheng | C07C 15/30 257/40 |
| 2012/0181528 A1* | 7/2012 | Takada | C07F 15/0033 257/40 |
| 2012/0292608 A1* | 11/2012 | Ise | C09K 11/06 257/40 |
| 2012/0319568 A1* | 12/2012 | Ise | C09K 11/06 313/504 |
| 2013/0187143 A1 | 7/2013 | Nishimura et al. | |
| 2014/0021449 A1 | 1/2014 | Xia et al. | |
| 2015/0307535 A1 | 10/2015 | Xia et al. | |
| 2016/0145281 A1 | 5/2016 | Cysewski et al. | |

FOREIGN PATENT DOCUMENTS

| | | |
|---|---|---|
| EP | 2166592 A1 | 3/2010 |
| JP | 2005-71983 A | 3/2005 |
| JP | 2009-114137 A | 5/2009 |
| JP | 2009-130141 A1 | 6/2009 |
| JP | 4703139 B2 | 6/2011 |
| WO | 2008/062129 A1 | 5/2008 |
| WO | 2009-060995 A1 | 5/2009 |
| WO | 2010/027583 A1 | 3/2010 |
| WO | 2010/028151 A1 | 3/2010 |
| WO | 2012/060307 A1 | 5/2012 |
| WO | 2012/107419 A1 | 8/2012 |

OTHER PUBLICATIONS

Extended European Search report, dated Aug. 28, 2016, issued in counterpart application 13868746.2 (11 pages).
Extended European Search report, dated Sep. 28, 2016, issued in counterpart application 13868746.2 (11 pages).
Japanese Office Action issued in corresponding application No. 2013-264147 dated Jun. 30, 2015—6 pages with English translation.
S.J. Blanksby et al., "Bond Dissociation Energies of Organic Molecules", Acc. Chem. Res. 2003, 36, 255-563.
Pending U.S. Appl. No. 14/758,683, filed Jun. 30, 2015.
Pending U.S. Appl. No. 14/648,494, filed May 29, 2015.
Pending U.S. Appl. No. 14/649,048, filed Jun. 2, 2015.
Pending U.S. Appl. No. 14/761,049, filed Jul. 15, 2015.
Pending U.S. Appl. No. 14/760,093, filed Jul. 9, 2015.

* cited by examiner

ORGANIC LIGHT-EMITTING DEVICE AND DISPLAY APPARATUS

TECHNICAL FIELD

The present invention relates to an organic light-emitting device and a display apparatus.

BACKGROUND ART

An organic light-emitting device (also referred to as "organic electroluminescent device" or "organic EL device") is an electronic device including an anode and a cathode, and an organic compound layer disposed between both the electrodes. A hole and an electron injected from the respective electrodes (the anode and the cathode) recombine in the organic compound layer to produce an exciton, and the organic light-emitting device emits light upon return of the exciton to its ground state. Recent development of the organic light-emitting devices is significant and the developed devices have, for example, the following features. The light-emitting devices can be driven at low voltages, emit light beams having various wavelengths, have high-speed responsiveness, and can be reduced in thickness and weight.

By the way, the creation of a compound suitable as a constituent material for the organic light-emitting device has been vigorously performed heretofore. This is because the creation of a compound having an excellent device lifetime characteristic is important for providing a high-performance organic light-emitting device.

PTL 1 proposes, for example, an iridium complex represented by the following formula as a compound suitable as the constituent material for the organic light-emitting device. In addition, PTL 2 proposes a triphenylene compound as a compound to be incorporated as a host into an emission layer. Further, PTL 3 proposes a hydrocarbon condensed aromatic compound as a phosphorescent red-light-emitting material.

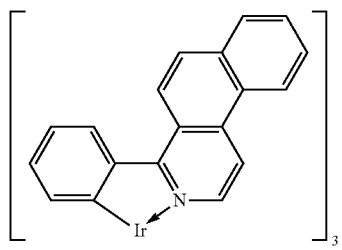

CITATION LIST

Patent Literature

PTL 1: Japanese Patent Application Laid-Open No. 2009-114137
PTL 2: Japanese Patent Application Laid-Open No. 2005-71983
PTL 3: International Patent Application No. WO2008/062129A
PTL 4: International Patent Application No. WO2010/028151A

Non Patent Literature

NPL 1: ACCOUNTS OF CHEMICAL RESEARCH VOL. 36, NO. 4, 2003, pps. 255-263

SUMMARY OF INVENTION

Solution to Problem

According to one aspect of the present invention, there is provided an organic light-emitting device,
including:
a pair of electrodes; and
an organic compound layer disposed between the pair of electrodes,
in which:
the organic compound layer includes an iridium complex represented by the following general formula [1] and a hydrocarbon compound represented by the following general formula [5]; and
the hydrocarbon compound includes a compound formed only of an $SP^2$ carbon atom and a hydrogen atom.

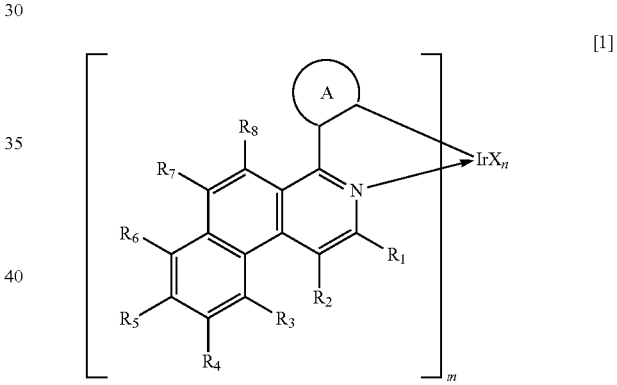

In the formula [1], $R_1$ to $R_8$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group.

m represents an integer of 1 to 3 and n represents an integer of 0 to 2, provided that m+n equals 3.

A ring A represents a cyclic structure selected from a benzene ring, a naphthalene ring, a fluorene ring, a phenanthrene ring, a 9,9-spirobifluorene ring, and a chrysene ring, and is covalently bonded to a benzo[f]isoquinoline skeleton and an Ir metal, and the ring A may further have a substituent.

X represents a bidentate ligand.

A partial structure $IrX_n$ includes any one of structures represented by the following general formulae [2] to [4].

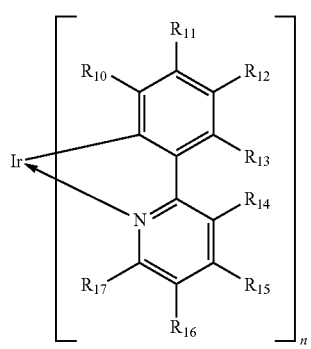

[2]

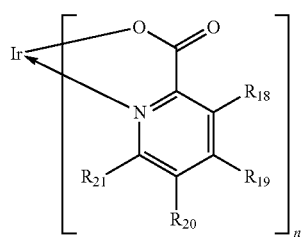

[3]

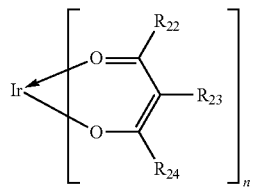

[4]

In the formulae [2] to [4], $R_{10}$ to $R_{24}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group.

$$Ar_1\text{-}(Ar_2)_p\text{—}(Ar_3)_q\text{—}Ar_1 \quad [5]$$

In the formula [5], p and q each represent 0 or 1, and p+q is equal to or more than 1.

$Ar_1$ represents any one of substituents represented in the following substituent group α.

$Ar_2$ and $Ar_3$ each represent any one of substituents represented in the following substituent group β, and $Ar_2$ and $Ar_3$ may be identical to or different from each other.

[Substituent Group α]

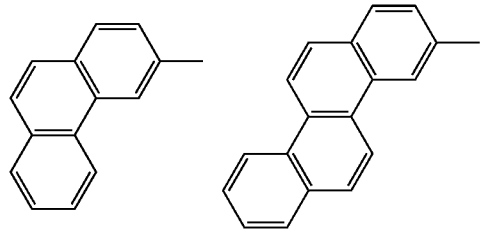

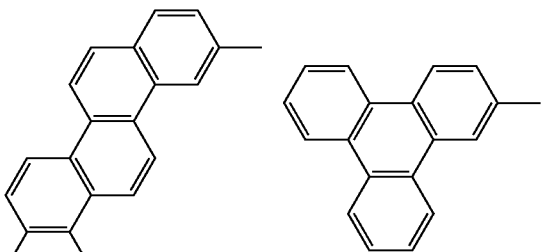

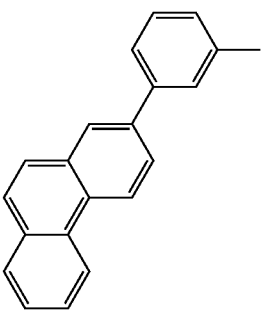

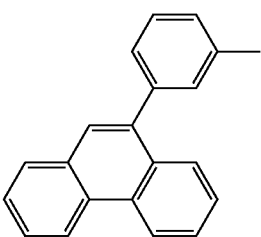

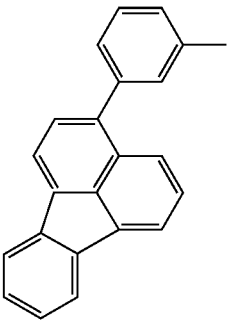

[Substituent Group β]

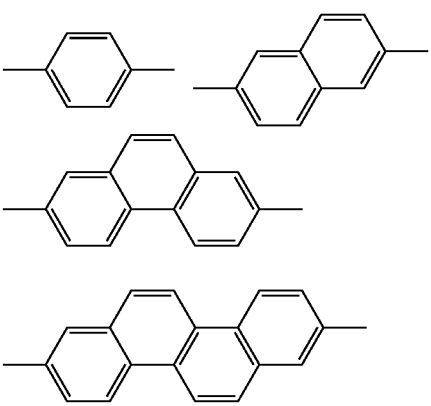

-continued

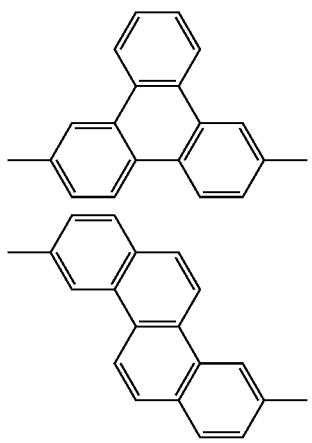

According to another aspect of the present invention, there is provided an organic light-emitting device, including:

a pair of electrodes; and an organic compound layer disposed between the pair of electrodes, in which the organic compound layer includes an iridium complex represented by the following general formula [6] and a hydrocarbon compound represented by the following general formula [10].

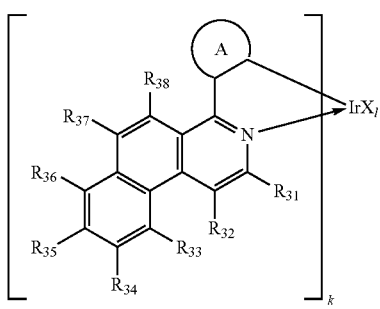

[6]

In the formula [6], $R_{31}$ to $R_{38}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group.

k represents an integer of 1 to 3 and l represents an integer of 0 to 2, provided that k+l equals 3.

A ring A represents a cyclic structure selected from a benzene ring, a naphthalene ring, a fluorene ring, a phenanthrene ring, a 9,9-spirobifluorene ring, and a chrysene ring, and is covalently bonded to a benzo[f]isoquinoline skeleton and an Ir metal, and the ring A may further have a substituent.

X represents a bidentate ligand.

A partial structure $IrX_l$ includes any one of structures represented by the following general formulae [7] to [9].

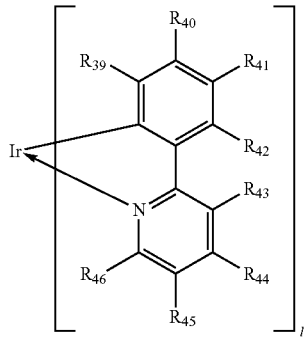

[7]

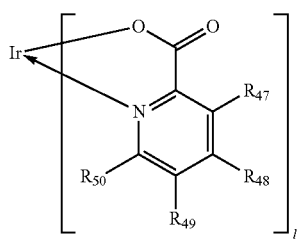

[8]

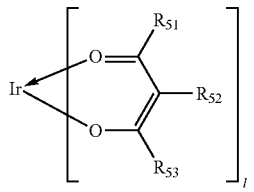

[9]

In the formulae [7] to [9], $R_{39}$ to $R_{53}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group.

$$Ar_5—(Ar_6)_r—(Ar_7)_s—Ar_8 \quad [10]$$

In the formula [10], r and s each represent 0 or 1. In addition, r+s is equal to or more than 1.

$Ar_5$ represents any one of substituents represented in the following substituent group α'.

$Ar_6$ and $Ar_7$ each represent any one of substituents represented in the following substituent group β', and $Ar_6$ and $Ar_7$ may be identical to or different from each other.

$Ar_8$ represents any one of substituents represented in the following substituent group γ'.

[Substituent Group α']

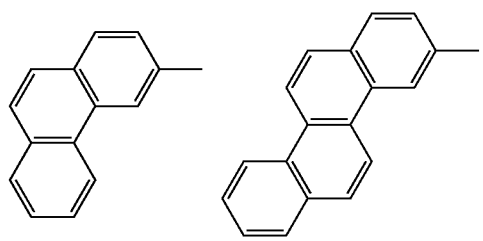

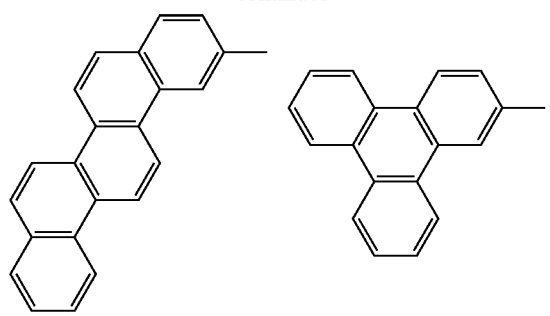
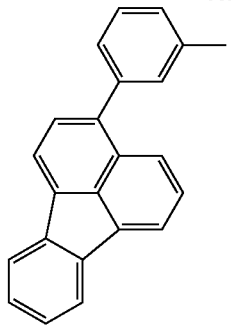 [SMILES: Cc1cccc(-c2ccc3c4c(cccc24)-c2ccccc2-3)c1]
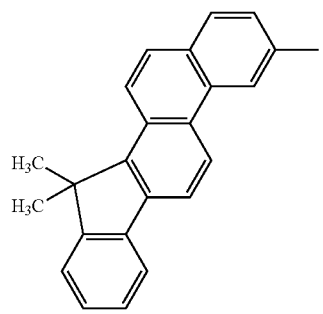
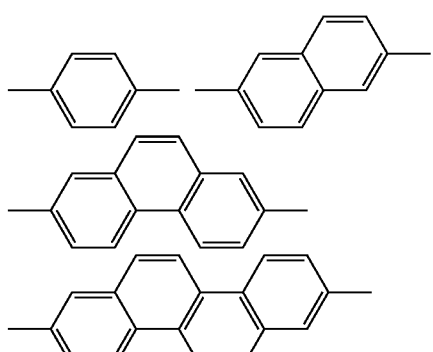
[Substituent Group β']
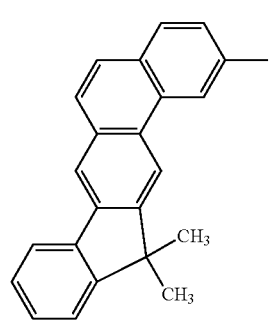
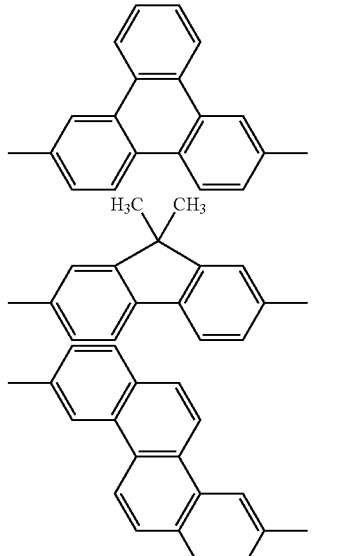
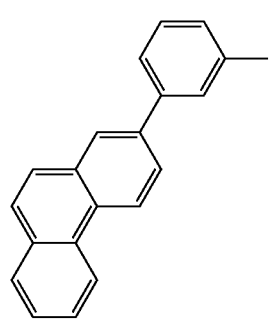
[Substituent Group γ']
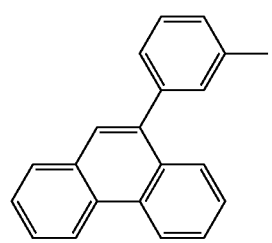
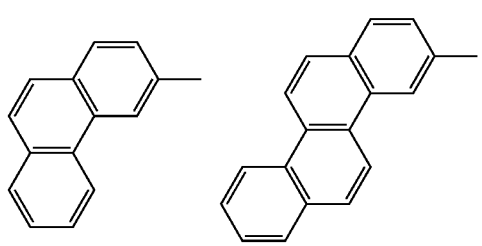

-continued

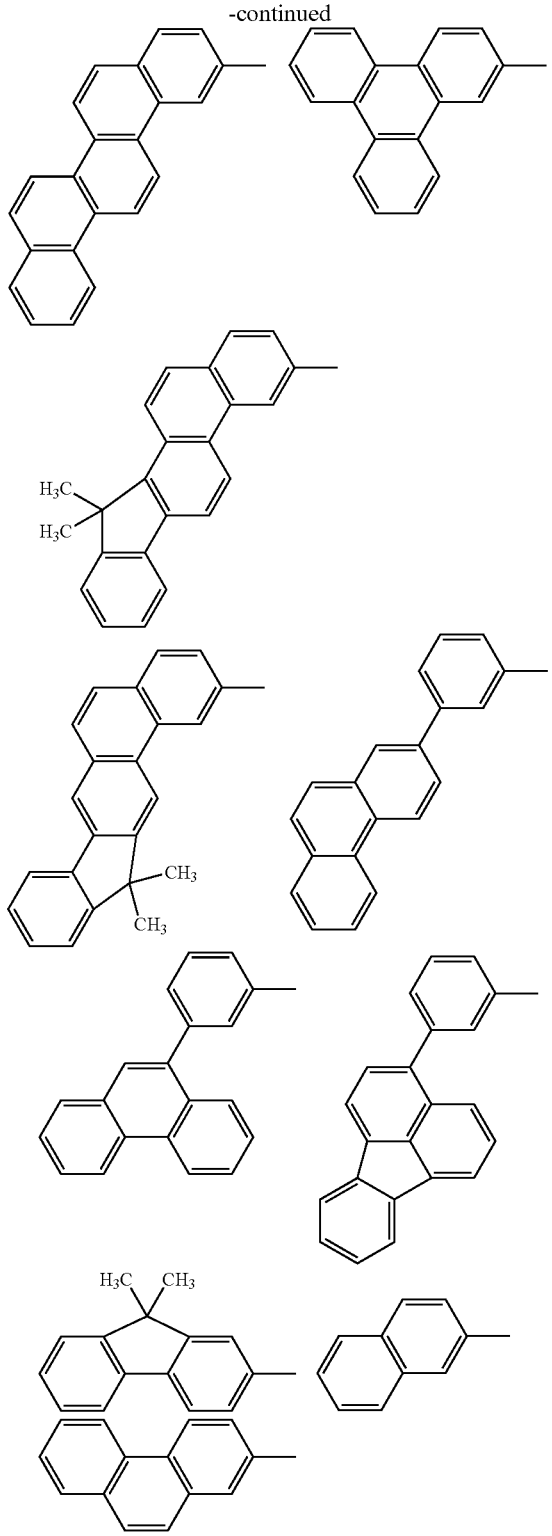

Further features of the present invention will become apparent from the following description of exemplary embodiments with reference to the attached drawings.

DESCRIPTION OF EMBODIMENTS

Preferred embodiments of the present invention will now be described in detail in accordance with the accompanying drawings.

None of the compounds proposed in PTL 1 to 3 can be said to be a material that can be put into practical use as a constituent material for an organic light-emitting device to be provided in a display apparatus, and additional improvements have been needed for the compounds.

The present invention has been made to solve the problems, and an object of the present invention is to provide an organic light-emitting device improved in emission efficiency and lifetime.

Hereinafter, the present invention is described in detail.

(1) Organic Light-Emitting Device

An organic light-emitting device according to the present invention is a light-emitting device including at least: an anode and a cathode as a pair of electrodes opposite to each other; and an organic compound layer disposed between the pair of electrodes. In addition, the organic light-emitting device of the present invention includes, in the organic compound layer, an iridium complex represented by the following general formula [1] and a hydrocarbon compound represented by the following general formula [5].

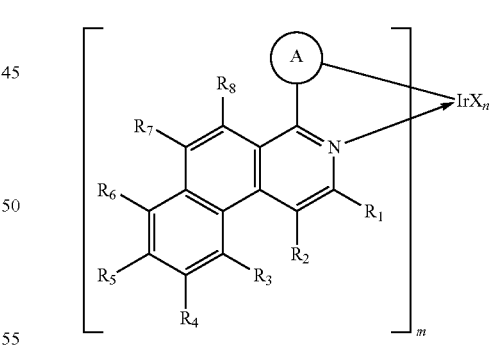

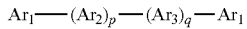

It is to be noted that in the present invention, an iridium complex represented by the following general formula [6] may be incorporated instead of the iridium complex represented by the general formula [1] into the organic compound layer, and a hydrocarbon compound represented by the following general formula [10] may be incorporated instead of the hydrocarbon compound represented by the general formula [5] into the layer.

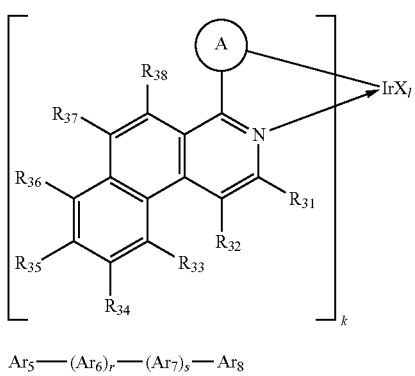

[6]

Ar₅—(Ar₆)ᵣ—(Ar₇)ₛ—Ar₈ [10]

It is to be noted that details about the iridium complex represented by each of the general formulae [1] and [6] and the hydrocarbon compound represented by each of the general formulae [5] and [10] are described later.

Hereinafter, the organic light-emitting device of the present invention is described with reference to the drawings.

Figure 1A:
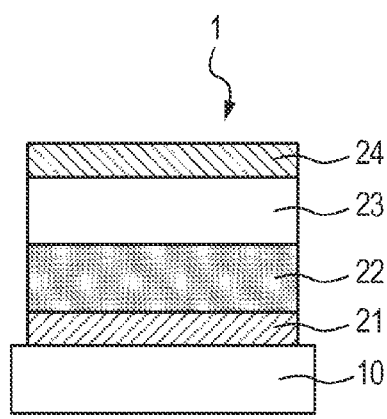
FIGS. 1A, 1B and 1C are schematic sectional views illustrating organic light-emitting devices according to exemplary embodiments of the present invention, FIG. 1A being a view illustrating a first embodiment, FIG. 1B being a view illustrating a second embodiment, and FIG. 1C being a view illustrating a third embodiment.
Figure 1B:
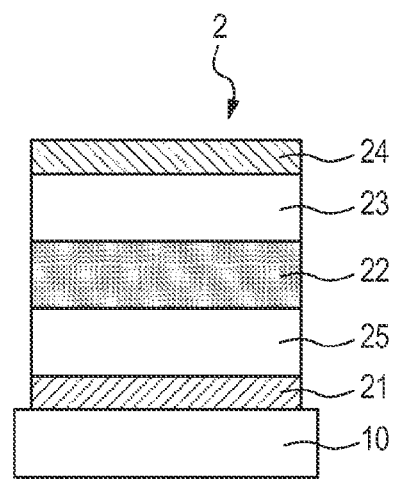
Figure 1C:
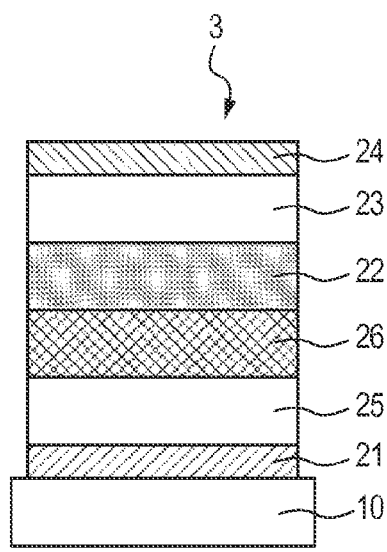

FIGS. 1A to 1C are schematic sectional views illustrating organic light-emitting devices according to exemplary embodiments of the present invention, FIG. 1A being a view illustrating a first embodiment, FIG. 1B being a view illustrating a second embodiment, and FIG. 1C being a view illustrating a third embodiment. First, reference numerals in the figures are described. An organic light-emitting device is represented by reference numeral 1 (2, 3), a display apparatus is represented by reference numeral 4, a substrate is represented by reference numeral 10, a base material is represented by reference numeral 11, a TFT driving circuit is represented by reference numeral 12, a planarizing layer is represented by reference numeral 13, a pixel separation film is represented by reference numeral 14, an organic red-light-emitting device is represented by reference numeral 20R, an organic green-light-emitting device is represented by reference numeral 20G, an organic blue-light-emitting device is represented by reference numeral 20B, an anode is represented by reference numeral 21, a reflecting electrode layer is represented by reference numeral 21a, a transparent electrode layer is represented by reference numeral 21b, an emission layer is represented by reference numeral 22, a red-light-emitting layer is represented by reference numeral 22R, a green-light-emitting layer is represented by reference numeral 22G, a blue-light-emitting layer is represented by reference numeral 22B, an electron-injecting/transporting layer is represented by reference numeral 23, a cathode is represented by reference numeral 24, a hole-injecting/transporting layer is represented by reference numeral 25, an electron/exciton-blocking layer is represented by reference numeral 26, an encapsulating film is represented by reference numeral 30, an encapsulating glass 40 is represented by reference numeral 40, and a circularly polarizing plate is represented by reference numeral 50.

In the organic light-emitting device 1 of FIG. 1A, the anode 21, the emission layer 22, the electron-injecting/transporting layer 23, and the cathode 24 are provided in the stated order on the substrate 10. The organic light-emitting device 1 of FIG. 1A is useful when the emission layer 22 has all of hole-transporting performance, electron-transporting performance, and light-emitting performance. In addition, the organic light-emitting device 1 of FIG. 1A is also useful when a hole-transporting material, an electron-transporting material, and a light-emitting material are mixed in the emission layer 22.

The organic light-emitting device 2 of FIG. 1B is different from the organic light-emitting device 1 of FIG. 1A in that the hole-injecting/transporting layer 25 is provided between the anode 21 and the emission layer 22. In the organic light-emitting device 2 of FIG. 1B, a layer having a carrier-transporting function and a layer having a light-emitting function are separated from each other, and hence compounds having respective characteristics, i.e., hole-transporting property, electron-transporting property, and light-emitting property can be used in combination as appropriate. Accordingly, the degree of freedom in material selection extremely increases and emission efficiency can be improved by effectively trapping each charge or exciton in the central emission layer 22.

The organic light-emitting device 3 of FIG. 1C is different from the organic light-emitting device 2 of FIG. 1B in that the electron/exciton-blocking layer 26 is provided between the emission layer 22 and the hole-injecting/transporting layer 25. The organic light-emitting device 3 of FIG. 1C is provided with the electron/exciton-blocking layer 26 and hence an electron can be trapped in the emission layer 22. Accordingly, as in FIG. 1B, the emission efficiency can be improved.

It is to be noted that the organic light-emitting devices illustrated in FIGS. 1A to 1C are only very basic device constructions and the present invention is not limited thereto. For example, the following various layer constructions can each be adopted: an insulating layer, an adhesion layer, or an interference layer is provided at an interface between an electrode and the organic compound layer, or the hole-transporting layer is constituted of two layers having different HOMO's or ionization potentials.

In addition to the constructions illustrated in FIGS. 1A to 1C, examples of the device construction of the organic light-emitting device include the following constructions (1) to (5). It is to be noted that in each of the device constructions, the organic compound layer necessarily includes an emission layer including a light-emitting material.

(1) (Substrate/)anode/emission layer/cathode
(2) (Substrate/)anode/hole-transporting layer/emission layer/electron-transporting layer/cathode
(3) (Substrate/)anode/hole-transporting layer/emission layer/electron-transporting layer/cathode (FIG. 1B))
(4) (Substrate/)anode/hole-injecting layer/hole-transporting layer/emission layer/electron-transporting layer/cathode
(5) (Substrate/)anode/hole-transporting layer/emission layer/hole/exciton-blocking layer/electron-transporting layer/cathode In the present invention, the aspect according to which light output from the emission layer is extracted (device form) may be the so-called bottom emission system in which the light is extracted from an electrode on a side closer to the substrate or may be the so-called top emission system in which the light is extracted from a side opposite to the substrate. In addition, a double-face extraction system (tandem system) in which the light is extracted from each of the side closer to the substrate and the side opposite to the substrate can be adopted.

In the organic light-emitting device of the present invention, the iridium complex represented by the general formula [1] (or [6]) and the hydrocarbon compound represented by the general formula [5] (or [10]) are preferably incorporated into the emission layer out of the organic compound layer. In this case, the emission layer includes at least the iridium complex represented by the general formula [1] (or [6]) and the hydrocarbon compound represented by the general formula [5] (or [10]). The applications of the compounds to be incorporated into the emission layer in this case vary depending on their content concentrations in the emission layer. Specifically, the compounds are classified into a main component and a sub-component depending on their content concentrations in the emission layer.

The compound serving as the main component is a compound having the largest weight ratio (content concentration) out of the group of compounds to be incorporated into the emission layer and is a compound also called a host. In addition, the host is a compound present as a matrix around the light-emitting material in the emission layer, and is a compound mainly responsible for the transport of a carrier to the light-emitting material and the donation of an excitation energy to the light-emitting material.

In addition, the compound serving as the sub-component is a compound except the main component and can be called a guest (dopant), a light emission assist material, or a charge-injecting material depending on a function of the compound. The guest as one kind of sub-component is a compound (light-emitting material) responsible for main light emission in the emission layer. The light emission assist material as one kind of sub-component is a compound that assists the light emission of the guest and is a compound having a smaller weight ratio (content concentration) in the emission layer than that of the host. The light emission assist material is also called a second host by virtue of its function.

The concentration of the guest with respect to the host is preferably 0.1 wt % or more and 20 wt % or less, more preferably 1 wt % or more and 15 wt % or less with reference to the total amount of the constituent materials for the emission layer.

(2) Iridium Complex

Next, the iridium complex as one constituent material for the organic light-emitting device of the present invention is described. The iridium complex as one constituent material for the organic light-emitting device of the present invention is a compound represented by the following general formula [1] or the following general formula [6].

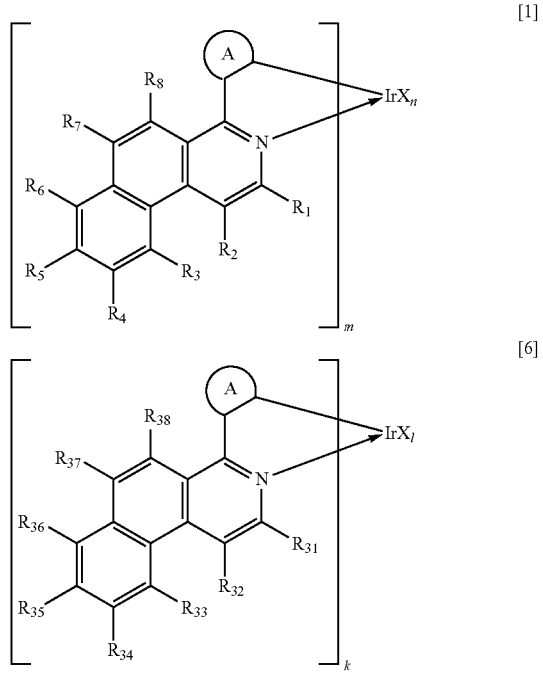

[1]

[6]

It is to be noted that the basic skeleton of the iridium complex represented by the general formula [6] is the same as that of the iridium complex represented by the general formula [1]. In addition, the substituents represented in the general formula [6], i.e., $R_{31}$ to $R_{38}$ correspond to $R_1$ to $R_8$ in the general formula [1], respectively. Further, k and l in the general formula [6] correspond to m and n in the general formula [1], respectively. Hereinafter, the iridium complex represented by the general formula [1] is mainly described.

In the formula [1], $R_1$ to $R_8$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group.

Specific examples of the halogen atom represented by any one of $R_1$ to $R_8$ include fluorine, chlorine, bromine, and iodine atoms.

The alkyl group represented by any one of $R_1$ to $R_8$ is preferably an alkyl group having 1 or more and 6 or less carbon atoms. Specific examples of the alkyl group having 1 or more and 6 or less carbon atoms include a methyl group, an ethyl group, an n-propyl group, an i-propyl group, an n-butyl group, an i-butyl group, a sec-butyl group, a tert-butyl group, an n-pentyl group, an i-pentyl group, a tert-pentyl group, a neopentyl group, an n-hexyl group, and a cyclohexyl group. It is to be noted that part or all of hydrogen atoms in the alkyl group may be substituted with a fluorine atom as in a trifluoromethyl group or the like. Of those alkyl groups, a methyl group or a tert-butyl group is particularly preferred.

Specific examples of the alkoxy group represented by any one of $R_1$ to $R_8$ include, but, of course, not limited to, a methoxy group, an ethoxy group, an i-propoxy group, an n-butoxy group, and a tert-butoxy group. Of those alkoxy groups, a methoxy group or an ethoxy group is preferred.

Specific examples of the aromatic hydrocarbon group represented by any one of $R_1$ to $R_8$ include, but, of course, not limited to, a phenyl group, a naphthyl group, a phenanthryl group, an anthryl group, a fluorenyl group, a biphenylenyl group, an acenaphthylenyl group, a chrysenyl group, a pyrenyl group, a triphenylenyl group, a picenyl group, a fluoranthenyl group, a perylenyl group, a naphthacenyl group, a biphenyl group, and a terphenyl group. Of those aromatic hydrocarbon groups, a phenyl group, a naphthyl group, a fluorenyl group, or a biphenyl group is preferred, and a phenyl group is more preferred.

Specific examples of the heteroaromatic group represented by any one of $R_1$ to $R_8$ include, but, of course, not limited to, a thienyl group, a pyrrolyl group, a pyrazinyl group, a pyridyl group, an indolyl group, a quinolyl group, an isoquinolyl group, a naphthyridinyl group, an acridinyl group, a phenanthrolinyl group, a carbazolyl group, a benzo[a]carbazolyl group, a benzo[b]carbazolyl group, a benzo[c]carbazolyl group, a phenazinyl group, a phenoxazinyl group, a phenothiazinyl group, a benzothiophenyl group, a dibenzothiophenyl group, a benzofuranyl group, a dibenzofuranyl group, an oxazolyl group, and an oxadiazolyl group.

The aromatic hydrocarbon group and heteroaromatic group represented by $R_1$ to $R_8$ may each further have a substituent. Specific examples thereof include: alkyl groups such as a methyl group, an ethyl group, an n-propyl group, an i-propyl group, an n-butyl group, an i-butyl group, a sec-butyl group, a tert-butyl group, an n-pentyl group, an i-pentyl group, a tert-pentyl group, a neopentyl group, an n-hexyl group, and a cyclohexyl group; a halogen atom selected from fluorine, chlorine, bromine, and iodine atoms; alkoxy groups such as a methoxy group, an ethoxy group, an i-propoxy group, an n-butoxy group, and a tert-butoxy group; substituted amino groups such as an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphtylamino group, an N,N-difluorenylamino group, an N-phenyl-N-tolylamino group, an N,N-ditolylamino group, an N-methyl-N-phenylamino group, an N,N-dianisoylamino group, an N-mesityl-N-phenylamino group, an N,N-dimesitylamino group, an N-phenyl-N-(4-tert-butylphenyl)amino group, and an N-phenyl-N-(4-trifluoromethylphenyl)amino group; aromatic hydrocarbon groups such as a phenyl group, a naphthyl group, a phenanthryl group, an anthryl group, a fluorenyl group, a biphenylenyl group, an acenaphthylenyl group, a chrysenyl group, a pyrenyl group, a triphenylenyl group, a picenyl group, a fluoranthenyl group, a perylenyl group, a naphthacenyl group, a biphenyl group, and a terphenyl group; heteroaromatic groups such as a thienyl group, a pyrrolyl group, a pyrazinyl group, a pyridyl group, an indolyl group, a quinolyl group, an isoquinolyl group, a naphthyridinyl group, an acridinyl group, a phenanthrolinyl group, a carbazolyl group, a benzo[a]carbazolyl group, a benzo[b]carbazolyl group, a benzo[c]carbazolyl group, a phenazinyl group, a phenoxazinyl group, a phenothiazinyl group, a benzothiophenyl group, a dibenzothiophenyl group, a benzofuranyl group, a dibenzofuranyl group, an oxazolyl group, and an oxadiazolyl group; a cyano group; and a trifluoromethyl group. Of those substituents, a methyl group, a tert-butyl group, a phenyl group, a naphthyl group, a fluorenyl group, or a biphenyl group is preferred, and a phenyl group is more preferred.

In the formula [1], m represents an integer of 1 to 3 and n represents an integer of 0 to 2, provided that m+n equals 3.

In the formula [1], the ring A represents a cyclic structure selected from a benzene ring, a naphthalene ring, a fluorene ring, a phenanthrene ring, a 9,9-spirobifluorene ring, and a chrysene ring. The ring A is bonded to a benzo[f]isoquinoline skeleton and an Ir metal with respective covalent bonds.

It is to be noted that the ring A may further have a substituent. Specific examples thereof include: alkyl groups such as a methyl group, an ethyl group, an n-propyl group, an i-propyl group, an n-butyl group, an i-butyl group, a sec-butyl group, a tert-butyl group, an n-pentyl group, an i-pentyl group, a tert-pentyl group, a neopentyl group, an n-hexyl group, and a cyclohexyl group; a halogen atom selected from fluorine, chlorine, bromine, and iodine atoms; alkoxy groups such as a methoxy group, an ethoxy group, an i-propoxy group, an n-butoxy group, and a tert-butoxy group; substituted amino groups such as an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphtylamino group, an N,N-difluorenylamino group, an N-phenyl-N-tolylamino group, an N,N-ditolylamino group, an N-methyl-N-phenylamino group, an N,N-dianisoylamino group, an N-mesityl-N-phenylamino group, an N,N-dimesitylamino group, an N-phenyl-N-(4-tert-butylphenyl)amino group, and an N-phenyl-N-(4-trifluoromethylphenyl)amino group; aromatic hydrocarbon groups such as a phenyl group, a naphthyl group, a phenanthryl group, an anthryl group, a fluorenyl group, a biphenylenyl group, an acenaphthylenyl group, a chrysenyl group, a pyrenyl group, a triphenylenyl group, a picenyl group, a fluoranthenyl group, a perylenyl group, a naphthacenyl group, a biphenyl group, a terphenyl group, a dimethylphenyl group, a tert-butylphenyl group, a cyanophenyl group, a trifluoromethylphenyl group, and a methoxyphenyl group; heteroaromatic groups such as a thienyl group, a pyrrolyl group, a pyrazinyl group, a pyridyl group, an indolyl group, a quinolyl group, an isoquinolyl group, a naphthyridinyl group, an acridinyl group, a phenanthrolinyl group, a carbazolyl group, a benzo[a]carbazolyl group, a benzo[b]carbazolyl group, a benzo[c]carbazolyl group, a phenazinyl group, a phenoxazinyl group, a phenothiazinyl group, a benzothiophenyl group, a dibenzothiophenyl group, a benzofuranyl group, a dibenzofuranyl group, an oxazolyl group, an oxadiazolyl group, and a dimethylpyridyl group; a cyano group; and a trifluoromethyl group.

In the formula [1], X represents a bidentate ligand. In the formula [1], a partial structure $IrX_n$ of the complex including X is specifically any one of the structures represented by the following general formulae [2] to [4].

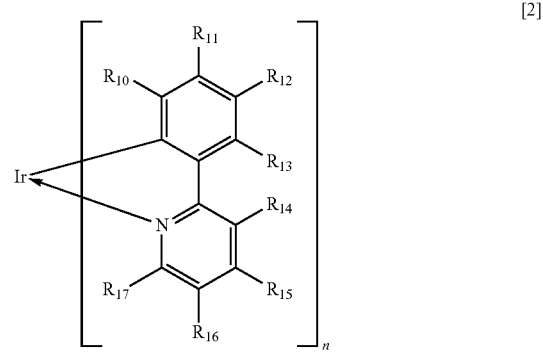

[2]

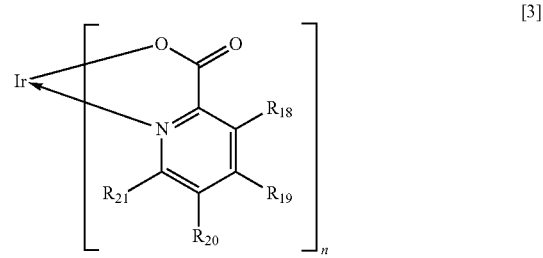

[3]

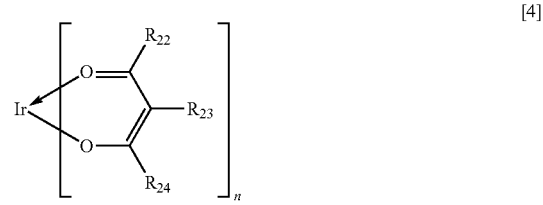

[4]

It is to be noted that, in the formula [6], a partial structure $IrX_1$ of the complex including X is specifically any one of the structures represented by the following general formulae [7] to [9].

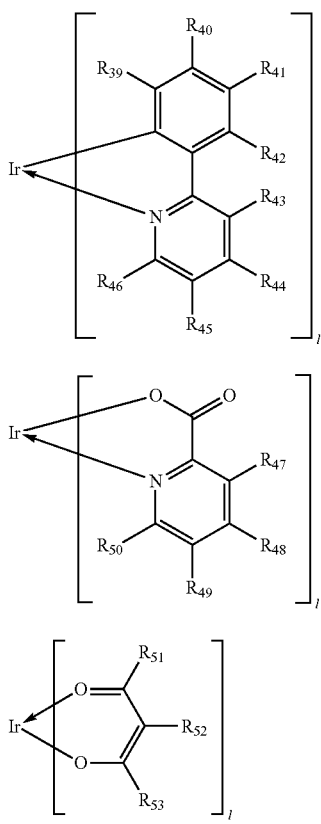

[7]

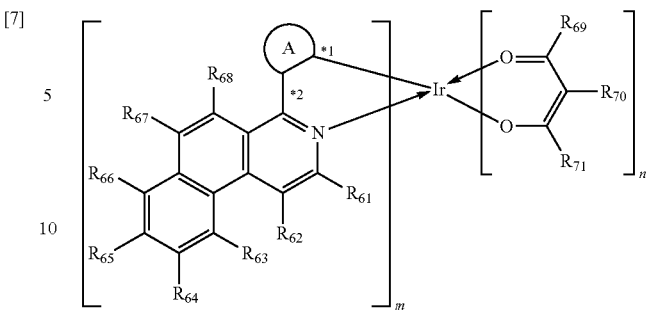

[8]

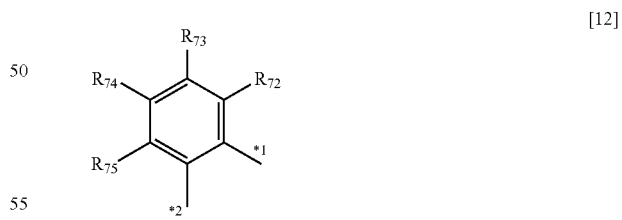

[9]

Here, the basic skeletons of the structures represented by the general formulae [7] to [9] are the same as those of the general formulae [2] to [4], respectively. In addition, the substituents represented in the general formulae [7] to [9], i.e., $R_{39}$ to $R_{53}$ correspond to $R_{10}$ to $R_{24}$ in the general formulae [2] to [4], respectively. Hereinafter, the structures represented by the general formulae [2] to [4] are mainly described.

In the formulae [2] to [4], $R_{10}$ to $R_{24}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group.

Specific examples of the halogen atom, alkyl group, alkoxy group, trifluoromethyl group, cyano group, aromatic hydrocarbon group, and heteroaromatic group represented by $R_{10}$ to $R_{24}$ are the same as the specific examples in $R_1$ to $R_8$ in the general formula [1]. In addition, when the substituent represented by any one of $R_{10}$ to $R_{24}$ is an aromatic hydrocarbon group or a heteroaromatic group, specific examples of the substituent that the substituent may further have are the same as the specific examples in $R_1$ to $R_8$ in the general formula [1].

In the iridium complex represented by the general formula [1], m preferably represents 2 and n preferably represents 1.

In addition, the iridium complex represented by the general formula [1] (general formula [6]) is preferably an iridium complex represented by the following general formula [11].

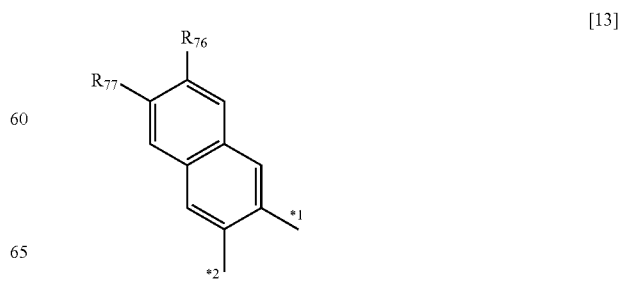

In the formula [11], $R_{61}$ to $R_{71}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group.

Specific examples of the halogen atom, alkyl group, alkoxy group, trifluoromethyl group, cyano group, aromatic hydrocarbon group, and heteroaromatic group represented by $R_{61}$ to $R_{71}$ are the same as the specific examples of $R_1$ to $R_8$ in the general formula [1]. In addition, when the substituent represented by any one of $R_{61}$ to $R_{71}$ is an aromatic hydrocarbon group or a heteroaromatic group, specific examples of the substituent that the aromatic hydrocarbon group and the heteroaromatic group may each further have are the same as the specific examples of $R_1$ to $R_8$ in the general formula [1].

In the formula [11], m represents an integer of 1 to 3 and n represents an integer of 0 to 2, provided that m+n equals 3.

In the formula [11], *1 represents a bond between the ring A and the Ir metal and *2 represents a bond between the ring A and a carbon atom at the 1-position of the benzo[f] isoquinoline skeleton.

In the formula [11], the ring A is a substituted or unsubstituted aromatic ring, is specifically a partial structure represented by any one of the following general formulae [12] to [16], and is preferably a structure represented by the general formula [12].

[12]

[13]

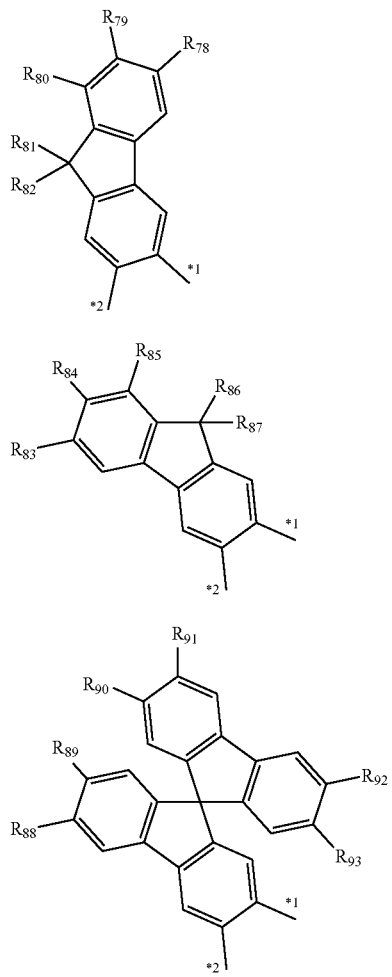

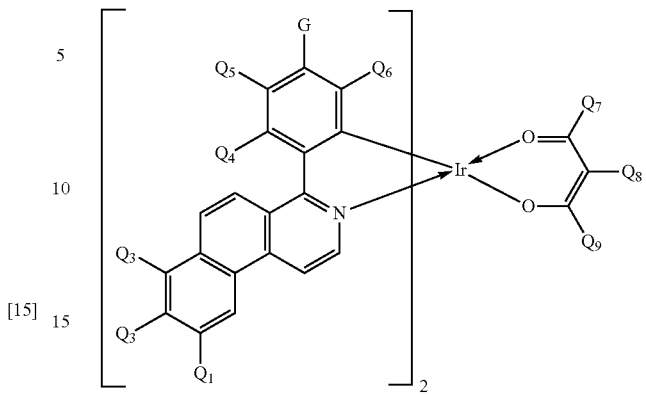

In the formulae [12] to [16], $R_{72}$ to $R_{93}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group.

Specific examples of the halogen atom, alkyl group, alkoxy group, trifluoromethyl group, cyano group, aromatic hydrocarbon group, and heteroaromatic group represented by $R_{72}$ to $R_{93}$ are the same as the specific examples of $R_1$ to $R_8$ in the general formula [1]. In addition, when the substituent represented by any one of $R_{72}$ to $R_{93}$ is an aromatic hydrocarbon group or a heteroaromatic group, specific examples of the substituent that the substituent may further have are the same as the specific examples of $R_1$ to $R_8$ in the general formula [1].

In the formulae [12] to [16], *1 represents a bonding position with the Ir metal and *2 represents a bonding position with the carbon atom at the 1-position in the benzo[f]isoquinoline skeleton.

In addition, the iridium complex represented by the general formula [1] is particularly preferably an iridium complex represented by the following general formula [17].

In the formula [17], $Q_1$ to $Q_9$ each represent a hydrogen atom, a halogen atom, an alkyl group, an alkoxy group, a trifluoromethyl group, or a cyano group. Specific examples of the halogen atom, alkyl group, and alkoxy group represented by $Q_1$ to $Q_9$ are the same as the specific examples in $R_1$ to $R_8$ in the general formula [1].

In the formula [17], G represents a hydrogen atom, a halogen atom, an alkyl group, an alkoxy group, a trifluoromethyl group, a cyano group, or a substituted or unsubstituted phenyl group. Specific examples of the halogen atom, alkyl group, and alkoxy group represented by G, and the substituent that the phenyl group represented by G may further have are the same as the specific examples in $R_1$ to $R_8$ in the general formula [1].

(3) Hydrocarbon Compound Serving as Host

Next, the hydrocarbon compound to be used as the host is described. The hydrocarbon compound to be used as the host is any one of the hydrocarbon compounds represented by the following general formula [5] or the following general formula [10].

$$Ar_1\text{-}(Ar_2)_p\text{—}(Ar_3)_q\text{—}Ar_8 \quad [5]$$

$$Ar_5\text{-}(Ar_6)_r\text{—}(Ar_7)_s\text{—}Ar_8 \quad [10]$$

In the formula [5], p and q each represent 0 or 1. In addition, in the formula [5], p+q is equal to or more than 1.

$Ar_1$ represents any one of the substituents represented in the following substituent group α.

$Ar_2$ and $Ar_3$ each represent any one of the substituents represented in the following substituent group β. $Ar_2$ and $Ar_3$ may be identical to or different from each other.

[Substituent Group α]

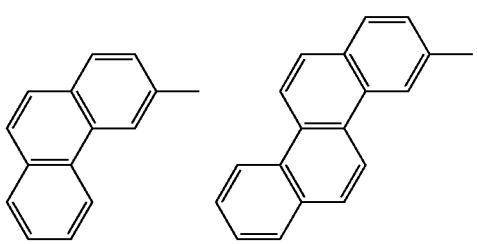

-continued

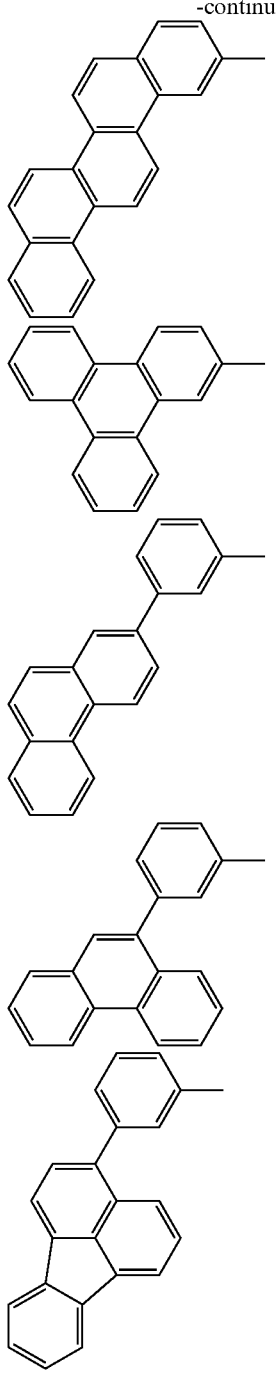

[Substituent group β]

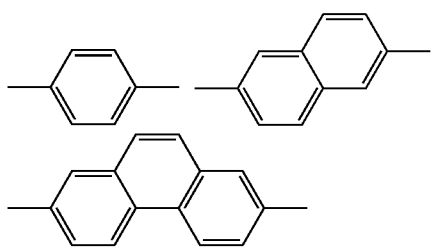

-continued

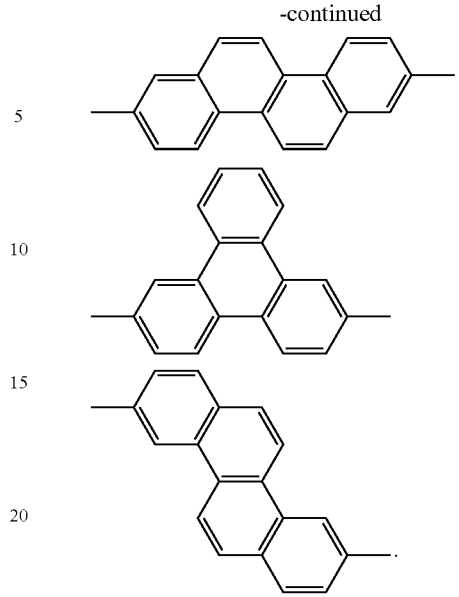

In the formula [10], r and s each represent 0 or 1. In addition, in the formula [10], r+s is equal to or more than 1.

$Ar_5$ represents any one of the substituents represented in the following substituent group α'.

$Ar_6$ and $Ar_7$ each represent any one of the substituents represented in the following substituent group β'. $Ar_6$ and $Ar_7$ may be identical to or different from each other.

$Ar_8$ represents any one of the substituents represented in the following substituent group γ'.

[Substituent Group α']

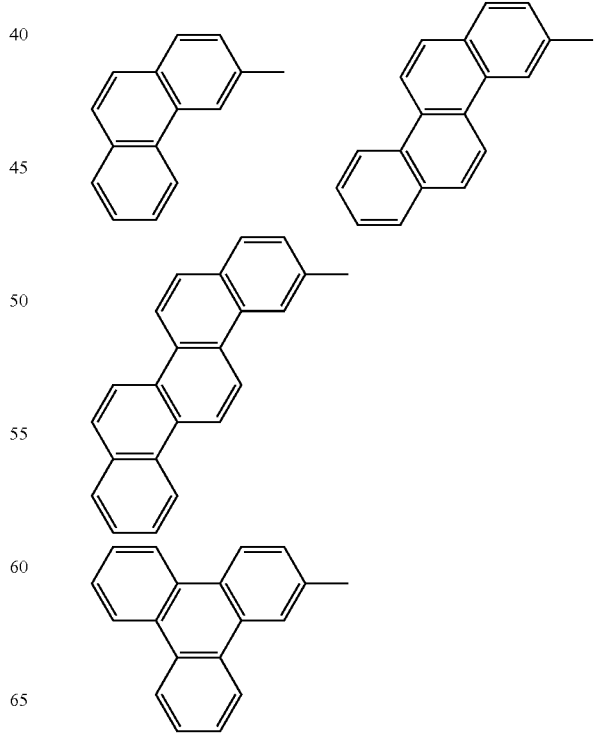

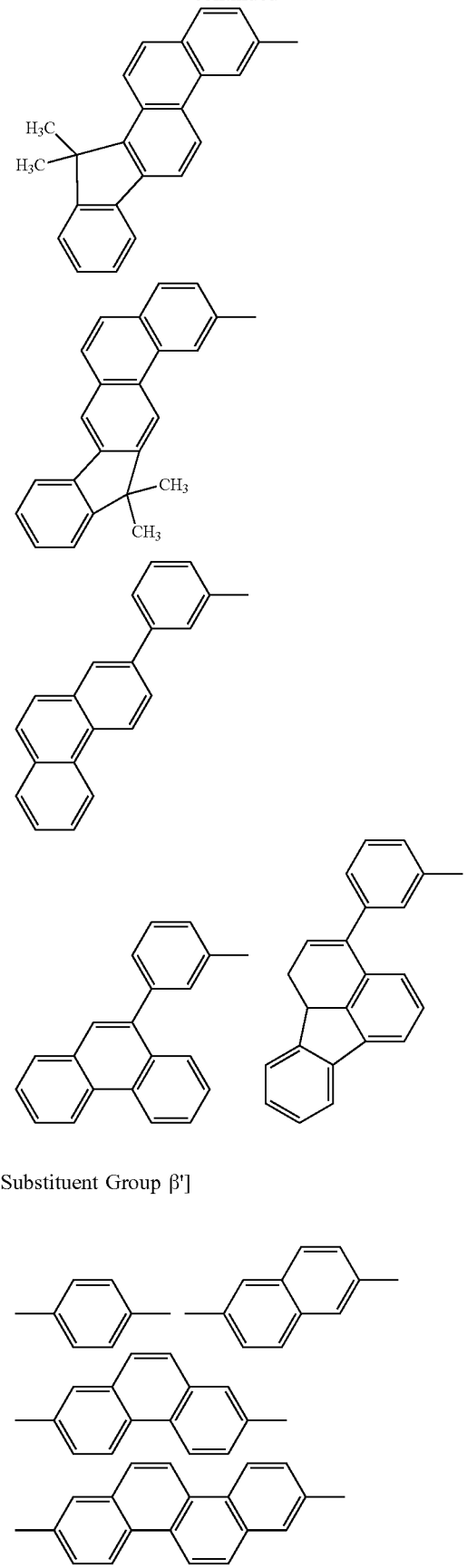
[Substituent Group β']
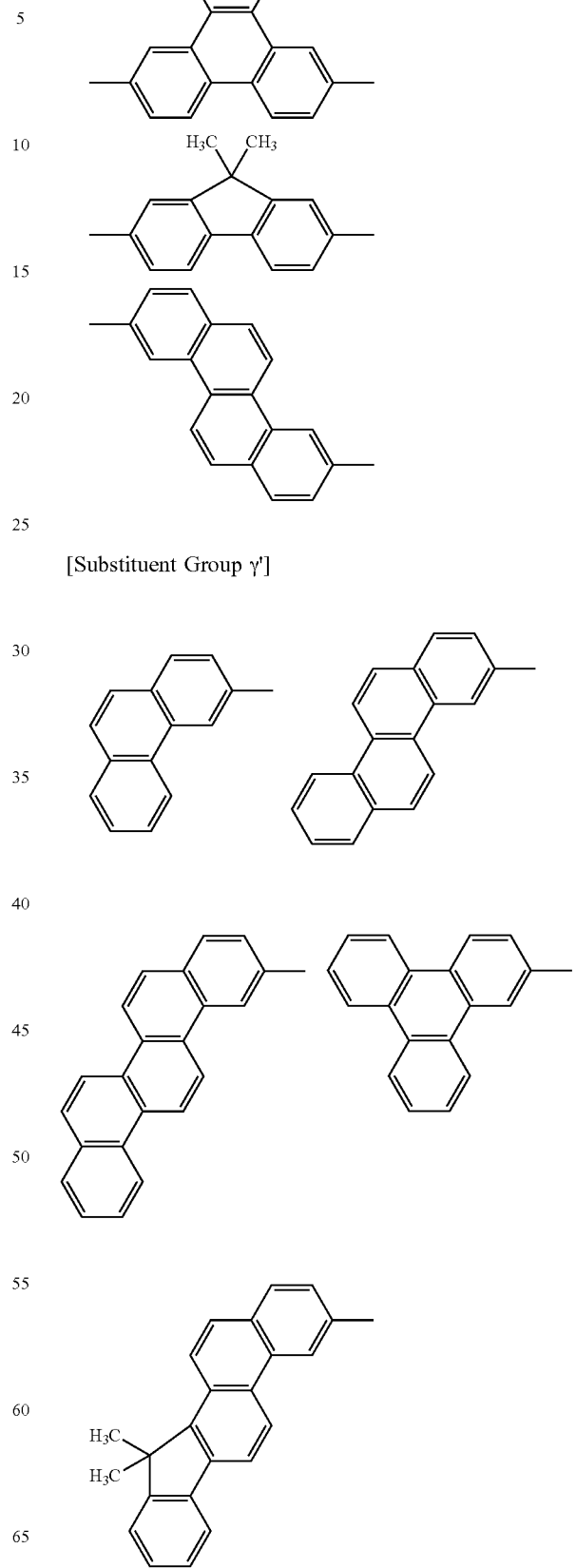
[Substituent Group γ']

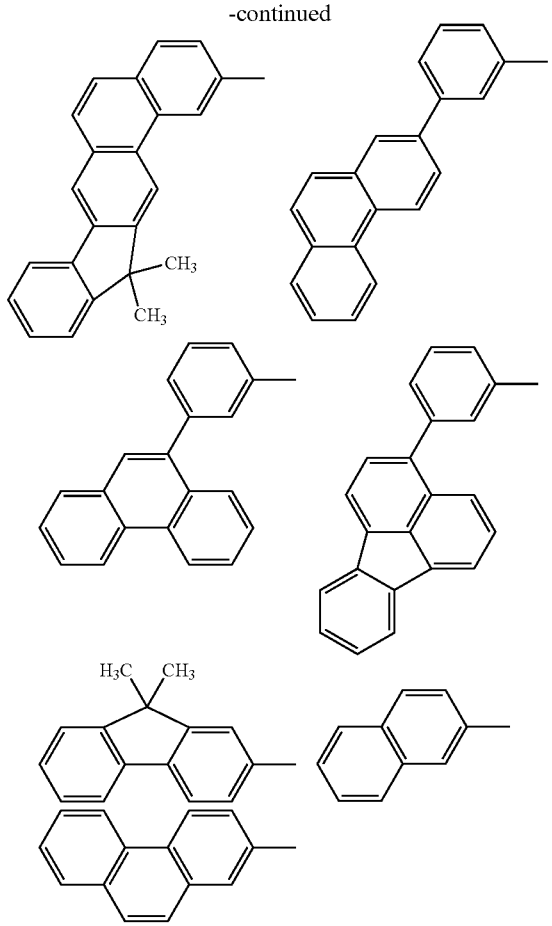

(4) Third Component

In the present invention, the organic compound layer (preferably the emission layer) contains the iridium complex represented by the general formula [1] and the hydrocarbon compound represented by the general formula [5], or the iridium complex represented by the general formula [6] and the hydrocarbon compound represented by the general formula [10], provided that in addition to the iridium complex and the hydrocarbon compound, a material serving as a third component may be incorporated into the organic compound layer together with the complex and the compound.

In the present invention, a compound serving as the third component is a material having the following feature (4-1), (4-2), or (4-3):
(4-1) a material having a larger (shallower) HOMO level than the HOMO level of the host;
(4-2) a material having an LUMO level smaller in energy (deeper) than the LUMO level of the host; or
(4-3) a material having an HOMO level larger in energy than the HOMO level of the host and having an LUMO level smaller in energy than the LUMO level of the host.

The material having the feature (4-1) facilitates the injection and transport of a hole into the emission layer by virtue of its shallow HOMO level. As a result, a reduction in drive voltage of the device is achieved and the light-emitting material can be suppressed from being excessively brought into an anion state, and hence the lifetime of the device is lengthened.

The material having the feature (4-2) lengthens the lifetime of the device by the following reason. That is, the LUMO level of the host is shallower (larger in energy) than that of the light-emitting material, and hence the addition of the third component having a deeper LUMO level than the LUMO level of the host can suppress the light-emitting material from being excessively brought into an anion state. Therefore, the lifetime is lengthened.

The material having the feature (4-3) can improve the hole-injecting property and alleviate electron trapping by the light-emitting material. As a result, the lifetime is lengthened.

It is to be noted that specific examples of the third component are described later.

(5) Operations and Effects Exhibited by Host and Guest

The iridium complexes represented by the general formulae [1] and [6] each of which is to be used as a constituent material for the organic light-emitting device in the present invention each have a phenylbenzo[f]isoquinoline ligand as a main ligand. Here, the basic skeleton of phenylbenzo[f]isoquinoline has the following feature: the conjugate surface of a π orbital is extended as compared with a phenylquinoline ligand or phenylisoquinoline ligand as a ligand of a conventional and typical red-light-emitting material by the condensation of a benzene ring with quinoline. However, the structural feature leads to a reduction in emission efficiency or durability because of the following reason: an interaction with a material (especially the host) near the light-emitting material is liable to occur, and the charge of the host is trapped to cause the transition of the light-emitting material to a radical state or the formation of an exciplex by the light-emitting material and the host.

In view of the foregoing, the inventors of the present invention have selected a compound having a unit that forms a band gap and a unit that reduces an intermolecular interaction as a compound to be used as the host for avoiding the formation of an exciplex and the transition to a radical state.

The inventors have found that the design of the compound which has those two units and the entire molecule of which is chemically stable can improve the efficiency and drive durability of the organic light-emitting device.

Figure 2:
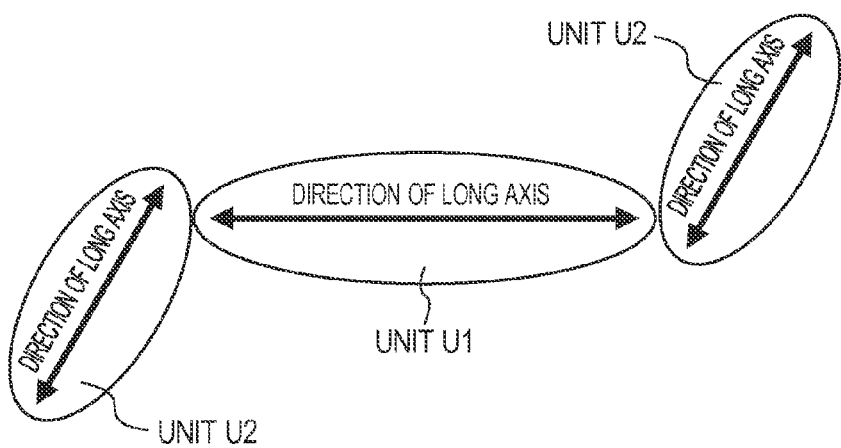
FIG. 2 is a schematic view illustrating the model of a hydrocarbon compound to be used as a host.

FIG. 2 is a schematic view illustrating the model of a hydrocarbon compound to be used as the host. The molecular model illustrated in FIG. 2 has a unit U1 that forms a band gap and a unit U2 that reduces an intermolecular interaction. Here, the unit U1 is more specifically a partial structure having the following feature (5-1). In addition, the unit U2 is more specifically a partial structure having the following feature (5-2) or the following features (5-2) and (5-3).

(5-1) A partial structure that forms a linear structure
(5-2) A partial structure having a long axis in a direction different from the long axis direction of the unit u1
(5-3) Parts at terminals are different from each other.

Further, it is because the hydrocarbon compound serving as the host in the present invention has the following feature (5-4) or the following features (5-4) and (5-5) that the compound is chemically stable:
(5-4) The compound is a molecule formed only of a hydrocarbon; and
(5-5) The compound is a molecule formed only of an $sp^2$ carbon atom and a hydrogen atom.

Hereinafter, the features (5-1) to (5-5) are described.
(5-1) Partial Structure that Forms Linear Structure The band gap of the host needs to be properly designed in order that excessive transition of the light-emitting material to a radical state may be avoided. In the present invention, red light as light to be output by the organic light-emitting device is light whose emission peak wavelength falls within the range of 580 nm to 650 nm (1.9 eV to 2.1 eV in terms of the lowest triplet excited level ($T_1$)). Although it is essential for the $T_1$ of the host to be higher than that of the light-emitting material, the lowest singlet excited level ($S_1$) and the band gap necessarily increase when the $T_1$ is excessively high. Accordingly, charge accumulation occurs at an interface between the host and a peripheral material, or differences in highest occupied molecular orbital (HOMO) and lowest unoccupied molecular orbital (LUMO) levels between the host and the light-emitting material enlarge. As a result, the light-emitting material may serve as a charge trap to promote the deterioration of the light-emitting material. Further, the light-emitting material having a phenylbenzoisoquinoline skeleton (iridium complex) to be used in the present invention easily traps charge probably because its LUMO orbital is extended as described above. Therefore, a host having a narrow band gap is preferably selected so that the injection and transport of charge may be smoothly performed. Table 1 below is a table showing the $T_1$ energies and ΔS-T values of main aromatic rings when used alone.

TABLE 1

| Structural formula | $T_1$ [eV] | ΔS-T [eV] |
|---|---|---|
| Benzene | 3.7 | 1.1 |
| Naphthalene | 2.6 | 1.4 |
| Phenanthrene | 2.7 | 0.90 |
| Fluorene | 2.9 | 1.2 |
| Triphenylene | 2.9 | 0.72 |
| Chrysene | 2.5 | 0.95 |
| Picene | 2.5 | 0.81 |

TABLE 1-continued

| Structural formula | $T_1$ [eV] | ΔS-T [eV] |
|---|---|---|
| Anthracene | 1.8 | 1.5 |
| Pyrene | 2.1 | 1.2 |

Of the aromatic rings listed above, benzene, naphthalene, phenanthrene, fluorene, triphenylene, chrysene, and picene are preferred.

In addition, in consideration of a requirement for the $T_1$ of the host and the ΔS-T value (energy difference between the $S_1$ and the $T_1$) of the hydrocarbon compound, the band gap of the host is preferably 2.7 eV to 3.6 eV, more preferably 2.7 eV to 3.4 eV.

It is understood from the foregoing that the following features (5-1a) and (5-1b) are important for achieving the suitable range of the band gap in the host:

(5-1a) conjugation is extended; and (5-1b) a hydrogen atom bonded to the peri-position is absent.

Therefore, the host preferably has a structure represented by the general formula [5] (or the general formula [10]). In addition, $Ar_2$ and $Ar_3$ in the general formula [5] each preferably represent any one member selected from the following partial structure group.

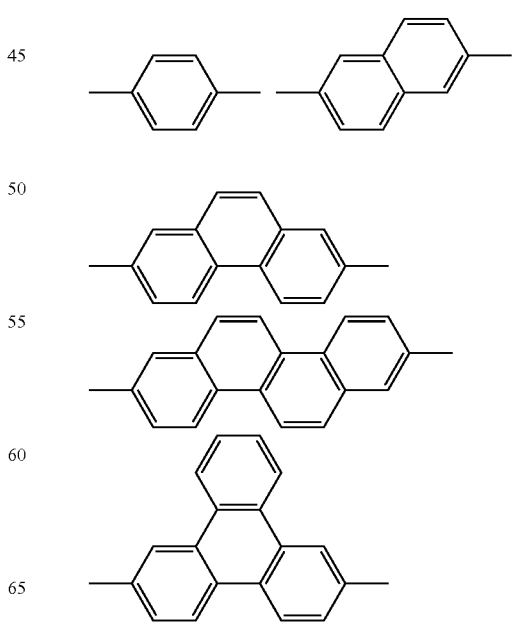

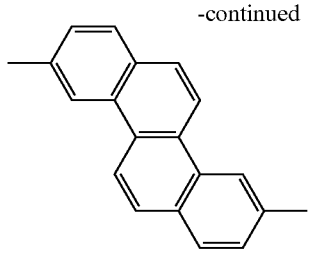

In addition, $Ar_5$ and $Ar_6$ in the general formula [10] each preferably represent any one member selected from the following partial structure group.

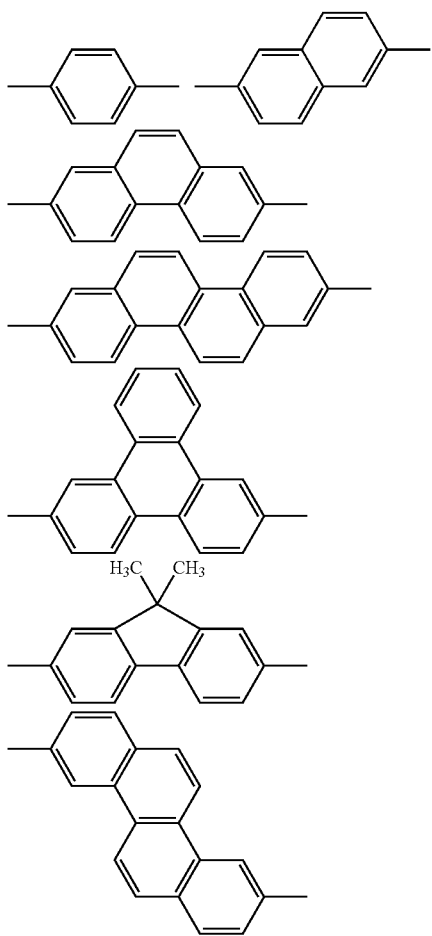

As represented in the general formula [5] (or the general formula [10]), $Ar_2$ and $Ar_3$ in the general formula [5] (or $Ar_6$, $Ar_7$ in the general formula [10]) each represent an arylene group having a bonding hand at such a site that conjugation is extended (the band gap reduces) with respect to $Ar_1$ as a terminal aryl group.

In addition, in a bond with each of $Ar_1$ (or $Ar_5$) bonded to $Ar_2$ (or $Ar_6$) and $Ar_1$ (or $Ar_8$) bonded to $Ar_3$ (or $Ar_7$), a hydrogen atom bonded to the peri-position is preferably absent. This is because of the following reason: when the hydrogen atom bonded to the peri-position is absent, the dihedral angle of the bond between the respective units reduces and the p orbitals of the respective carbon atoms are in parallel contact with each other, and hence the conjugation length of the entire molecule extends. For example, when naphthalene having bonding hands at its 2-position and 6-position represented above, and naphthalene having bonding hands at its 1-position and 4-position are compared, the relative directions of the two bonding hands of each naphthalene are the same. However, in naphthalene having bonding hands at its 1-position and 4-position, repulsion between substituents enlarge owing to hydrogen atoms bonded to carbon atoms at the 5-position and 8-position in its skeleton, and hence the dihedral angle enlarges. As a result, the extent to which the p orbitals overlap each other reduces and the conjugation no longer extends, and hence the band gap increases.

In addition, the number (p or r) of $Ar_2$'s or $Ar_6$'s and the number (q or s) of $Ar_3$'s or $Ar_7$'s desirably have a relationship of $1 \leq p+q \leq 2$ ($1 \leq r+s \leq 2$). When p+q (r+s) exceeds 2, the molecular weight of the host increases and its sublimability reduces, with the result that the reduction of its purity may occur.

In consideration of the conditions, a compound to be obtained is a material having a band gap suitable for a red color, charge-injecting property improves, and the charge accumulation can be avoided.

(5-2) Partial Structure Having Long Axis in Direction Different from Long Axis Direction of Unit U1

The feature (5-2) is description concerning the partial structures $Ar_1$ (or $Ar_5$, $Ar_8$). Here, in the case where the substituents represented by $Ar_1$ (or $Ar_5$, $Ar_8$) in the general formula [5] (or the general formula [10]) are selected from the same group as that of $Ar_2$ and $Ar_3$ (or $Ar_6$, $Ar_7$ in the general formula [10]), the structure of the entire molecule of the designed compound becomes linear. In this case, turning the designed compound into a film shape causes the materials to closely adhere to each other. In particular, the iridium complex (light-emitting material) represented by the general formula [1] to be used in the present invention receives an electron from the host to which the complex closely adheres, and is easily brought into a radical state probably because its LUMO orbital is extended.

In view of the foregoing, it has been found that the following is optimum in the present invention: aryl groups are bonded to each other so that the long axis directions of $Ar_1$ (or $Ar_5$, $Ar_8$) may be different from the long axis directions of $Ar_2$ (or $Ar_6$) and $Ar_3$ (or $Ar_7$). Specifically, the substituents represented by $Ar_1$ are selected from aryl groups represented in the following substituent group.

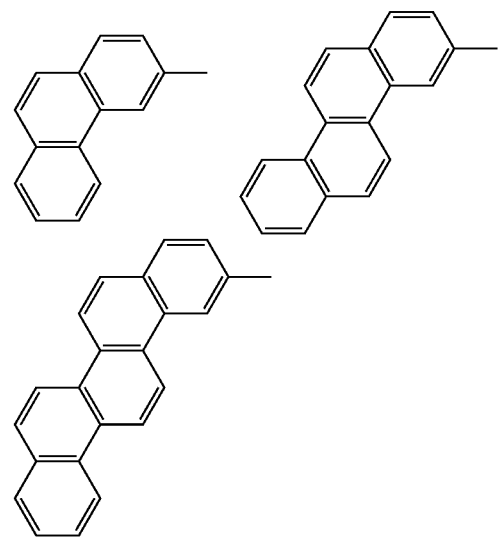

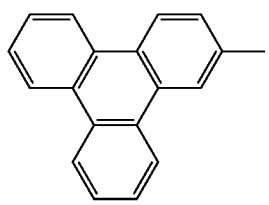
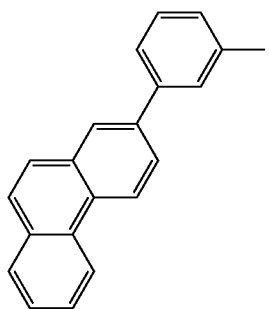
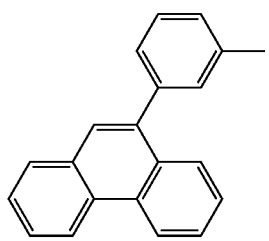
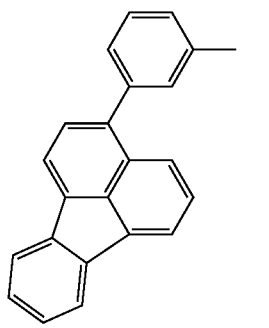
In addition, the substituents represented by Ar$_5$ are selected from aryl groups represented in the following substituent group.
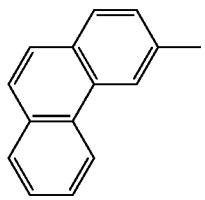 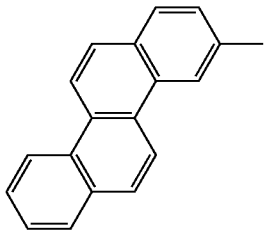
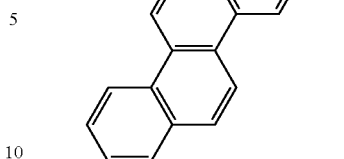
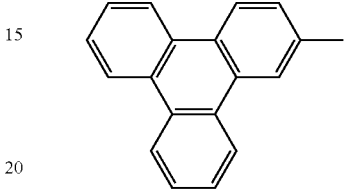
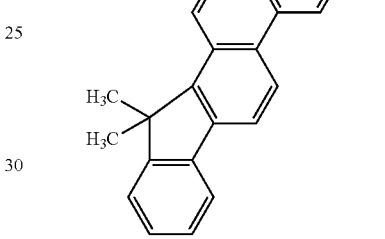
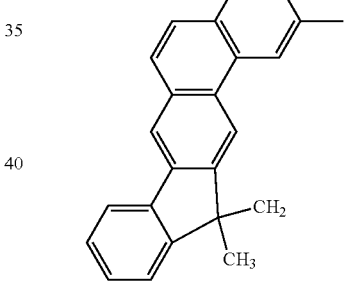
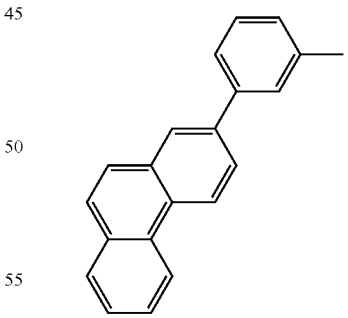
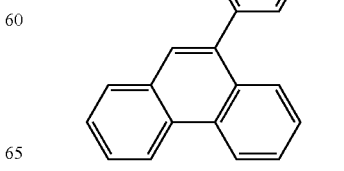

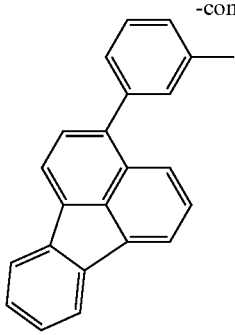

It is to be noted that $Ar_8$ is selected from aryl groups represented in the substituent group and the following substituent group.

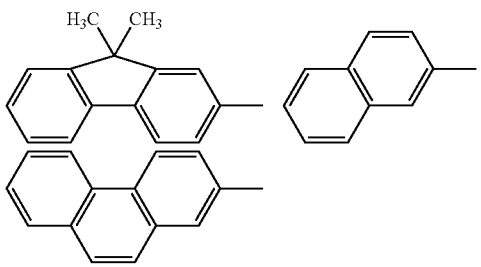

In that case, the conjugation length of the entire molecule of the hydrocarbon compound serving as the host is extended by $Ar_2$ (or $Ar_6$) and $Ar_3$ (or $Ar_7$), and hence the compound forms a band gap suitable for a red color. In addition, the long axis direction of $Ar_1$ (or $Ar_5$, $Ar_8$) at each terminal is different from the long axis directions of $Ar_2$ (or $Ar_6$) and $Ar_3$ (or $Ar_7$). As a result, the structure of the entire molecule becomes a twisted structure as illustrated in FIG. 2. Therefore, the close adhesion between the materials is suppressed and hence the light-emitting material can be prevented from being brought into a radical state.

(5-3) Parts at Terminals are Different from Each Other

In the present invention, the aryl groups ($Ar_5$) at the terminals of the host are more preferably different from each other as represented by the general formula [10]. Its symmetry is lower than that of the hydrocarbon compound represented by the general formula [5] in which the aryl groups ($Ar_5$) at the terminals are identical. Accordingly, the stacking of its molecules is avoided and hence the light-emitting material can be additionally prevented from being excessively brought into a radical state.

(5-4) Compound is Molecule Formed Only of Hydrocarbon

In general, the light-emitting material whose conjugate surface has been extended easily overlaps the host and hence their intermolecular interaction enlarges. As a result, an exciplex is formed, which may be responsible for the deterioration of the emission efficiency and durable characteristic. In addition, a carbon-carbon bond of the compound serving as the host has a stronger bonding strength than that of a carbon-nitrogen bond. For example, the energy of a bond between carbon and nitrogen calculated for 4,4'-di(9H-carbazol-9-yl)-1,1'-biphenyl (CBP) by means of b3-lyp/def2-SV(P) is 3.86 eV (calculated value) as represented below.

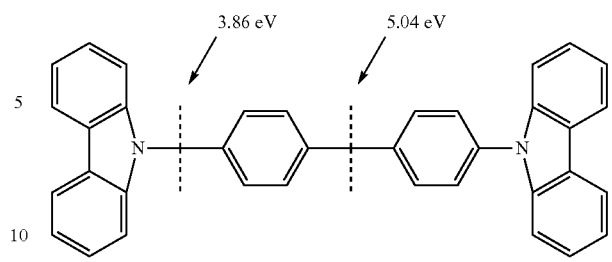

In contrast, the energy of a bond between carbon and carbon is 5.04 eV (calculated value). Therefore, the host is preferably formed only of a hydrocarbon considered to be strong in emission efficiency and durable characteristic.

(5-5) Compound is Molecule Formed Only of $SP^2$ Carbon Atom and Hydrogen Atom

The compound to be used as the host in the present invention is preferably a compound formed only of an sp2 carbon atom and a hydrogen atom. When all carbon atoms forming its basic skeleton are constituted of SP2 carbon atoms, structural changes from the ground state to the state of accumulation of charge and an excited state may be small. Accordingly, the polycyclic aromatic hydrocarbon compound may tend to be strong against deterioration even when brought into an unstable cation state by charge injected from an electrode. In addition, according to STEPHEN J. BLANKSBY et al. (see NPL 1), a carbon-carbon single bond has an energy of 3.9 eV and a carbon-carbon double bond has an energy of 7.5 eV, i.e., the bonding energy of the double bond is larger. It is assumed from the foregoing that the compound formed only of an SP2 carbon atom and a hydrogen atom is a stable compound from the viewpoint of a chemical bond.

(6) Specific Examples of Iridium Complex

Specific structural formulae of the iridium complex to be incorporated into the organic light-emitting device of the present invention are exemplified below.

[Group 1 Compound]

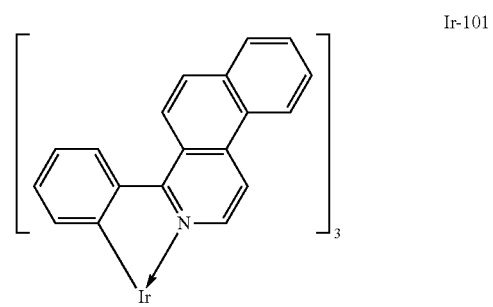

Ir-101

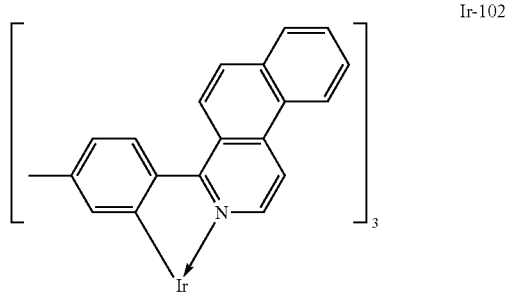

Ir-102

Ir-103
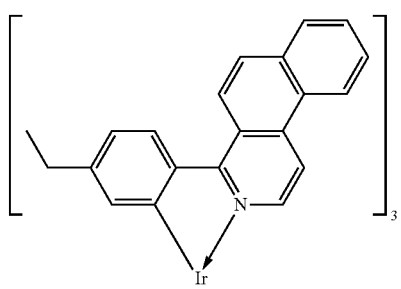
Ir-104
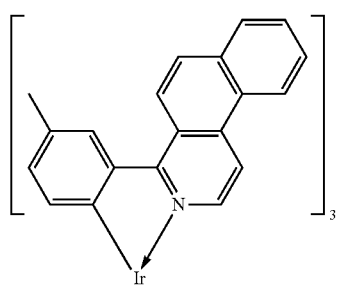
Ir-105
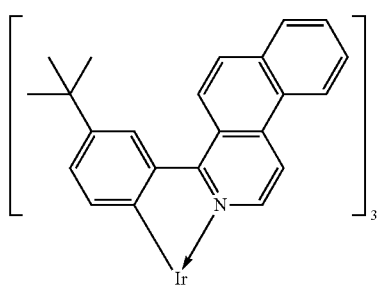
Ir-106
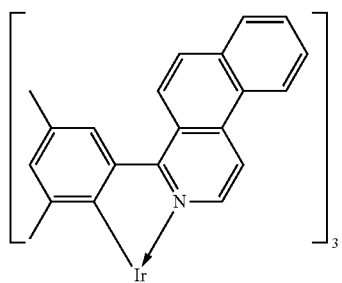
Ir-107
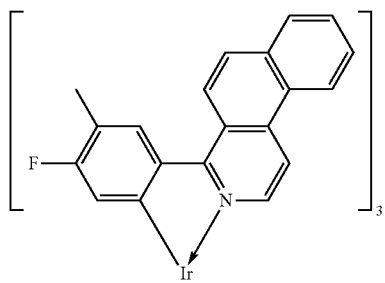
Ir-108
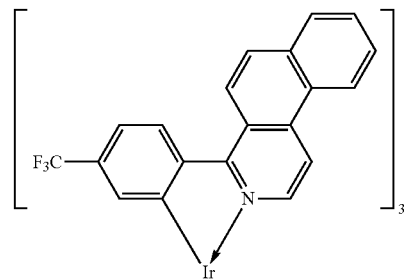
Ir-109
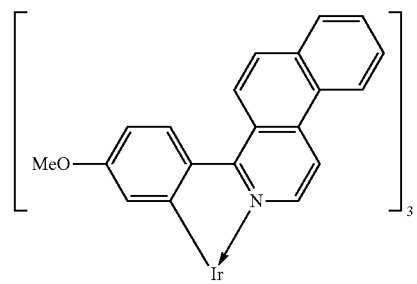
Ir-110
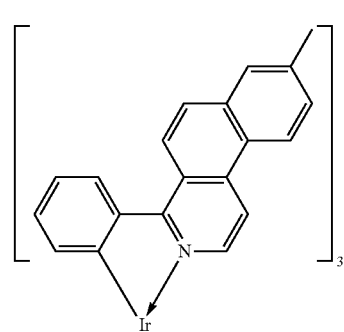
Ir-111
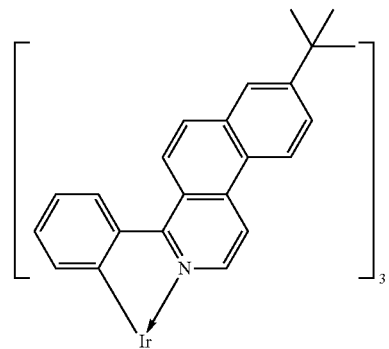
Ir-112
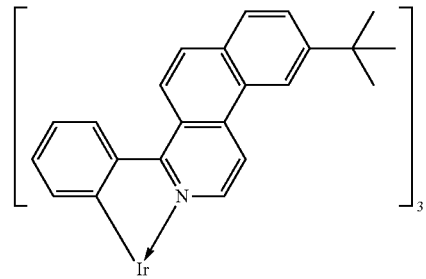

Ir-113
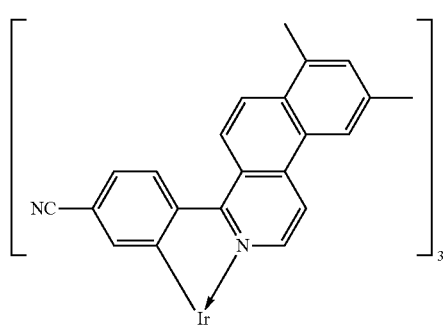
Ir-114
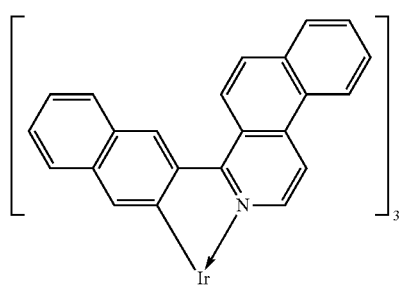
Ir-115
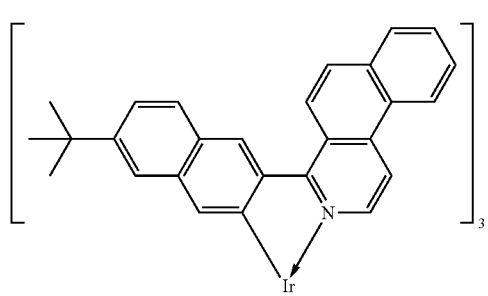
Ir-116
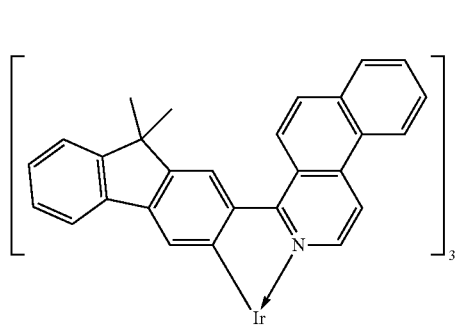
Ir-117
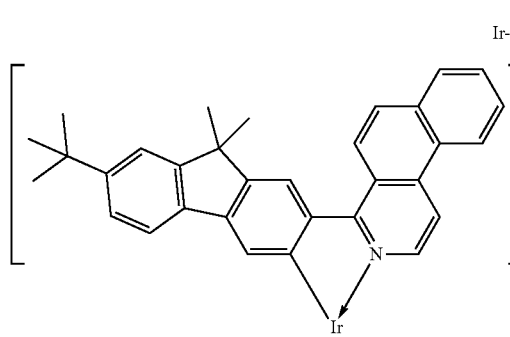
Ir-118
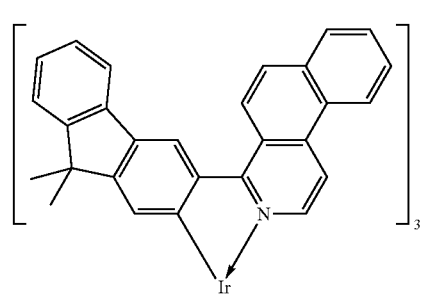
Ir-119
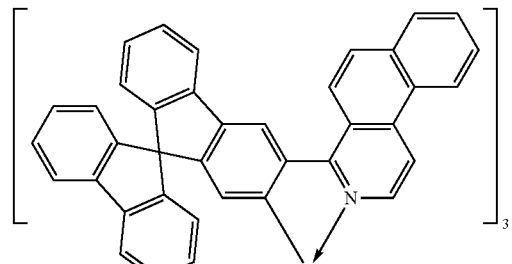
Ir-120
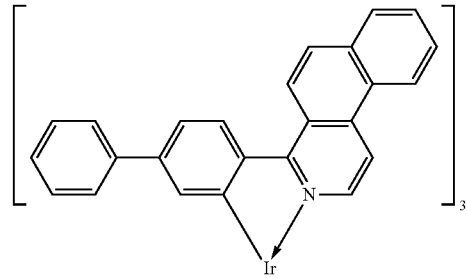
Ir-121
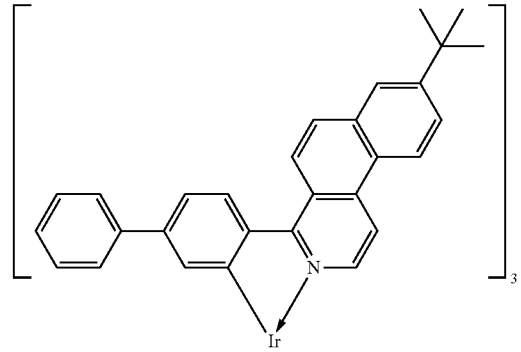
Ir-122
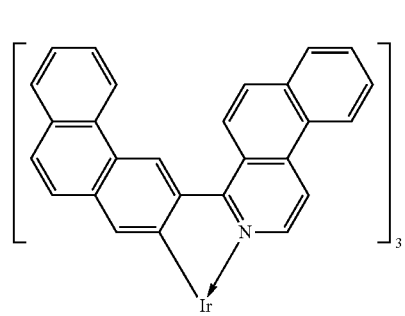

-continued
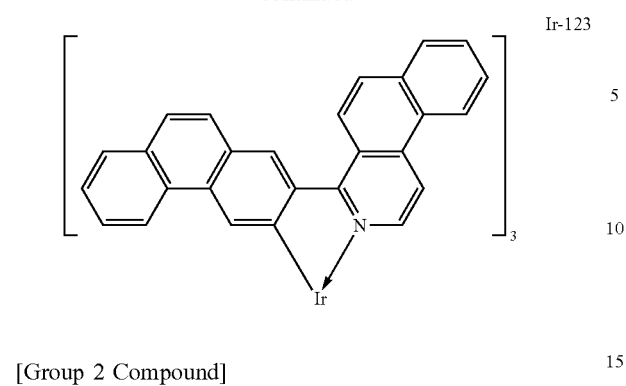
Ir-123
[Group 2 Compound]
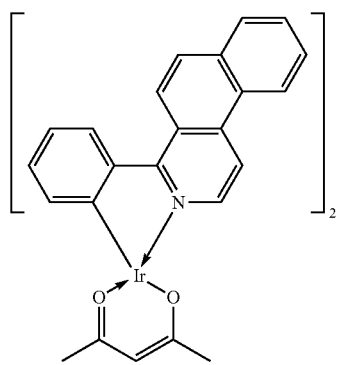
Ir-201
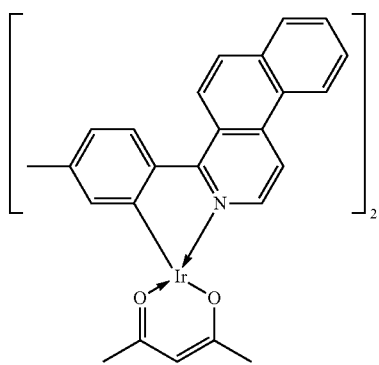
Ir-202
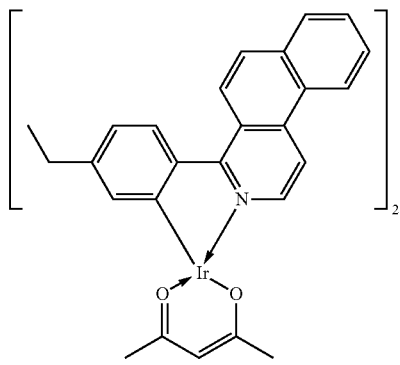
Ir-203
-continued
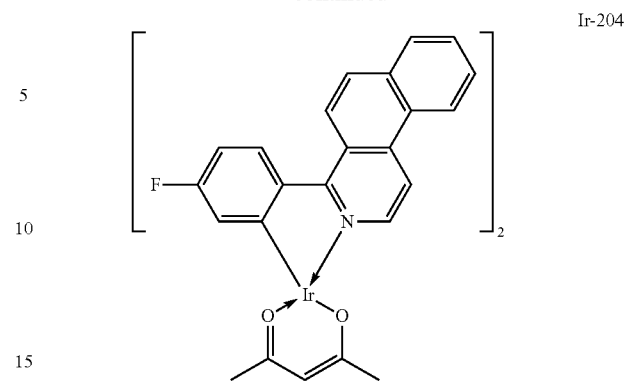
Ir-204
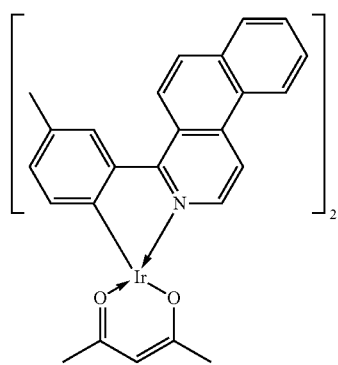
Ir-205
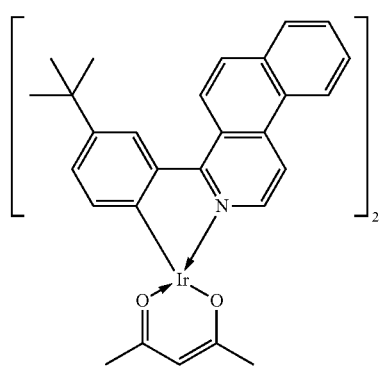
Ir-206
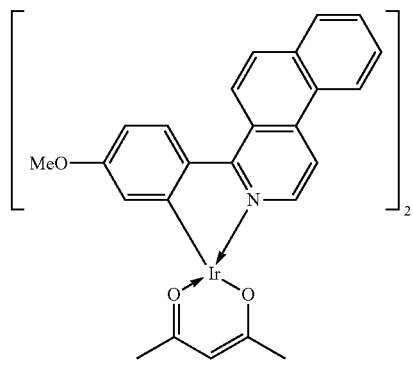
Ir-207

Ir-208
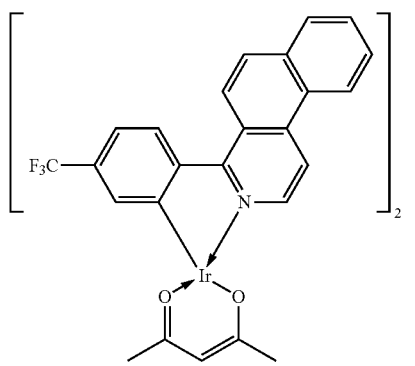
Ir-209
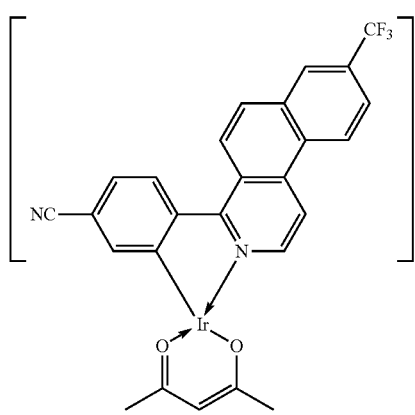
Ir-210
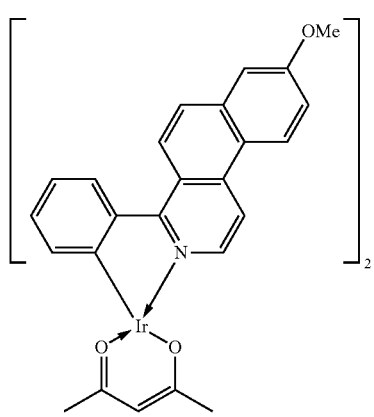
Ir-211
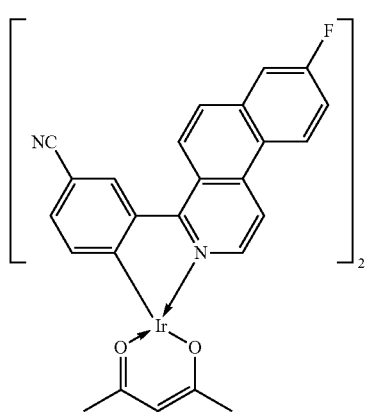
Ir-212
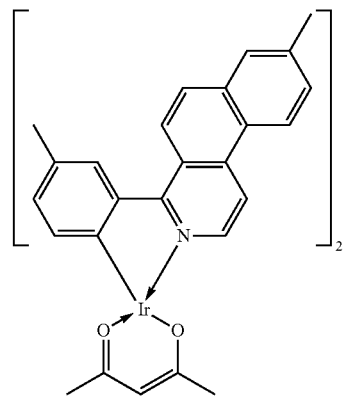
Ir-213
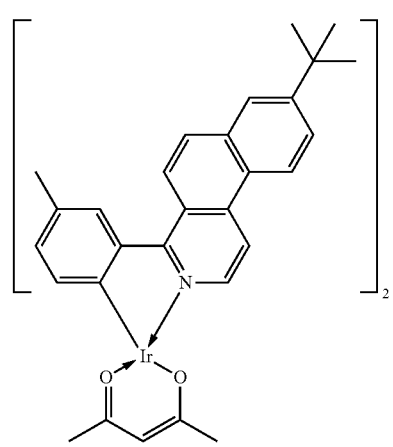
Ir-214
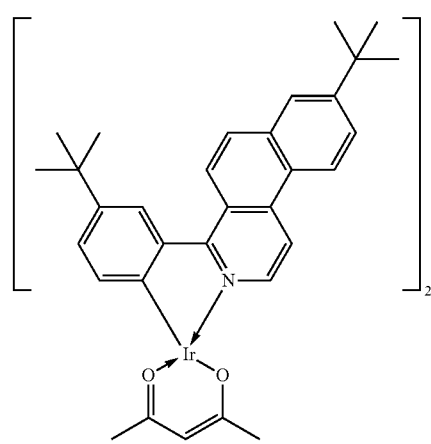

Ir-215
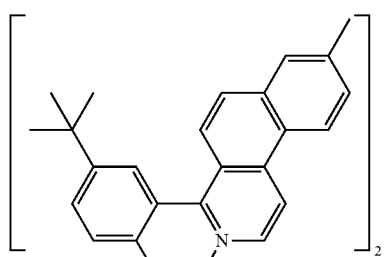
Ir-216
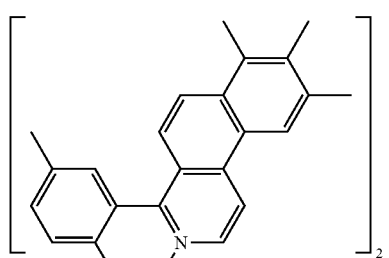
Ir-217
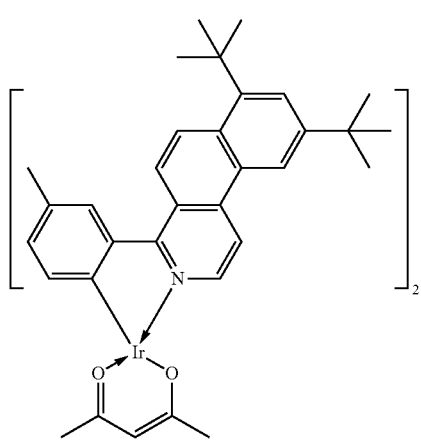
Ir-218
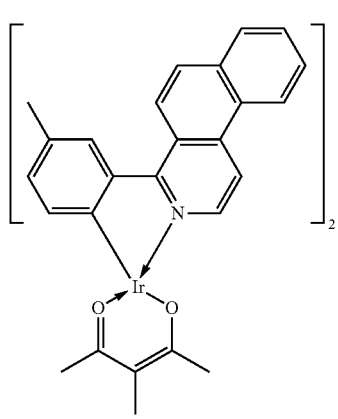
Ir-219
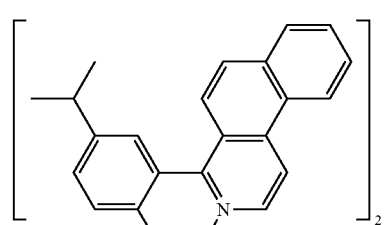
Ir-220
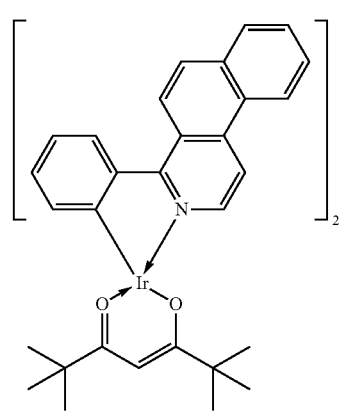
Ir-221
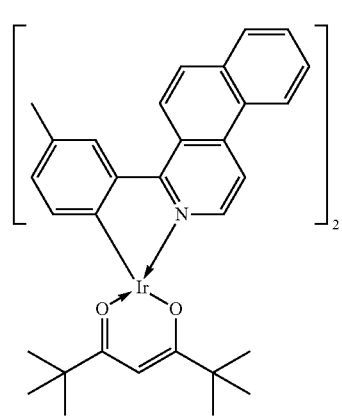
Ir-222
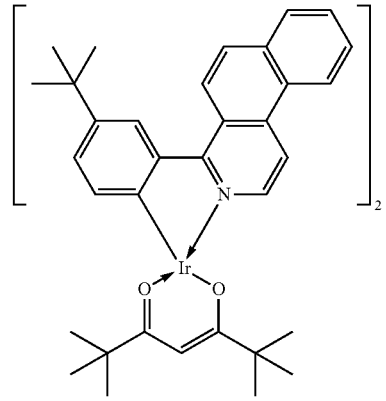

Ir-223
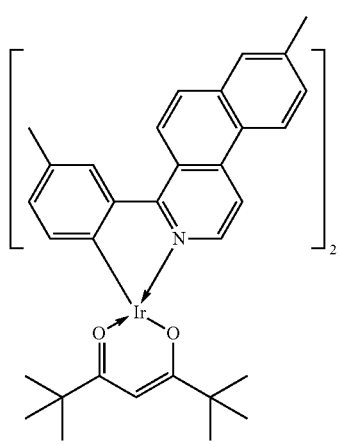
Ir-224
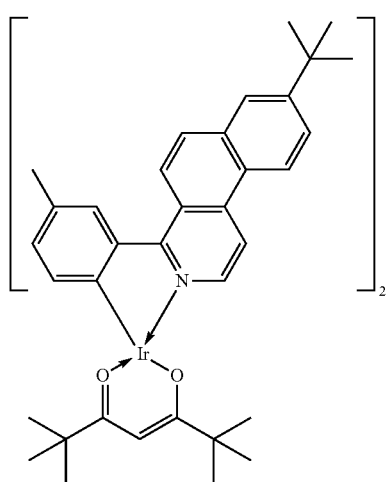
Ir-225
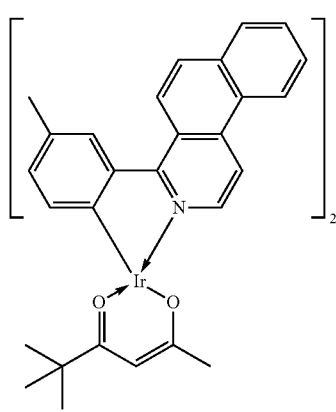
Ir-226
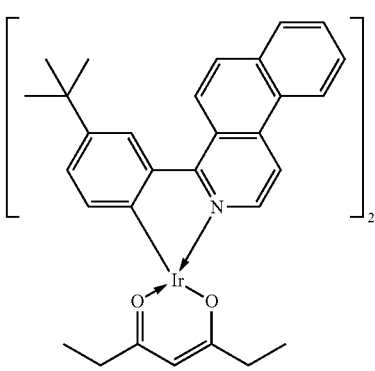
[Group 3 Compound]
Ir-301
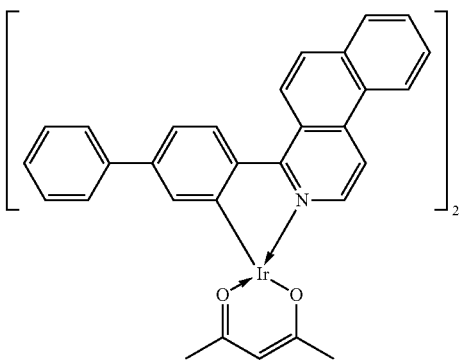
Ir-302
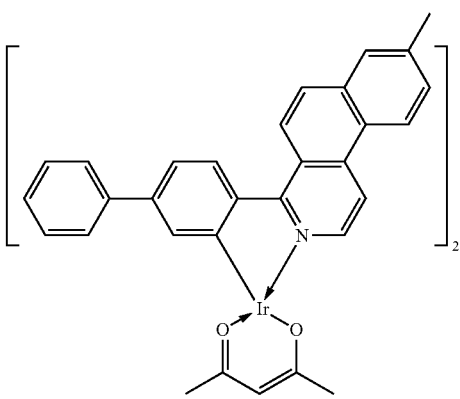
Ir-303
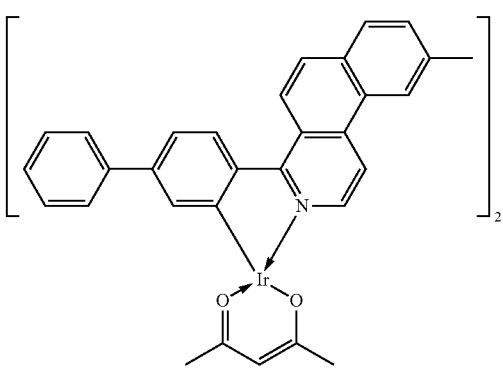

Ir-304 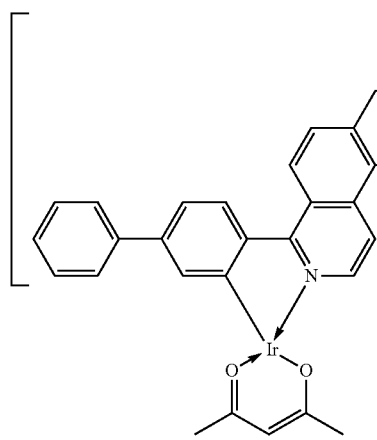
Ir-305 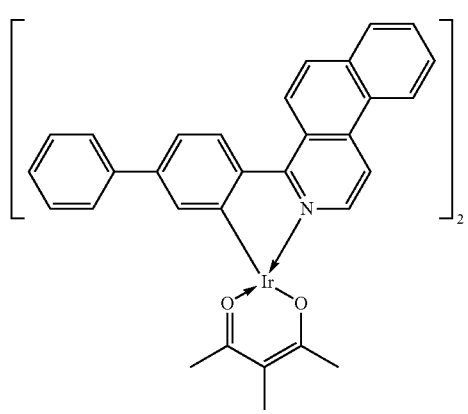
Ir-306 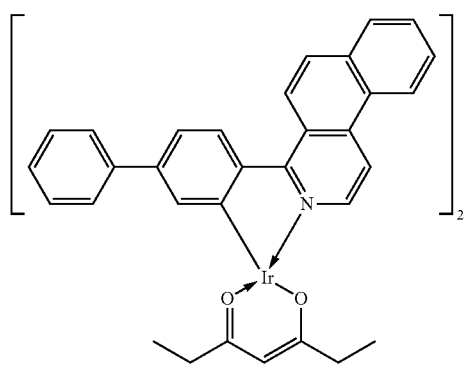
Ir-307 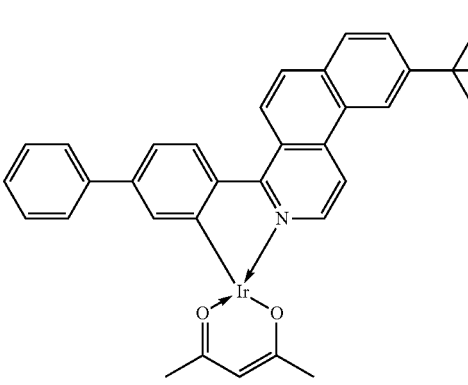
Ir-308 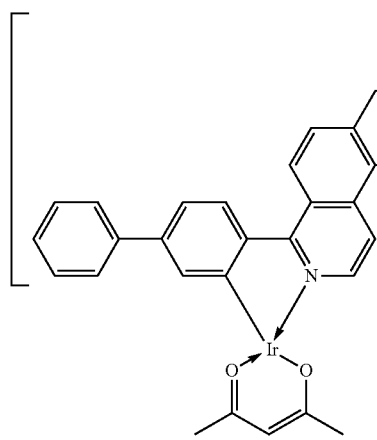
Ir-309 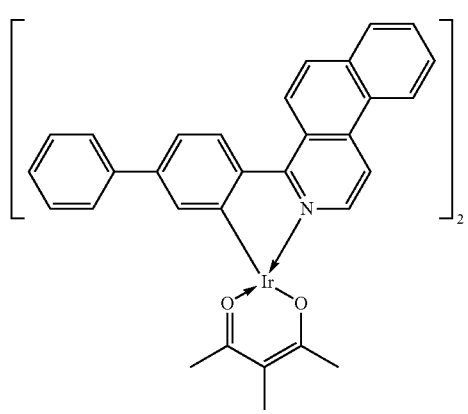
Ir-310 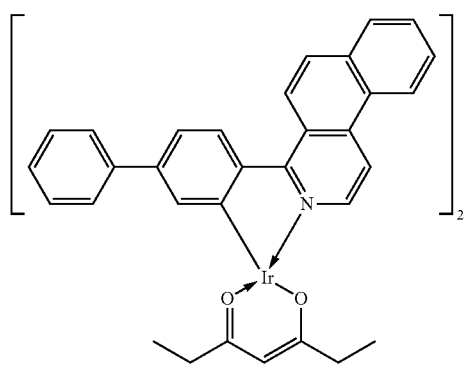
Ir-311 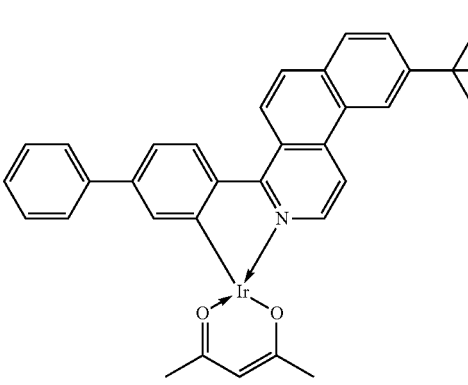

Ir-312
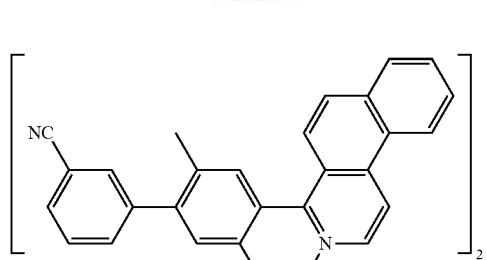
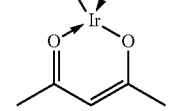
Ir-313
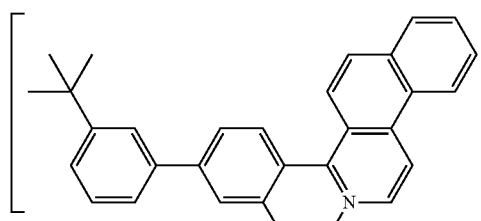
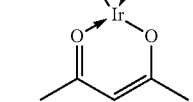
Ir-314
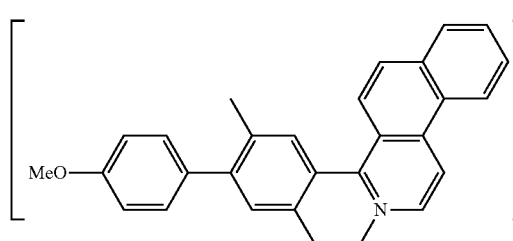
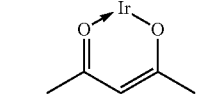
Ir-315
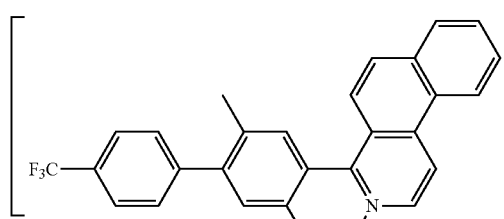
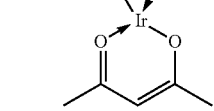
Ir-316
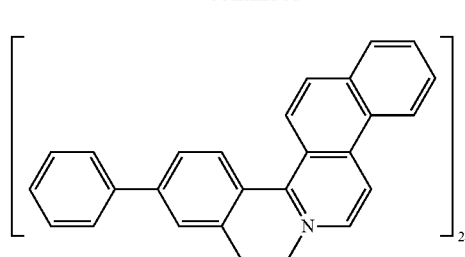
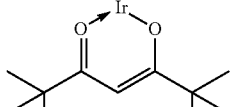
Ir-317
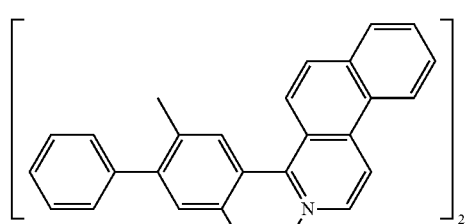
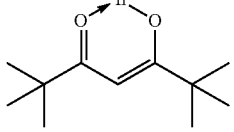
Ir-318
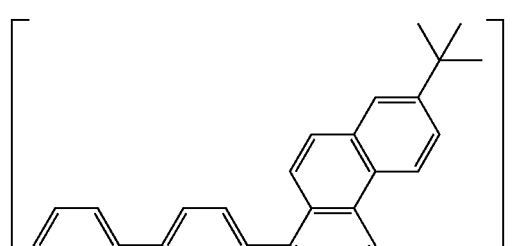
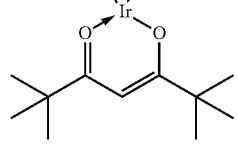

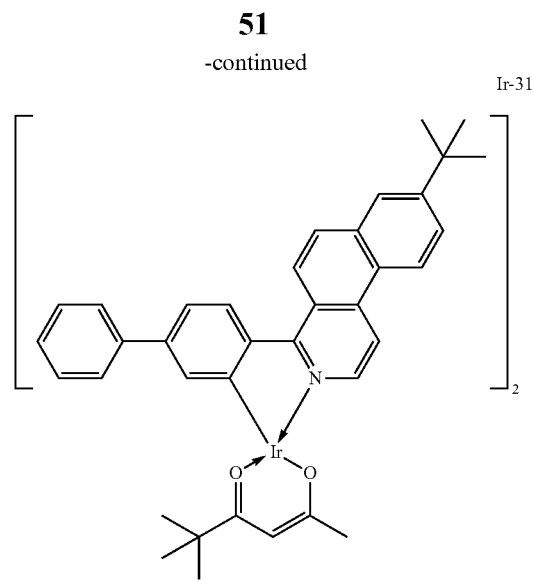
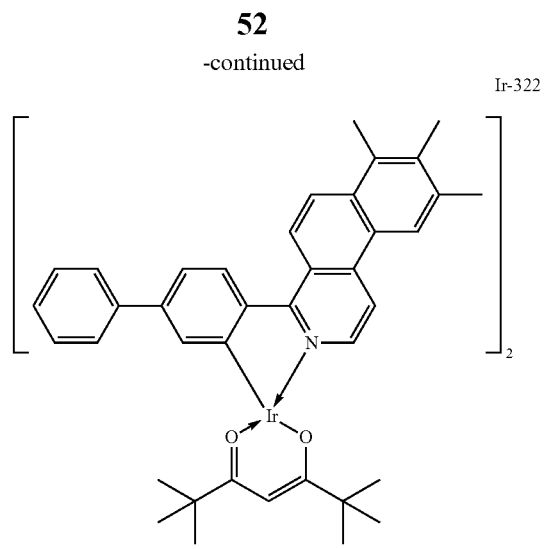
[Group 4 Compound]
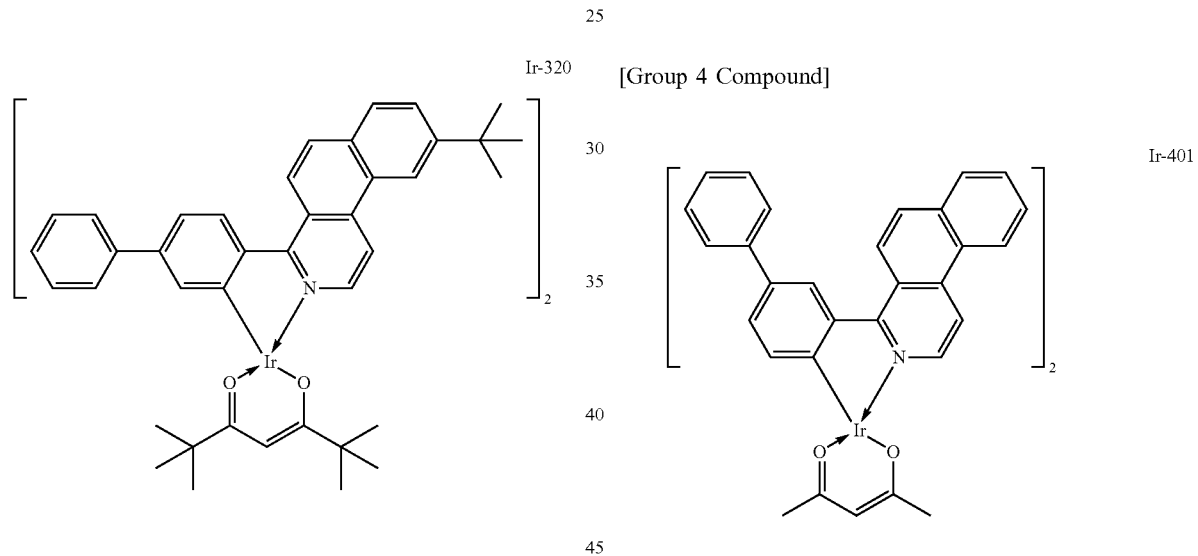
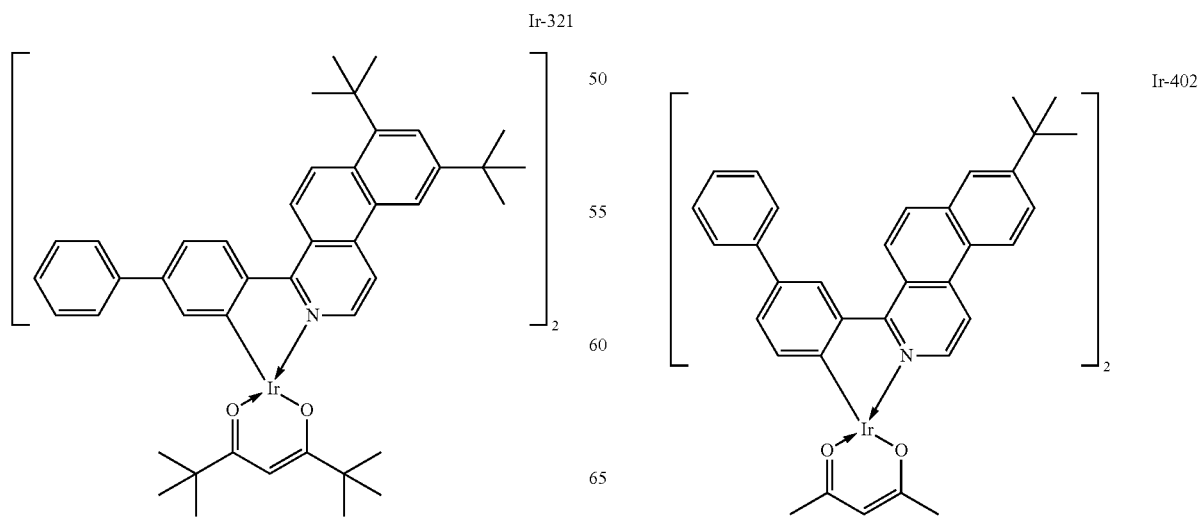

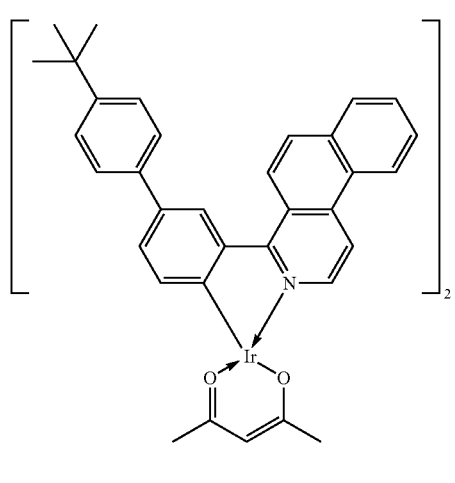
Ir-403
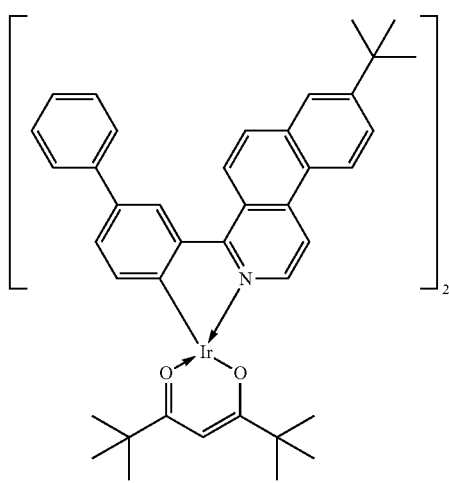
Ir-406
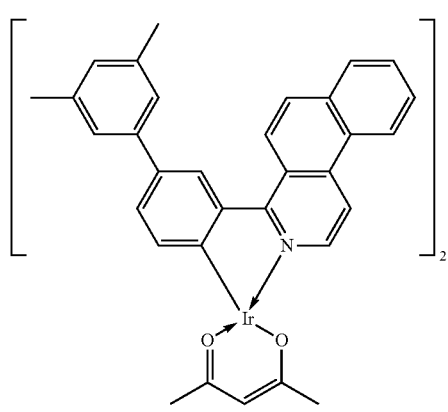
Ir-404
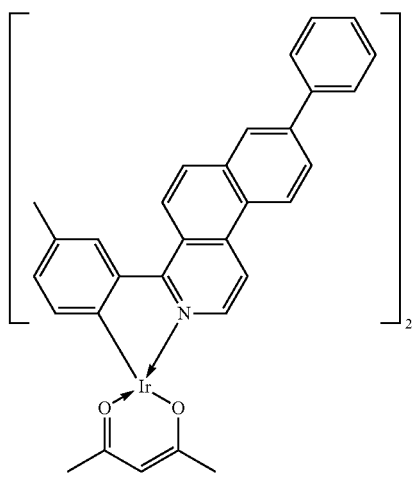
Ir-407
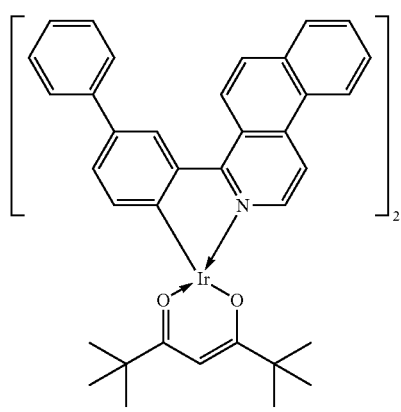
Ir-405
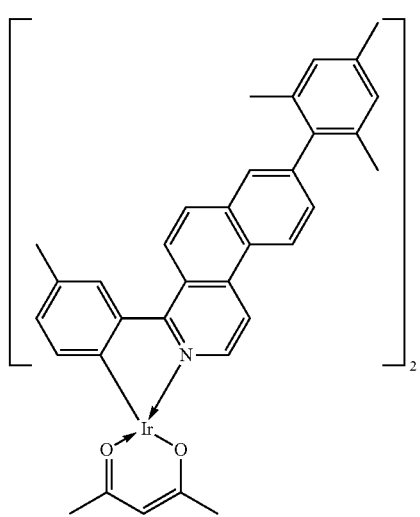
Ir-408

-continued
Ir-409
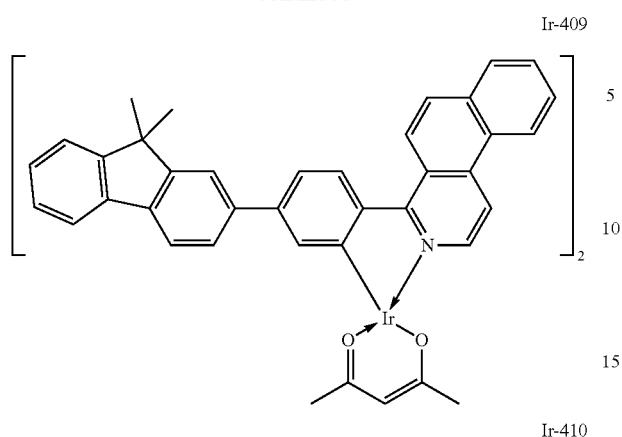
Ir-410
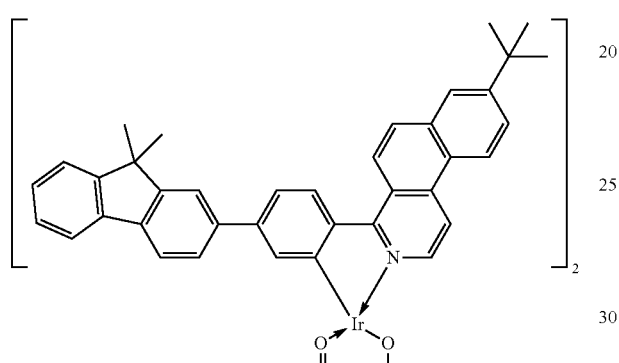
Ir-411
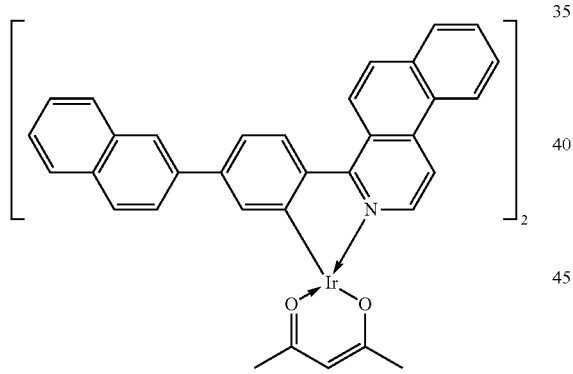
Ir-412
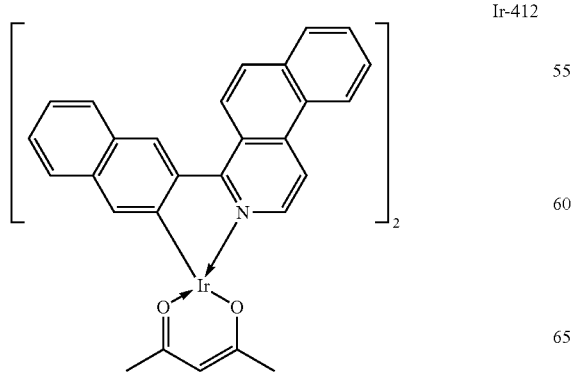
-continued
Ir-413
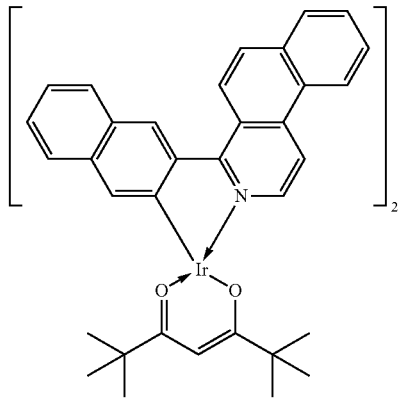
Ir-414
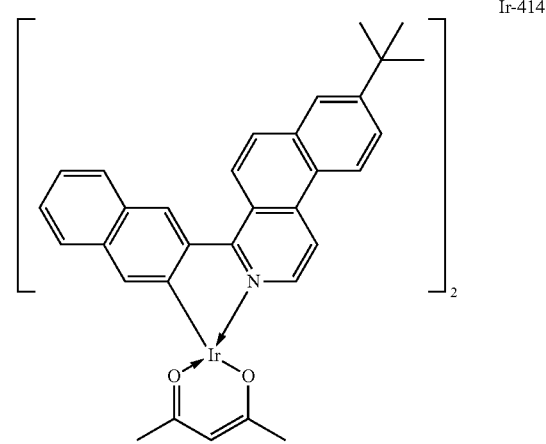
Ir-415

-continued
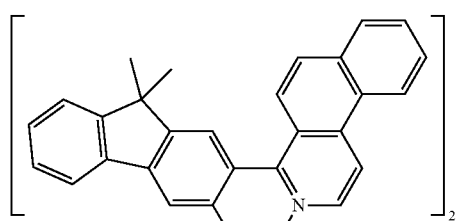
Ir-416
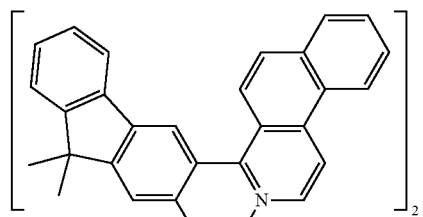
Ir-420
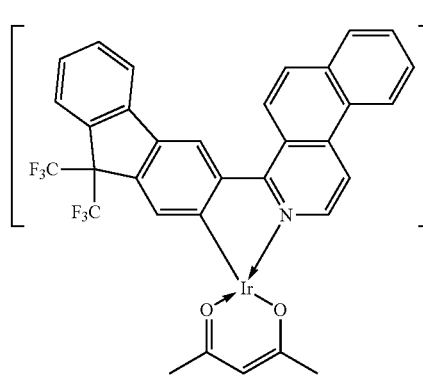
Ir-421
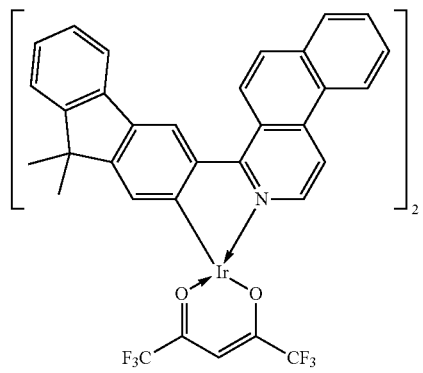
Ir-422
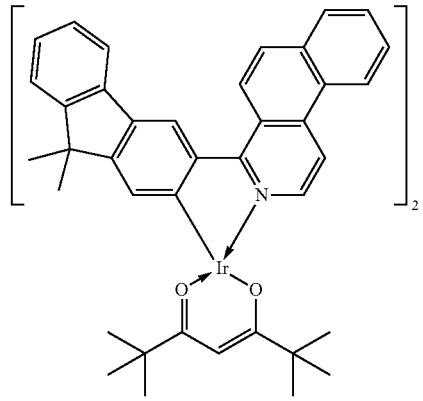
Ir-423

Ir-424
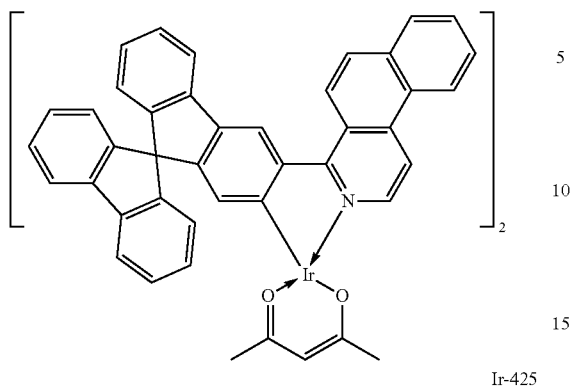
Ir-425
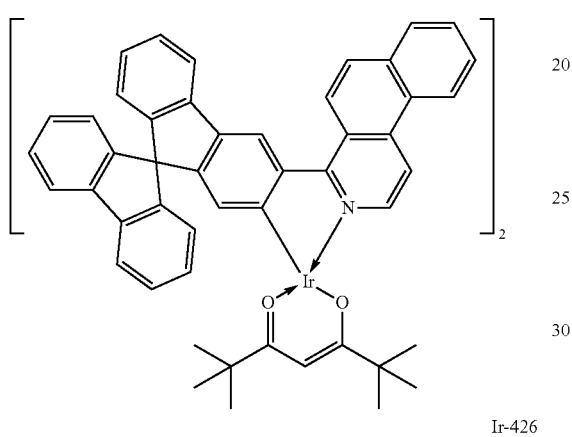
Ir-426
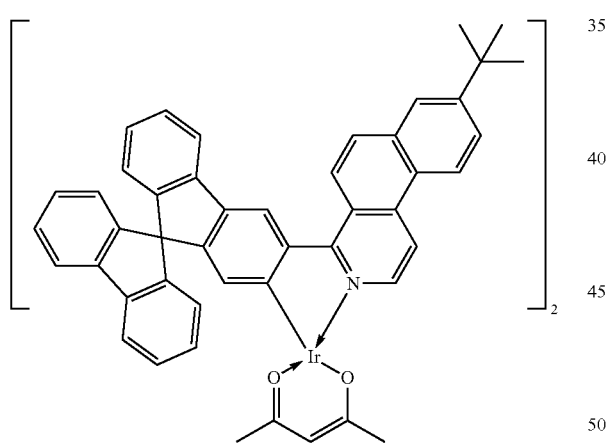
Ir-427
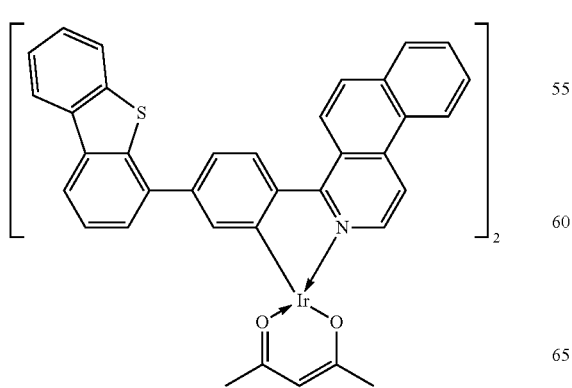
Ir-428
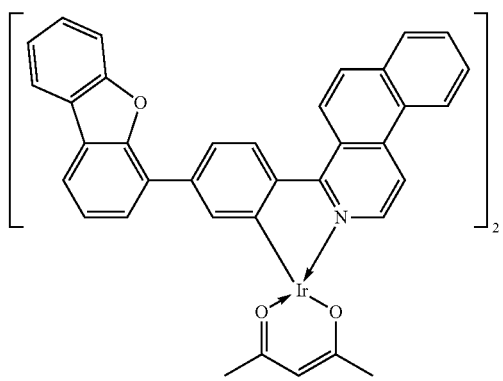
Ir-429
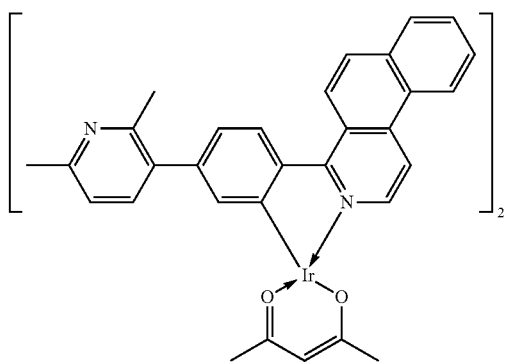
[Group 5a Compound]
Ir-501
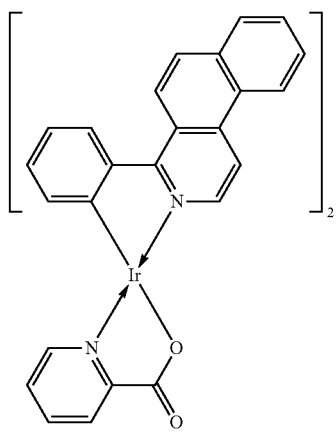

-continued
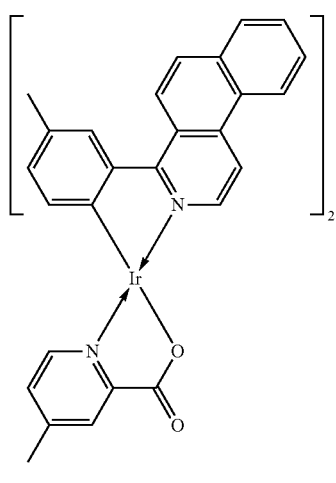
Ir-502
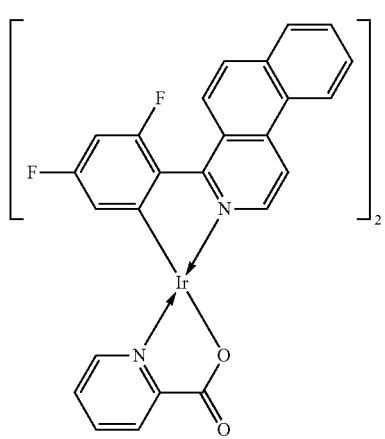
Ir-503
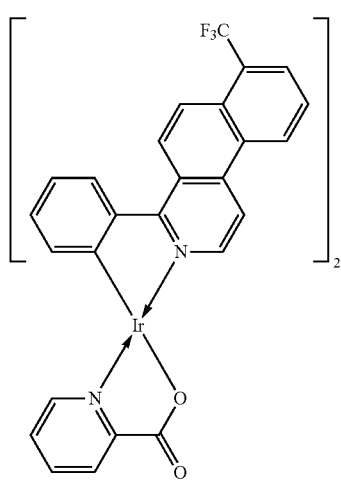
Ir-504
-continued
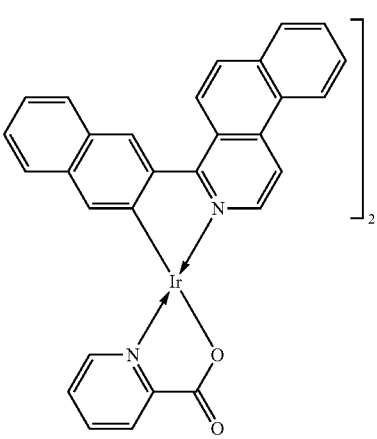
Ir-505
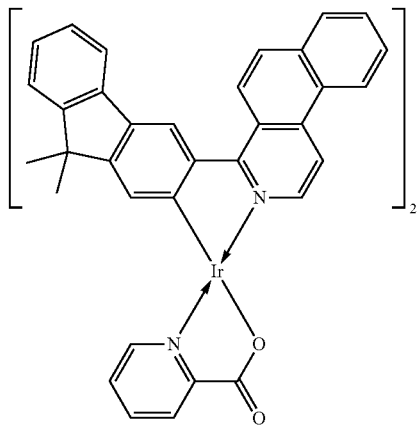
Ir-506
Ir-507

Ir-508
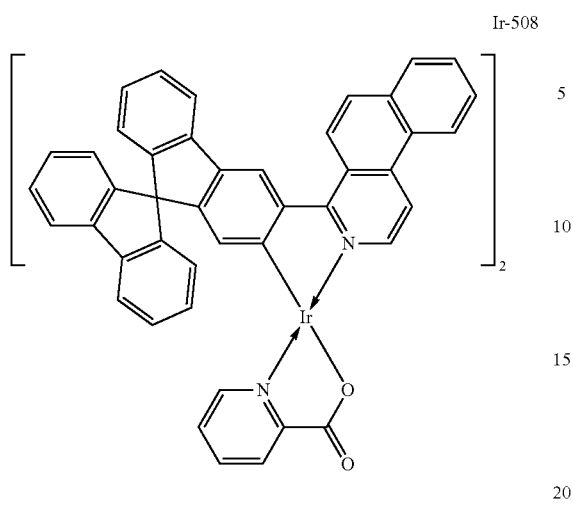
Ir-511
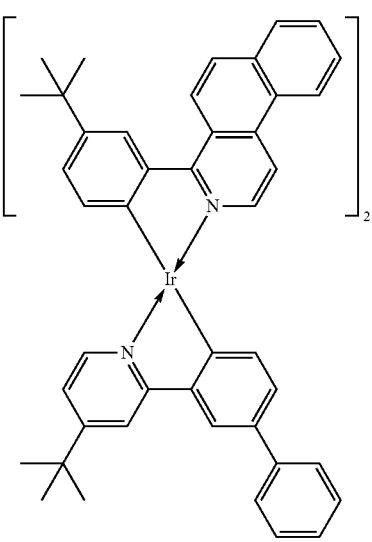
[Group 5b Compound]
Ir-509
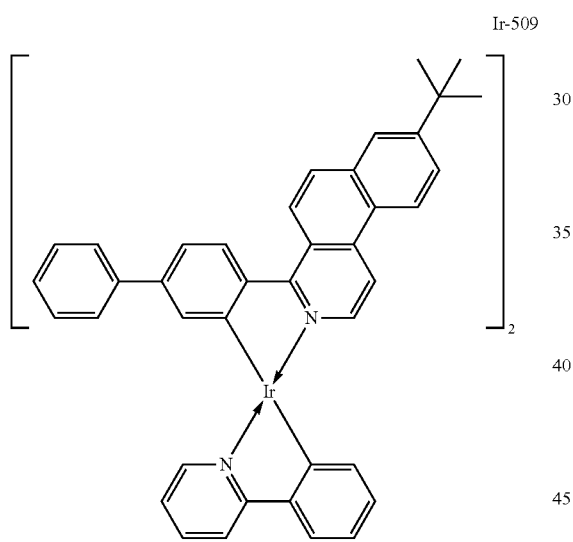
Ir-512
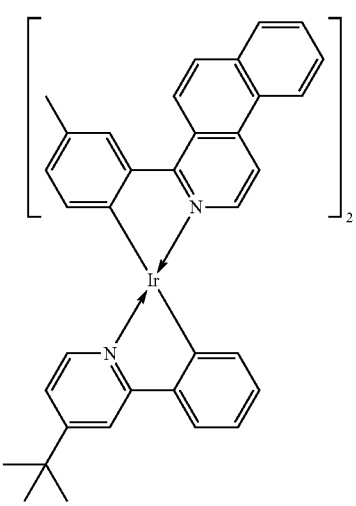
Ir-510
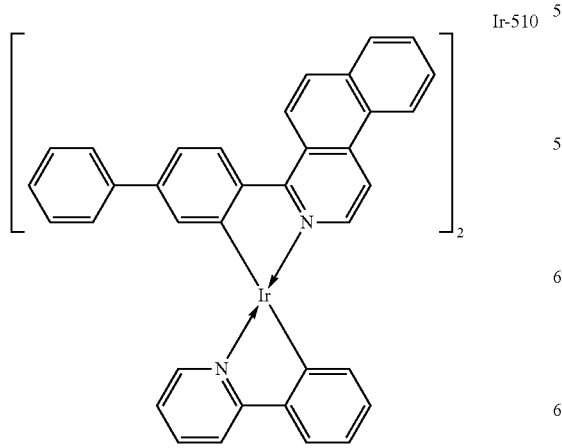
Ir-513
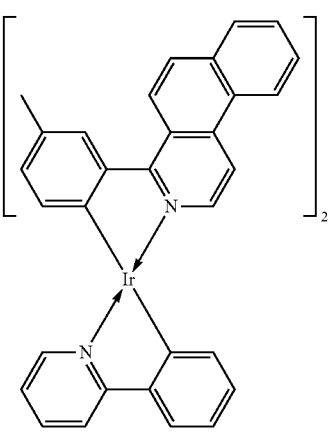

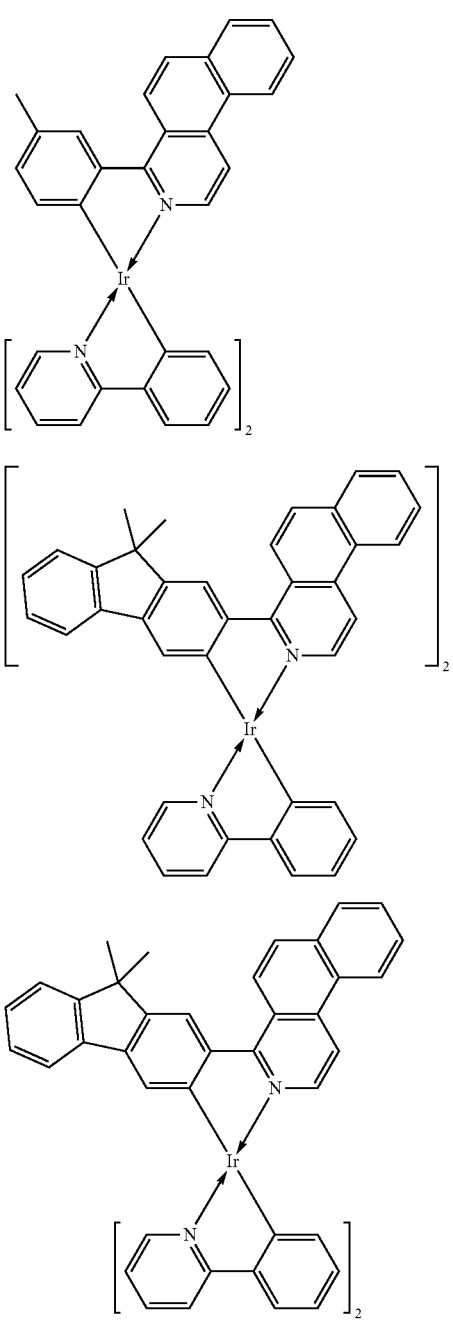

Of the exemplified compounds, the iridium complexes represented by Ir-101 to Ir-123 are each an iridium complex in which all ligands are each a ligand including a benzo[f]isoquinoline skeleton out of the iridium complexes each represented by the general formula [1]. The stability of each of those iridium complexes in the group 1 itself is extremely high by virtue of the structure of the ligand (arylbenzo[f]isoquinoline ligand) of the complex. Therefore, the incorporation of any such complex as a guest into the emission layer provides a long-lifetime organic light-emitting device because the incorporation improves its drive durability.

Of the exemplified compounds, the iridium complexes represented by Ir-201 to Ir-226 are each an iridium complex in which G does not represent a substituted or unsubstituted phenyl group out of the iridium complexes each represented by the general formula [17]. Those iridium complexes in the group 2 are each a complex having an extremely high emission quantum yield and hence the incorporation of any such complex as a guest into the emission layer provides an organic light-emitting device having high emission efficiency. Further, three ligands of each iridium complex in the group 2 include one acac-based ligand (diketone-based bidentate ligand) having a small molecular weight. Accordingly, the complex has the following advantage: the complex can be easily subjected to sublimation purification because the molecular weight of the complex itself is relatively small.

Of the exemplified compounds, the iridium complexes represented by Ir-301 to Ir-322 are each an iridium complex in which G represents a substituted or unsubstituted phenyl group out of the iridium complexes each represented by the general formula [17]. Those iridium complexes in the group 3 are each a complex having an extremely high emission quantum yield as in the iridium complexes in the group 2. Accordingly, the incorporation of any such complex as a guest into the emission layer improves the emission efficiency of the organic light-emitting device.

Of the exemplified compounds, the iridium complexes represented by Ir-401 to Ir-429 are each an iridium complex represented by the general formula [1] in which m represents 2 and n represents 1, but the iridium complex does not correspond to any iridium complex represented by the general formula [17]. Those iridium complexes in the group 4 are each also a complex having an extremely high emission quantum yield as in the iridium complexes in the groups 2 and 3. Accordingly, the incorporation of any such complex as a guest into the emission layer improves the emission efficiency of the organic light-emitting device.

Of the exemplified compounds, the iridium complexes represented by Ir-501 to Ir-508 are each an iridium complex represented by the general formula [1] in which the partial structure $IrX_n$ is represented by the formula [3]. Those iridium complexes in the group ка each contain, in a molecule thereof, one picolinic acid derivative as a ligand. Here, the introduction of the picolinic acid derivative as a ligand shifts the emission peak wavelength of the complex itself to shorter wavelengths as compared with that in the case where the acac-based ligand is introduced.

Of the exemplified compounds, the iridium complexes represented by Ir-509 to Ir-516 are each an iridium complex represented by the general formula [1] in which the partial structure $IrX_n$ is represented by the formula [2]. Those iridium complexes in the group 5b each contain, in a molecule thereof, one or two phenylpyridine (ppy) derivatives. Here, each iridium complex in the group 5b provides red light emission derived from the arylbenzo[f]isoquinoline ligand because the ligand ppy is a non-light-emitting ligand. In addition, the ligand ppy has a smaller molecular weight than that of the arylbenzo[f]isoquinoline ligand. Accordingly, the complex has a smaller molecular weight than that of any iridium complex in the group 1 and hence can be easily subjected to sublimation purification. Therefore, the incorporation of any iridium complex in the group 5b as a guest into the emission layer as in any iridium complex in the group 1 can provide a long-lifetime organic light-emitting device.

By the way, the following structural isomers sterically exist for the iridium complex represented by the general formula [1]: an fac form and an mer form. Although the steric structure of the iridium complex represented by the general formula [1] is not particularly limited in the present invention, the fac form generally credited with having a high quantum yield is preferred. However, in the case of an iridium complex in which two kinds of ligands having different structures coordinate to an iridium atom, the mer form such as Ir(ppy)$_2$acac may also have a high quantum yield. Accordingly, the fac form is not necessarily preferred. In addition, it is difficult to synthesize one of the structural isomers selectively at the time of the synthesis of the complex, and both isomers may be used as a mixture in terms of a cost.

(7) Specific Examples of Hydrocarbon Compound (Host)

Specific structural formulae of the hydrocarbon compound to be incorporated as the host into the organic light-emitting device of the present invention are exemplified below.

[Group A]

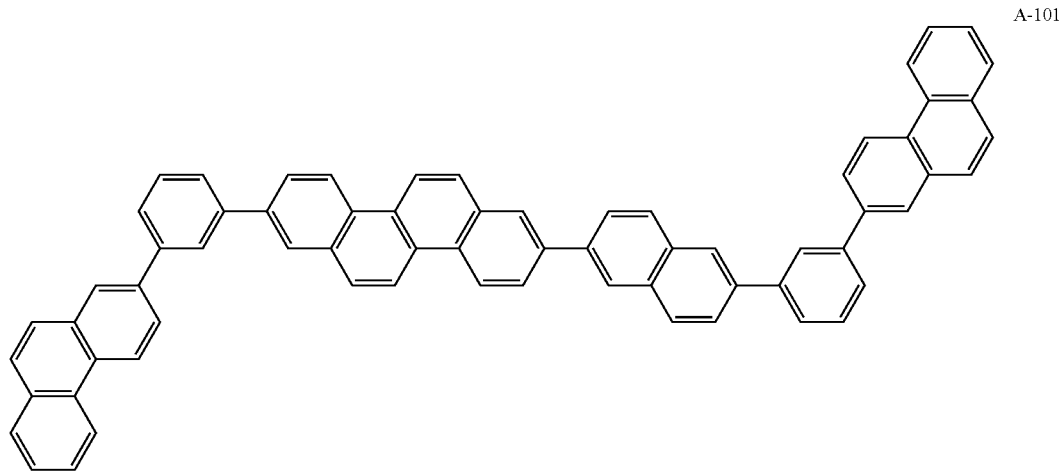

A-101

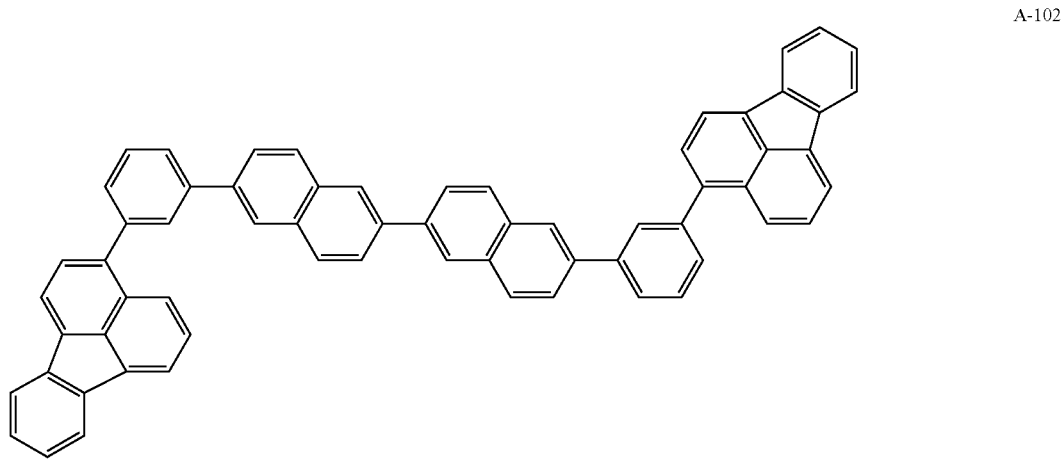

A-102

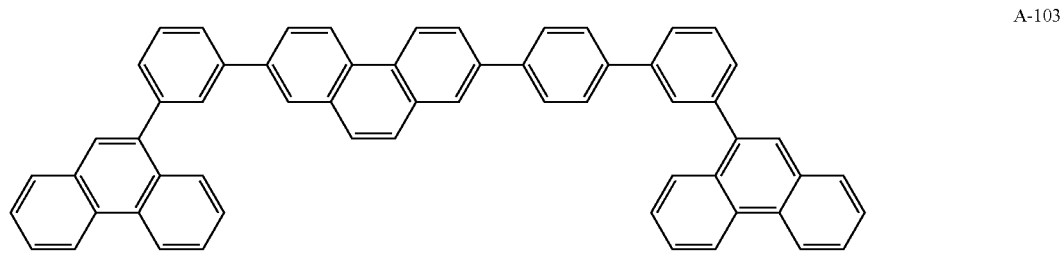

A-103

-continued
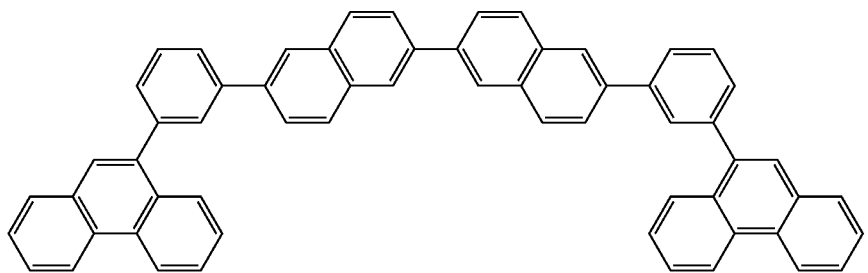
A-104
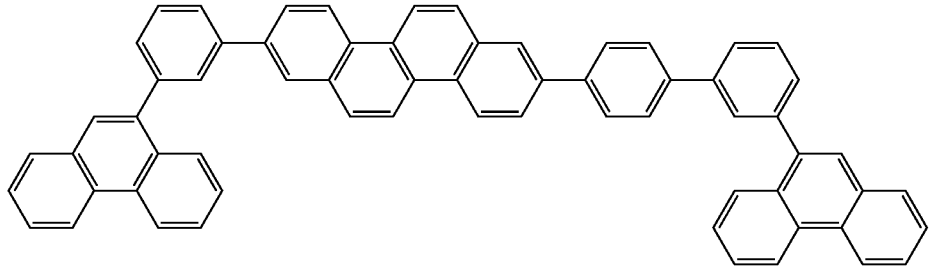
A-105
[Group B]
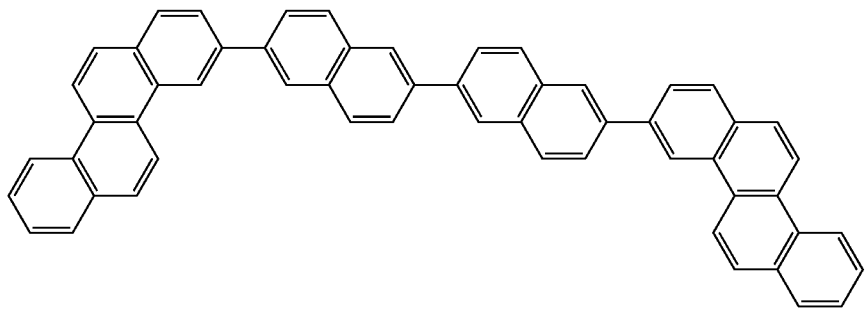
B-101
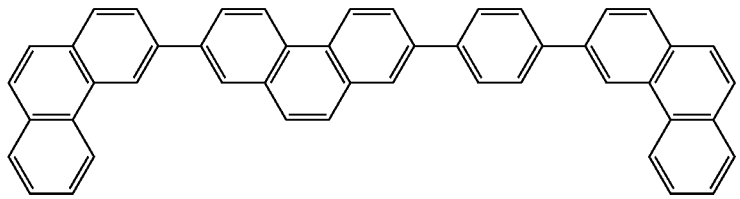
B-102
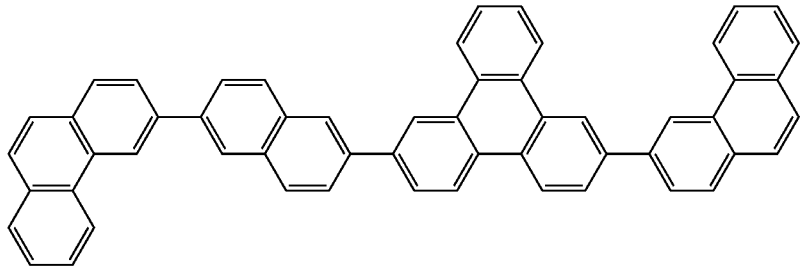
B-103

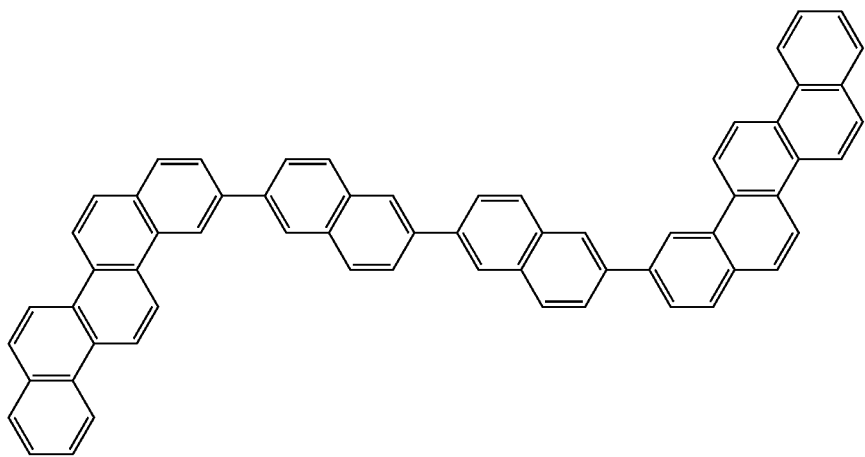
B-104
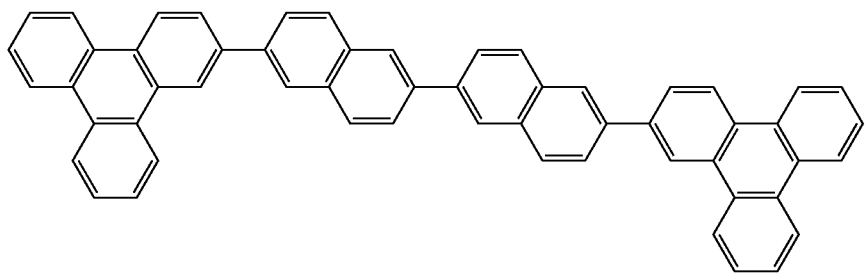
B-105
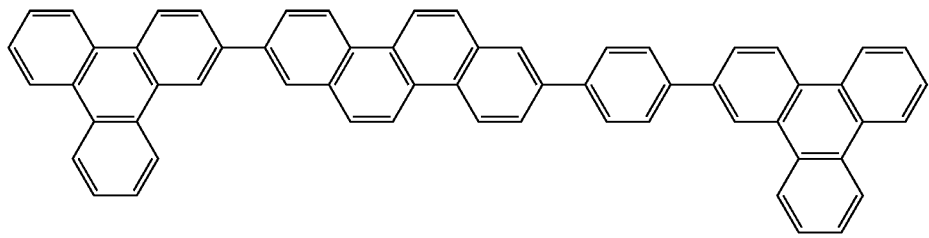
B-106
[Group C]
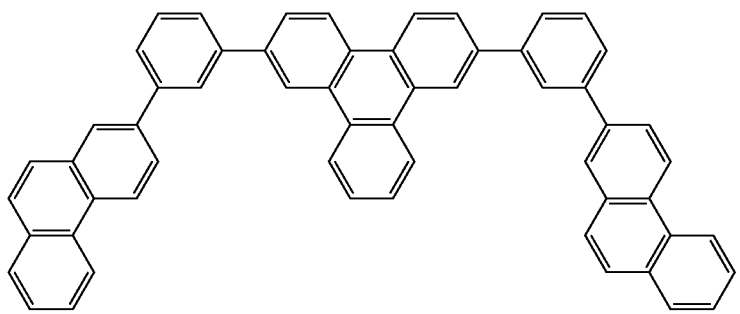
C-101

-continued
C-102
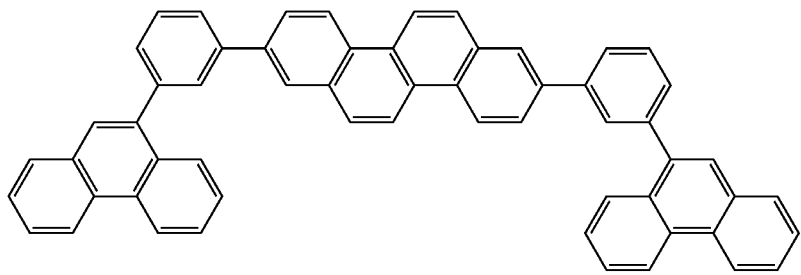
C-103
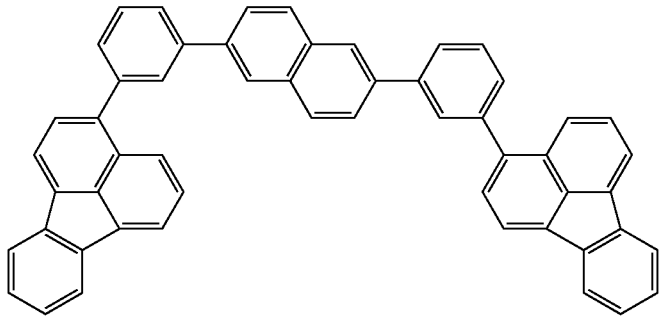
C-104
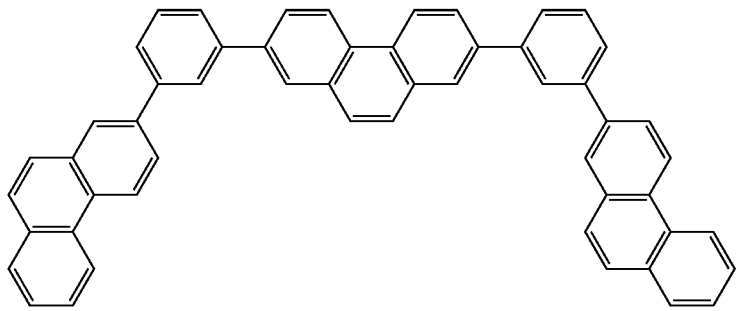
C-105
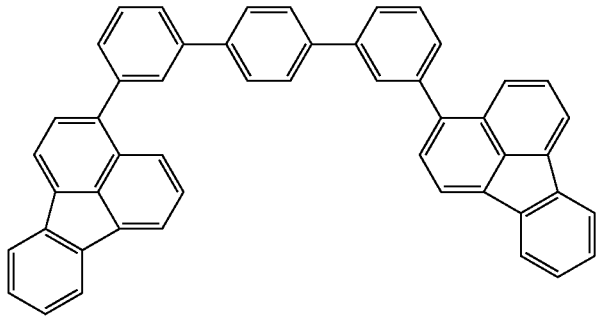
[Group D]
D-101
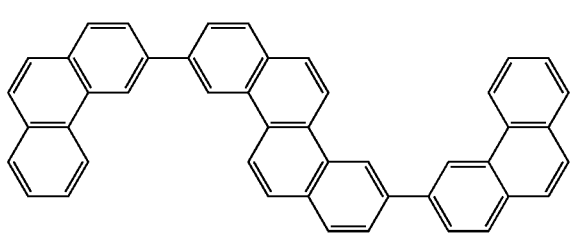
-continued
D-102
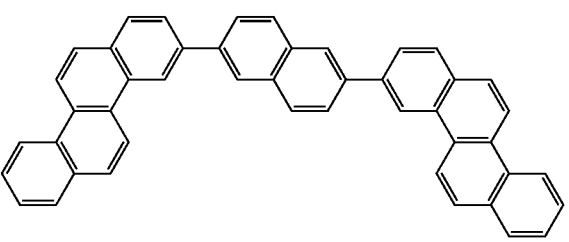

D-103
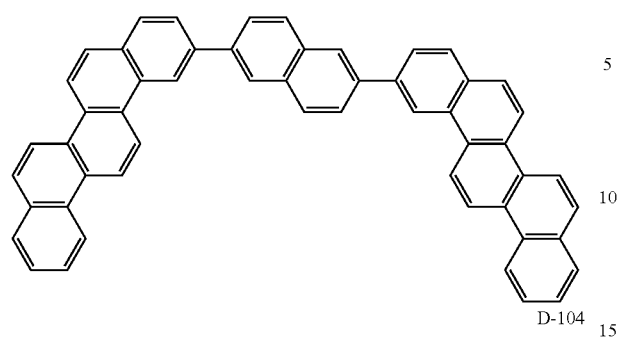
D-105
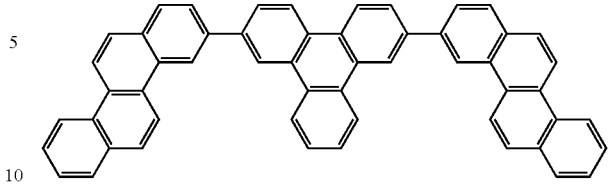
D-104
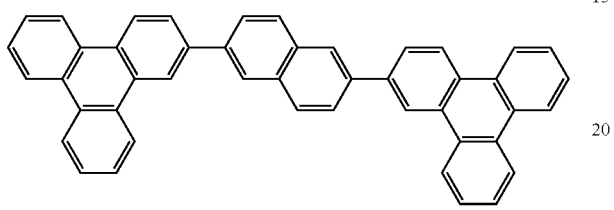
[Group E]
E-101
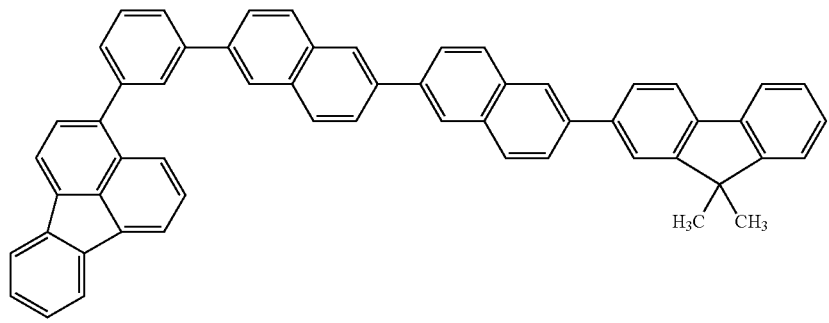
E-102
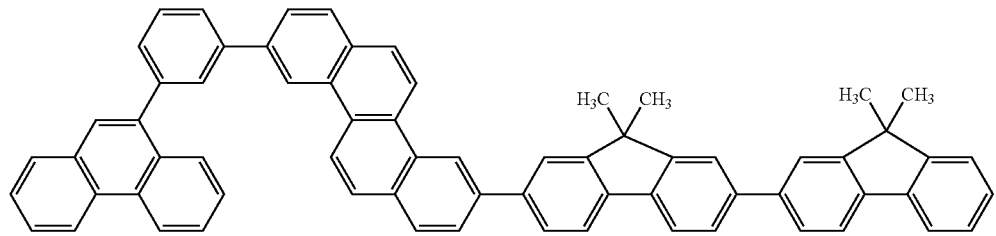
E-103
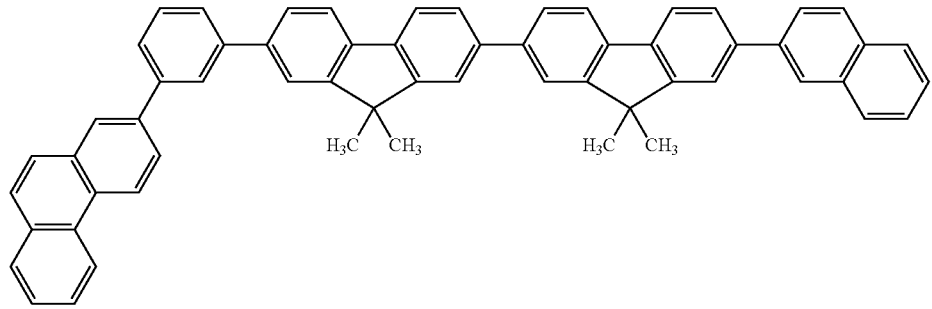

-continued
E-104
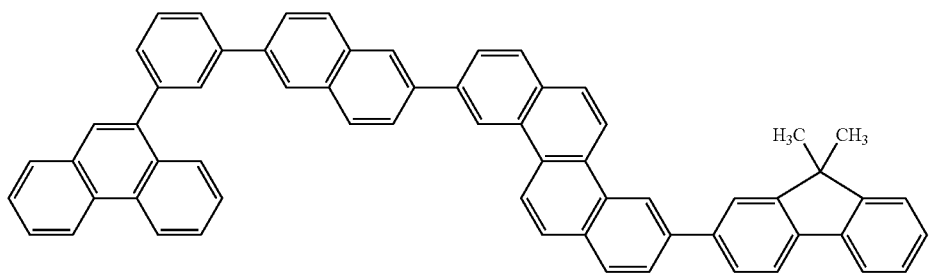
[Group F]
F-101
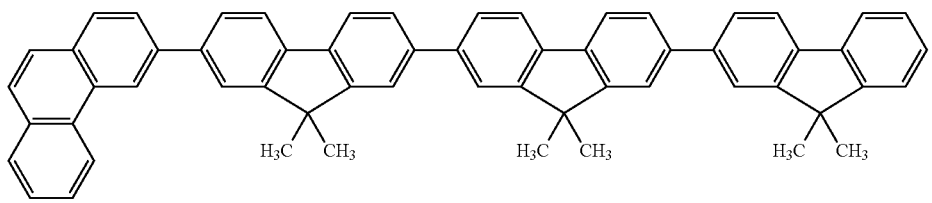
F-102
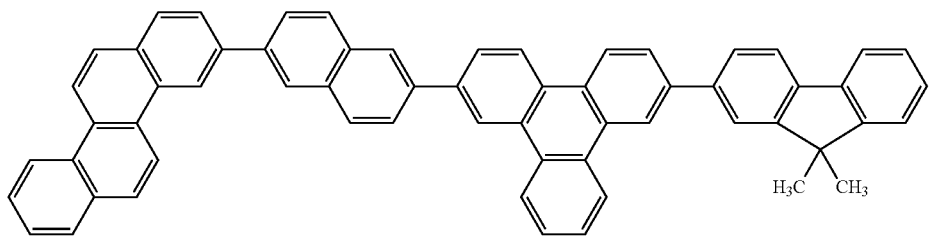
F-103
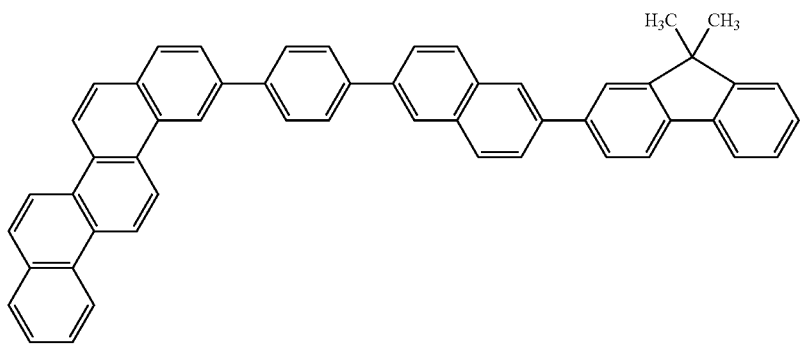
F-104
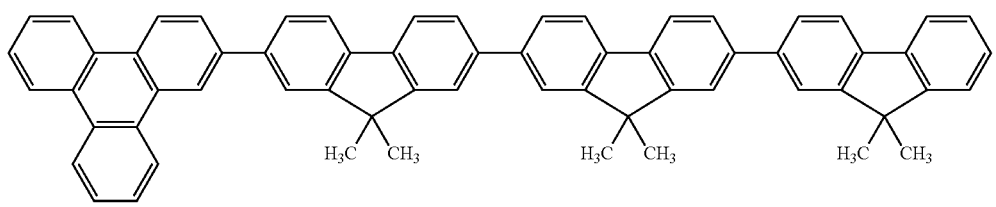

-continued
F-105
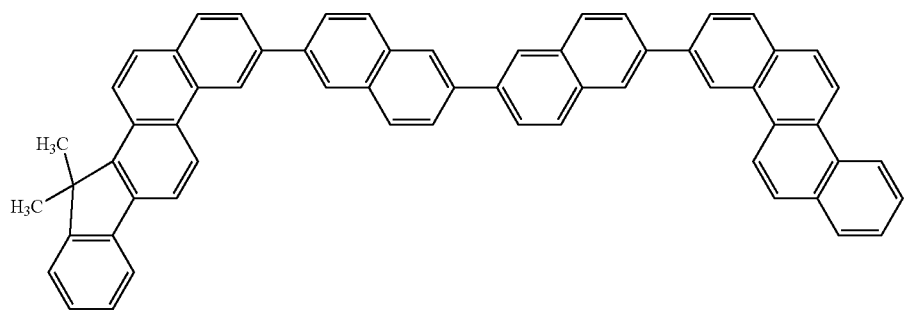
F-106
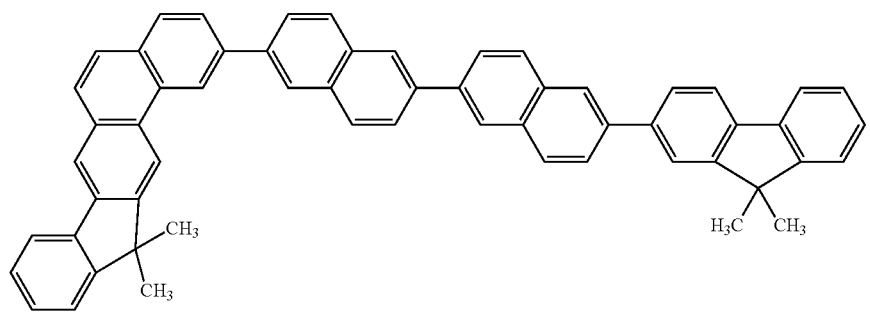
[Group G]
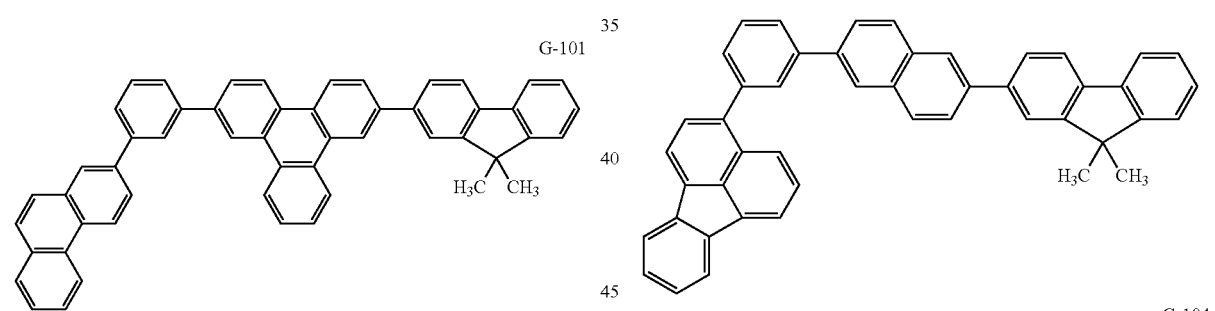
-continued
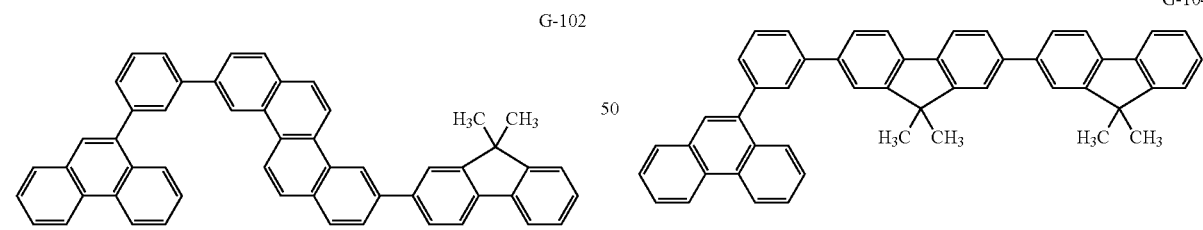
[Group H]
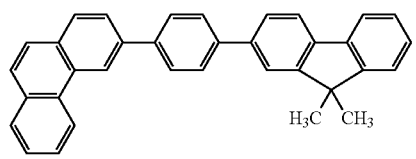
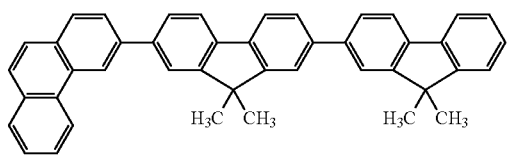

-continued
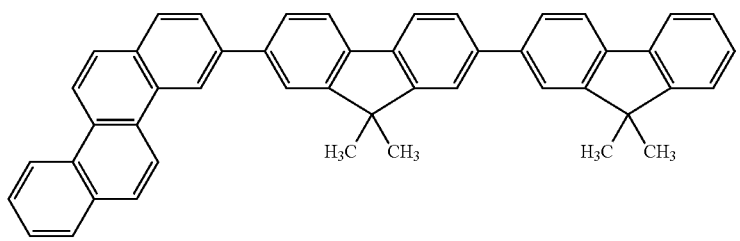
H-103
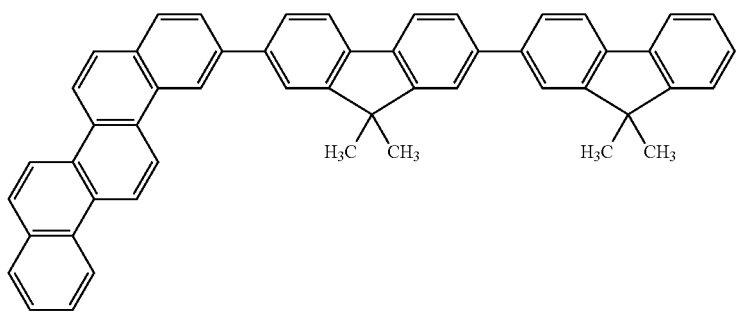
H-104
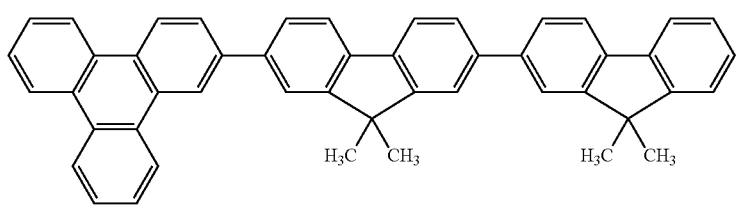
H-105
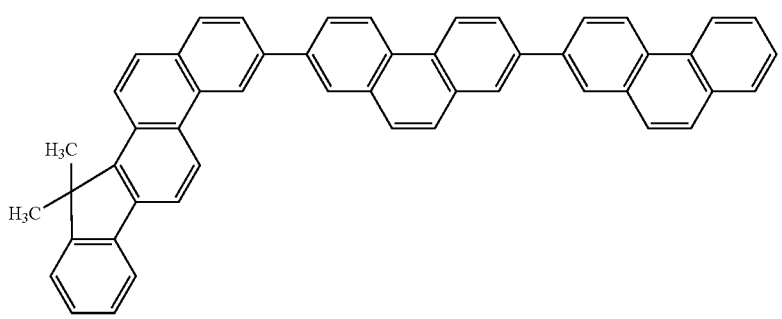
H-106
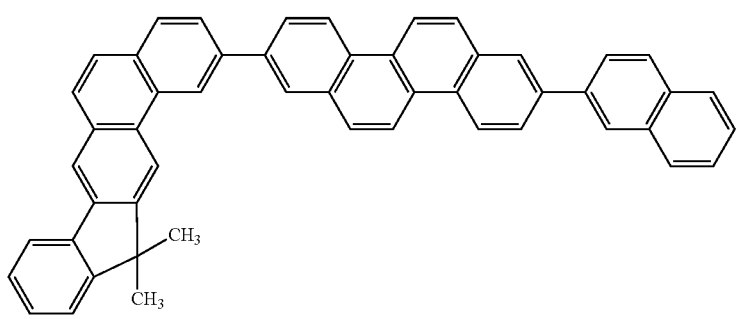
H-107
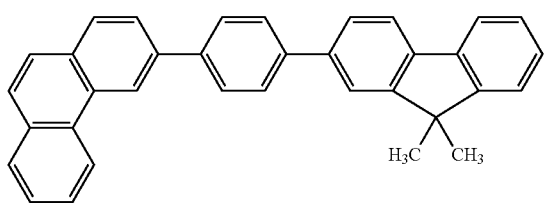
H-108

[Group I]
I-101
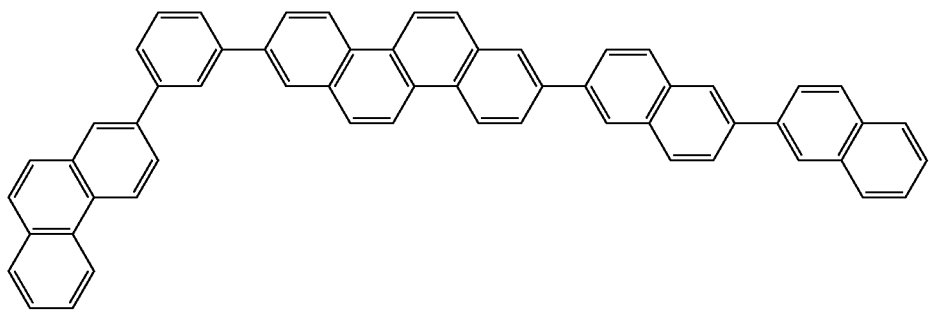
I-102
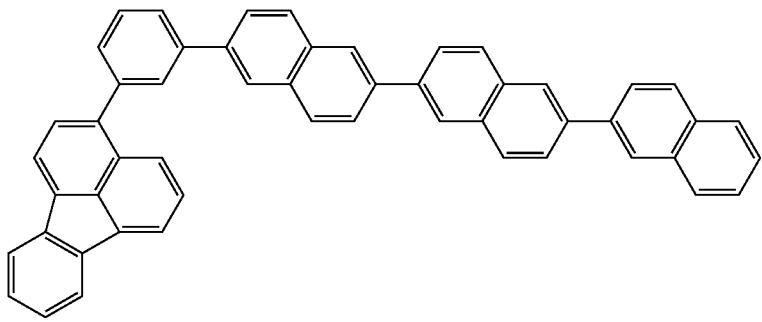
I-103
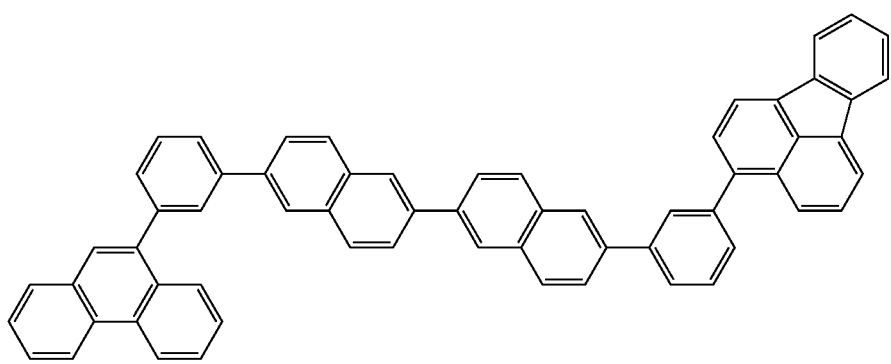
[Group J]
J-101
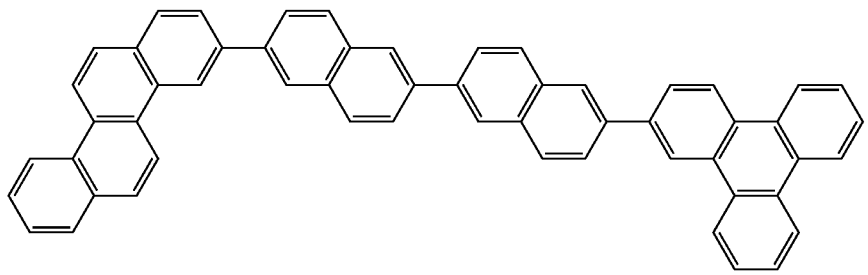
J-102
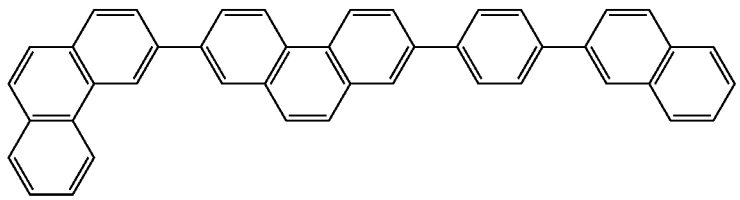

-continued
J-103
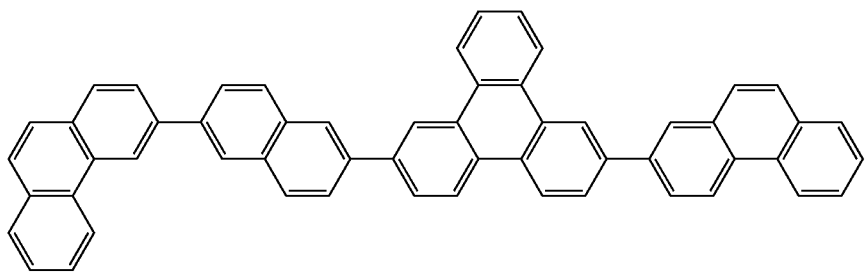
J-104
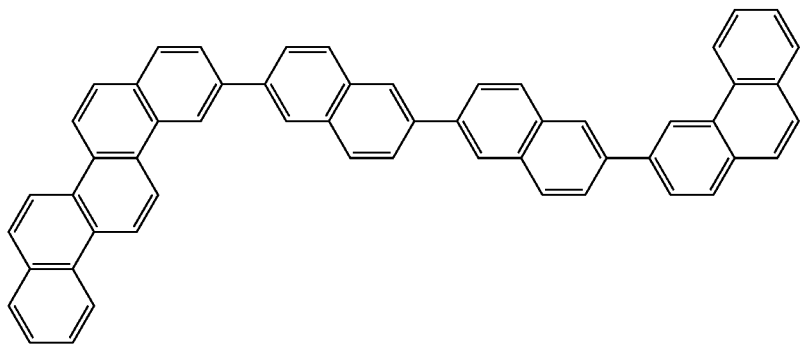
J-105
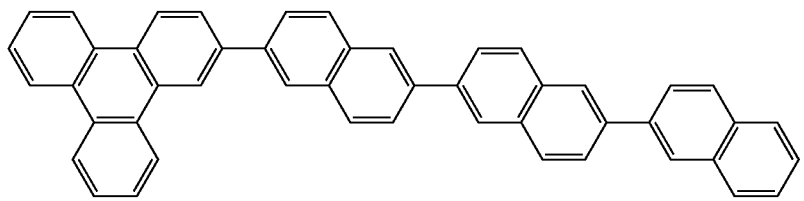
[Group K]
K-101
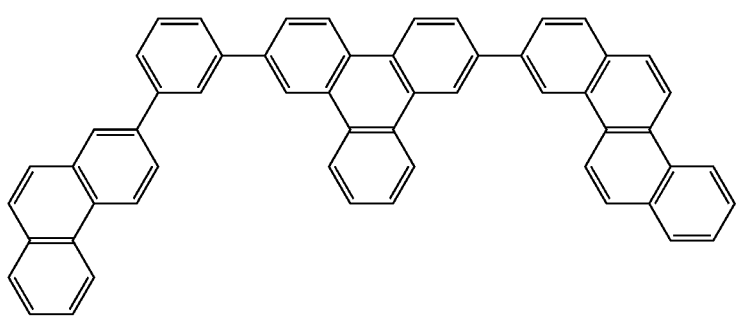
K-102
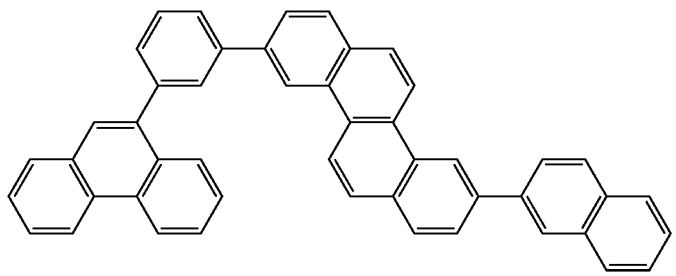

-continued
K-103
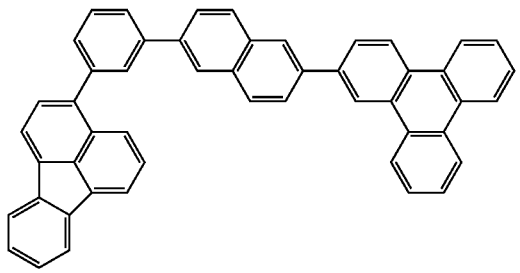
K-104
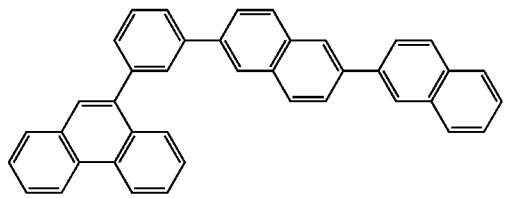
[Group L]
L-101
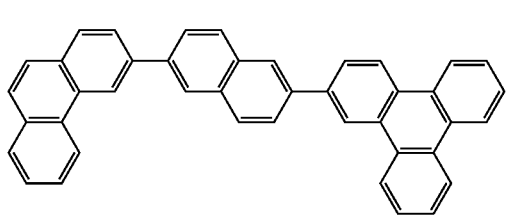
L-102
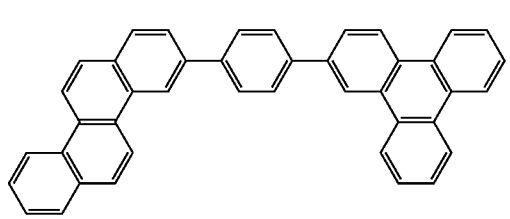
L-103
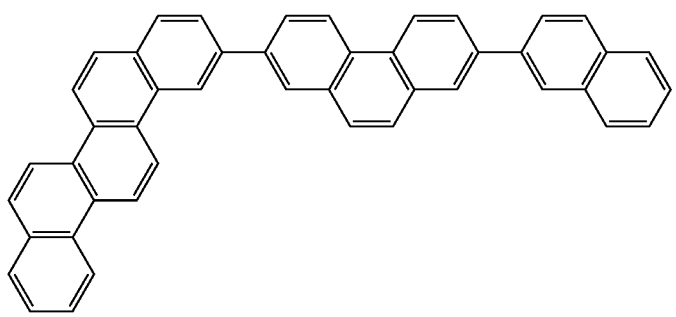
L-104
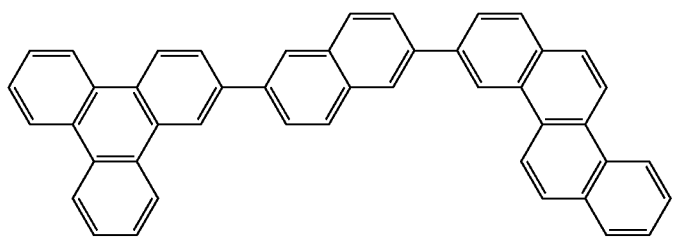
L-105
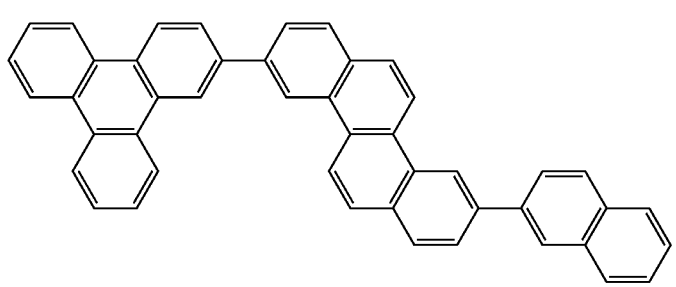

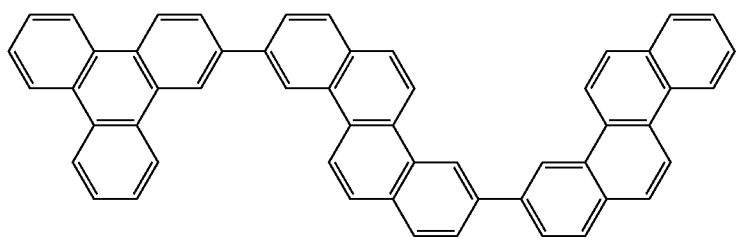

L-106

Each compound in the group A is a compound which has the features (5-1), (5-2), (5-4), and (5-5), in which p (or r) and q (or s) each represent 1, and which contains a metaphenylene group. Each compound belonging to the group A is a compound formed only of a hydrocarbon and all carbon atoms constituting its atoms are only $SP^2$ carbons. Accordingly, the compound has the following feature: the compound is chemically stable and shows a small structural change, and is hence strong against deterioration. In addition, each compound belonging to the group A contains a metaphenylene group, and hence molecular orbitals are localized at $Ar_2$ (or $Ar_6$) and $Ar_3$ (or $Ar_7$), and $Ar_1$ (or $Ar_5$, $Ar_8$) becomes an unoccupied orbital. Accordingly, the compound also has the following feature: the extent to which the molecular orbitals overlap each other is small.

Each compound in the group B is a compound which has the features (5-1), (5-2), (5-4), and (5-5), in which p (or r) and q (or s) each represent 1, but which does not contain any metaphenylene group. Each compound belonging to the group B is a compound formed only of a hydrocarbon and all carbon atoms constituting its atoms are only $SP^2$ carbons as in the compounds in the group A. Accordingly, the compound has the following feature: the compound is chemically stable and shows a small structural change, and is hence strong against deterioration. In addition, each compound belonging to the group B does not contain any metaphenylene group, and hence only the terminal of $Ar_1$ (or $Ar_5$, $Ar_8$) becomes an unoccupied orbital. Accordingly, the compound also has the following feature: its charge conductivity improves.

Each compound in the group C is a compound which has the features (5-1), (5-2), (5-4), and (5-5), in which p (or r) represents 1 and q (or s) represents 0, and which contains a metaphenylene group. Each compound belonging to the group C tends to have a smaller molecular weight (be lighter) because the number of its arylene groups is smaller than that of a compound in which p (or r) and q (or s) each represent 1. In addition, the number of rotation sites of a molecule thereof reduces because the number of the arylene groups is small. Therefore, the compound has the following features: its sublimability improves and the stability of the molecule improves. In addition, each compound belonging to the group C contains a metaphenylene group, and hence molecular orbitals are localized at $Ar_2$ (or $Ar_6$) and $Ar_3$ (or $Ar_7$), and $Ar_1$ (or $Ar_5$, $Ar_8$) becomes an unoccupied orbital.

Accordingly, the compound also has the following feature: the extent to which the molecular orbitals overlap each other is small.

Each compound in the group D is a compound which has the features (5-1), (5-2), (5-4), and (5-5), in which p (or r) represents 1 and q (or s) represents 0, but which does not contain any metaphenylene group. Each compound belonging to the group D tends to have a smaller molecular weight (be lighter) because the number of its arylene groups is smaller than that of a compound in which p (or r) and q (or s) each represent 1. In addition, the number of rotation sites of a molecule thereof reduces because the number of the arylene groups is small. Therefore, the compound has the following features: its sublimability improves and the stability of the molecule improves. In addition, each compound belonging to the group D does not contain any metaphenylene group, and hence only the terminal of $Ar_1$ (or $Ar_5$, $Ar_8$) (or $Ar_4$) becomes an unoccupied orbital. Accordingly, the compound also has the following feature: its charge conductivity improves.

Each compound in the group E is a compound which has the features (5-1), (5-2), (5-3), and (5-4), in which p (or r) and q (or s) each represent 1, and which contains a metaphenylene group. Each compound belonging to the group E is a material in which aryl groups at left and right terminals are different from each other, and hence has the following feature: the extent to which the molecules of the material overlap each other reduces. In addition, each compound in the group E contains $SP^3$ carbon in a molecule thereof in some cases, and in any such case, its HOMO may be raised and its hole-injecting property may improve. In addition, each compound in the group E contains a metaphenylene group, and hence molecular orbitals are localized at $Ar_2$ (or $Ar_6$) and $Ar_3$ (or $Ar_7$), and $Ar_1$ (or $Ar_5$, $Ar_8$) becomes an unoccupied orbital. Accordingly, the compound also has the following feature: the extent to which the molecular orbitals overlap each other is small.

Each compound belonging to the group F is a compound which has the features (5-1), (5-2), (5-3), and (5-4), in which p (or r) and q (or s) each represent 1, but which does not contain any metaphenylene group. Each compound belonging to the group F is a material in which aryl groups at left and right terminals are different from each other, and hence has the following feature: the extent to which the molecules of the material overlap each other reduces. In addition, each compound in the group F contains $SP^3$ carbon in a molecule thereof in some cases, and in any such case, its HOMO may be raised and its hole-injecting property may improve. Further, each compound belonging to the group F does not contain any metaphenylene group, and hence only the terminal of $Ar_1$ (or $Ar_5$, $Ar_8$) becomes an unoccupied orbital. Accordingly, the compound also has the following feature: its charge conductivity improves.

Each compound in the group G is a compound which has the features (5-1), (5-2), (5-3), and (5-4), in which p (or r) represents 1 and q (or s) represents 0, and which contains a metaphenylene group. Each compound belonging to the group G tends to have a smaller molecular weight (be lighter) because the number of its arylene groups is smaller than that of a compound in which p (or r) and q (or s) each represent 1. Therefore, the compound has the following features: its sublimability improves and the stability of a molecule thereof improves. In addition, each compound belonging to the group G is a material in which aryl groups at left and right terminals are different from each other, and hence has the following feature: the extent to which the molecules of the material overlap each other reduces. In addition, each compound in the group G contains $SP^3$ carbon in a molecule thereof in some cases, and in any such case, its HOMO may be raised and its hole-injecting property may improve. Further, each compound belonging to the group G contains a metaphenylene group, and hence molecular orbitals are localized at $Ar_2$ (or $Ar_6$) and $Ar_3$ (or $Ar_7$), and $Ar_1$ (or $Ar_5$, $Ar_8$) becomes an unoccupied orbital. Accordingly, the compound also has the following feature: the extent to which the molecular orbitals overlap each other is small.

Each compound in the group H is a compound which has the features (5-1), (5-2), (5-3), and (5-4), in which p (or r) represents 1 and q (or s) represents 0, but which does not contain any metaphenylene group. Each compound belonging to the group H tends to have a smaller molecular weight (be lighter) because the number of its arylene groups is smaller than that of a compound in which p (or r) and q (or s) each represent 1. Therefore, the compound has the following features: its sublimability improves and the stability of a molecule thereof improves. In addition, each compound belonging to the group H is a material in which aryl groups at left and right terminals are different from each other, and hence has the following feature: the extent to which the molecules of the material overlap each other reduces. In addition, each compound in the group H contains $SP^3$ carbon in a molecule thereof in some cases, and in any such case, its HOMO may be raised and its hole-injecting property may improve. Further, each compound belonging to the group H does not contain any metaphenylene group, and hence only the terminal of $Ar_1$ (or $Ar_5$, $Ar_8$) becomes an unoccupied orbital. Accordingly, the compound also has the following feature: its charge conductivity improves.

Each compound in the group I is a compound which has the features (5-1), (5-2), (5-3), (5-4), and (5-5), in which p (or r) and q (or s) each represent 1, and which contains a metaphenylene group. Each compound belonging to the group I has the following features: the compound shows small structural changes in a radical state and an excited state, and is hence stable; and aryl groups at left and right terminals are different from each other, and hence the extent to which the molecules of the material overlap each other reduces. In addition, each compound belonging to the group I contains a metaphenylene group, and hence molecular orbitals are localized at $Ar_2$ (or $Ar_6$) and $Ar_3$ (or $Ar_7$), and $Ar_1$ (or $Ar_5$, $Ar_8$) becomes an unoccupied orbital. Accordingly, the compound also has the following feature: the extent to which the molecular orbitals overlap each other is small.

Each compound in the group J is a compound which has the features (5-1), (5-2), (5-3), (5-4), and (5-5), in which p (or r) and q (or s) each represent 1, but which does not contain any metaphenylene group. Each compound belonging to the group J has the following features as in the compounds belonging to the group I: the compound shows small structural changes in a radical state and an excited state, and is hence stable; and aryl groups at left and right terminals are different from each other, and hence the extent to which the molecules of the material overlap each other reduces. In addition, each compound belonging to the group J does not contain any metaphenylene group, and hence only the terminal of $Ar_1$ (or $Ar_5$, $Ar_8$) becomes an unoccupied orbital. Accordingly, the compound also has the following feature: its charge conductivity improves.

Each compound in the group K is a compound which has the features (5-1), (5-2), (5-3), (5-4), and (5-5), in which p (or r) represents 1 and q (or s) represents 0, and which contains a metaphenylene group. Each compound belonging to the group K tends to have a smaller molecular weight (be lighter) because the number of its arylene groups is smaller than that of a compound in which p (or r) and q (or s) each represent 1. In addition, the number of rotation sites of a molecule thereof reduces because the number of the arylene groups is small. Therefore, the compound has the following features: its sublimability improves and the stability of the molecule improves. In addition, each compound belonging to the group K contains a metaphenylene group, and hence molecular orbitals are localized at $Ar_2$ (or $Ar_6$) and $Ar_3$ (or $Ar_7$), and $Ar_1$ (or $Ar_5$, $Ar_8$) becomes an unoccupied orbital. Accordingly, the compound also has the following feature: the extent to which the molecular orbitals overlap each other is small.

Each compound in the group L is a compound which has the features (5-1), (5-2), (5-3), (5-4), and (5-5), in which p (or r) represents 1 and q (or s) represents 0, but which does not contain any metaphenylene group. Each compound belonging to the group L tends to have a smaller molecular weight (be lighter) because the number of its arylene groups is smaller than that of a compound in which p (or r) and q (or s) each represent 1. In addition, the number of rotation sites of a molecule thereof reduces because the number of the arylene groups is small. Therefore, the compound has the following features: its sublimability improves and the stability of the molecule improves. In addition, each compound belonging to the group L does not contain any metaphenylene group, and hence only the terminal of $Ar_1$ (or $Ar_5$, $Ar_8$) becomes an unoccupied orbital. Accordingly, the compound also has the following feature: its charge conductivity improves.

(8) Specific Examples of Third Component

Specific structural formulae of the third component that can be incorporated into the organic light-emitting device of the present invention are exemplified below.

[Group M]
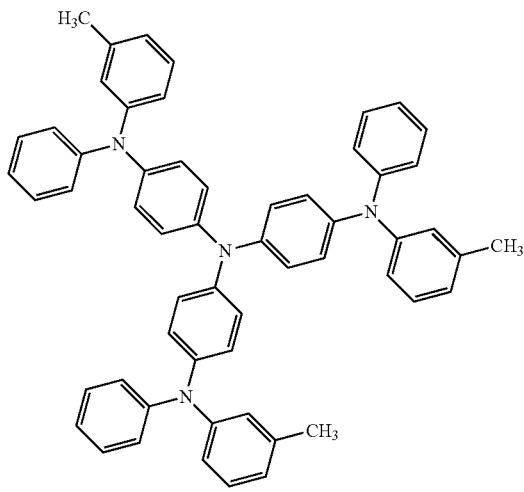
M-101
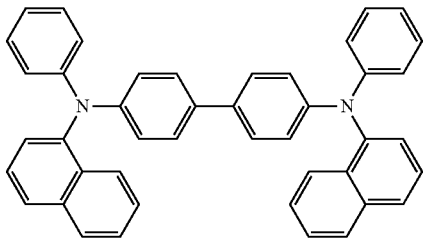
M-102
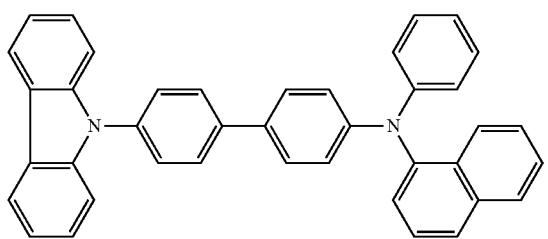
M-103
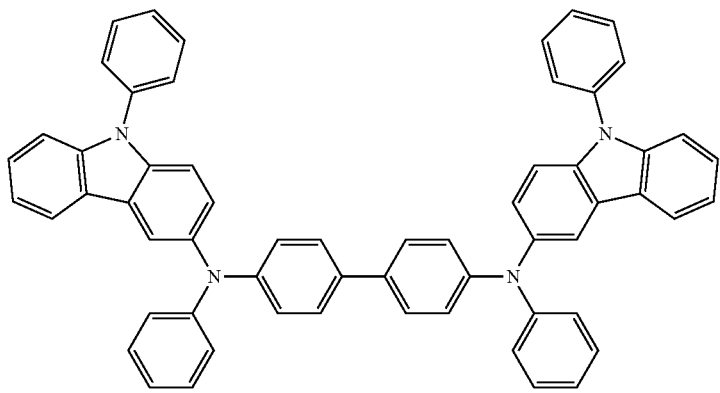
M-104
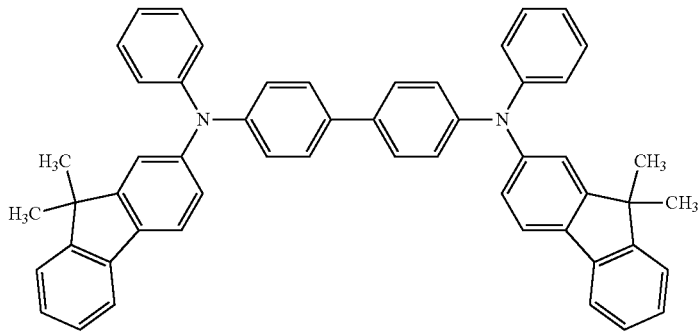
M-105

[Group N]
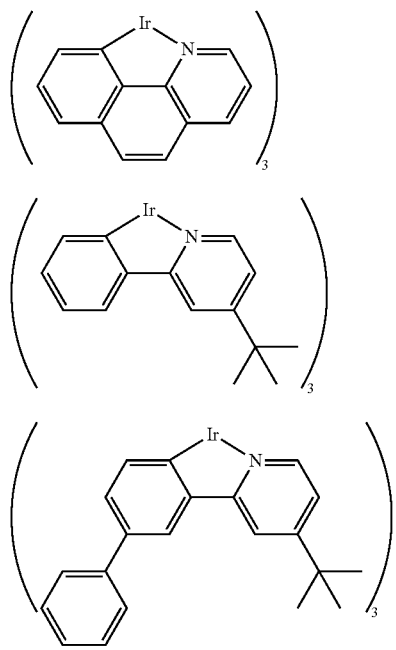
N-101
N-102
N-103
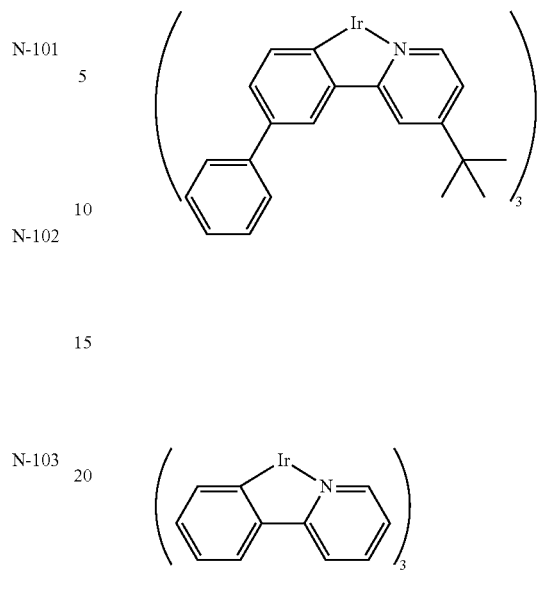
N-104
N-105
[Group O]
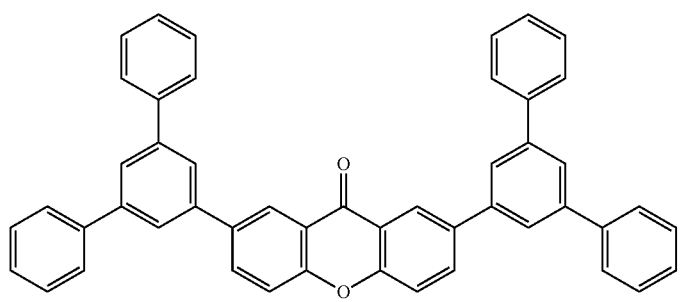
O-101
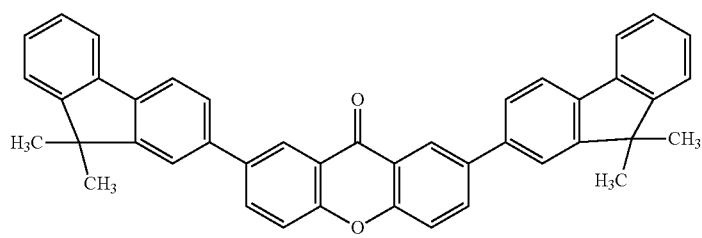
O-102
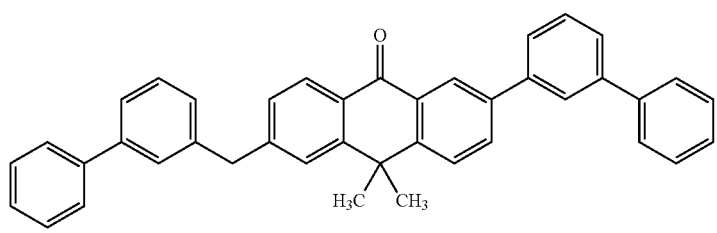
O-103

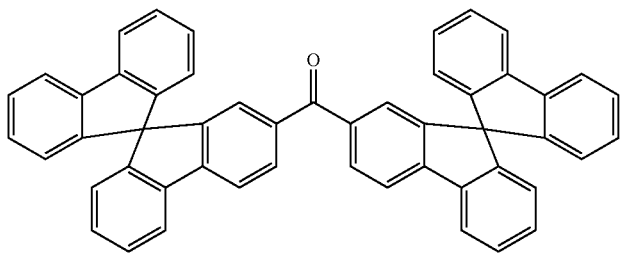

O-104

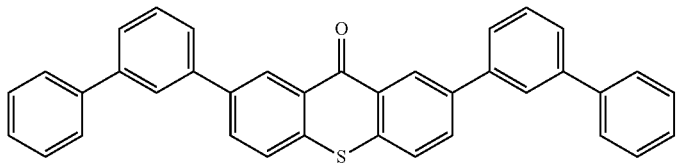

O-105

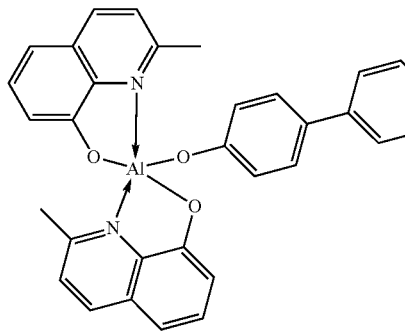

O-106

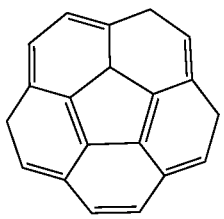

O-107

[Group P]

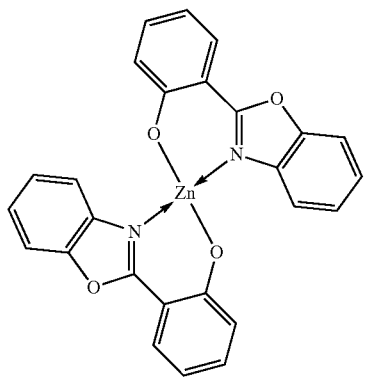

P-101

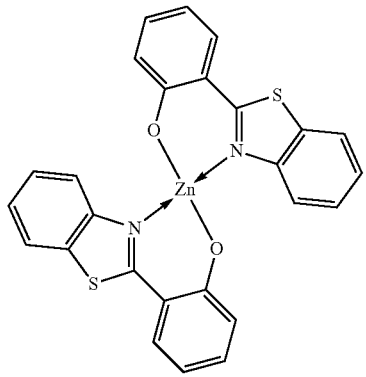

P-102

Each compound belonging to the group M is an amine-containing compound and is a compound having the following feature: its hole-injecting/transporting ability is high.

Each compound belonging to the group L is a metal complex (iridium complex) and is a compound having a smaller ΔS-T value than that of the hydrocarbon compound as the host. Accordingly, the incorporation of the compound as the third component can reduce a band gap and hence improves a charge-transporting ability. Further, each compound belonging to the group L is a metal complex containing a heavy metal (iridium) and hence has a long retention time of the triplet excited state ($T_1$). Accordingly, the compound can efficiently transfer an energy obtained from the host to the light-emitting material.

The compounds belonging to the group O are a group of compounds each having the feature (4-2). In addition, the compounds belonging to the group P are a group of compounds each having the feature (4-3).

(9) Constituent Material Except Iridium Complex and Hydrocarbon Compound

As described above, the organic compound layer (preferably the emission layer) of the organic light-emitting device of the present invention contains at least the iridium complex represented by the general formula [1] and the hydrocarbon compound represented by the general formula [5], or the iridium complex represented by the general formula [6] and the hydrocarbon compound represented by the general formula [10], provided that in the present invention, conventionally known low-molecular weight and high-molecular weight materials can each be used as required in addition to these compounds. More specifically, a hole-injecting/transporting material, a host, a light emission assist material, an electron-injecting/transporting material, or the like can be used together with the iridium complex and the hydrocarbon compound.

Examples of those materials are listed below.

The hole-injecting/transporting material is preferably a material having a high hole mobility so that the injection of a hole from the anode may be facilitated and the injected hole can be transported to the emission layer. In addition, the material is preferably a material having a high glass transition point for preventing the deterioration of film quality such as crystallization in the organic light-emitting device. Examples of the low-molecular weight and high-molecular weight materials each having hole-injecting/transporting performance include a triarylamine derivative, an arylcarbazole derivative, a phenylenediamine derivative, a stilbene derivative, a phthalocyanine derivative, a porphyrin derivative, poly(vinyl carbazole), poly(thiophene), and other conductive polymers. Further, the hole-injecting/transporting material is suitably used for the electron-blocking layer as well.

Specific examples of a compound to be used as the hole-injecting/transporting material are shown below. However, the compound is of course not limited thereto.

HT1

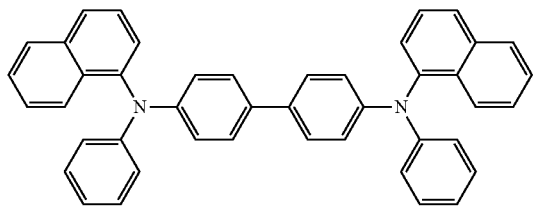

HT2

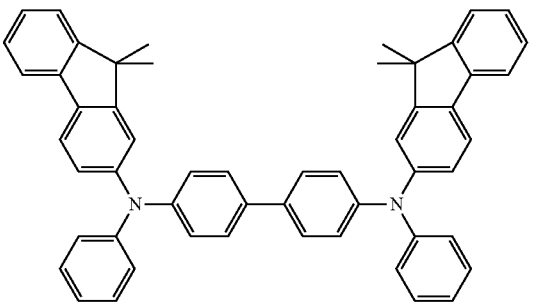

HT3

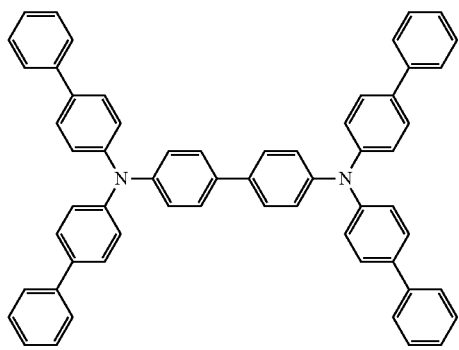

HT4

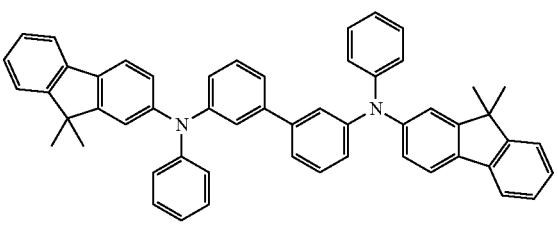

HT5

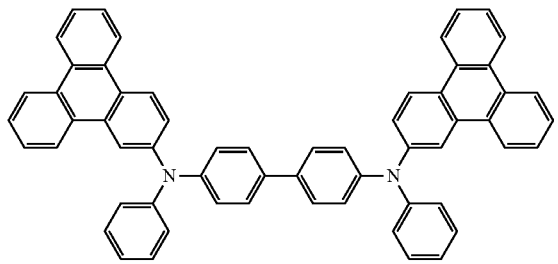

HT6

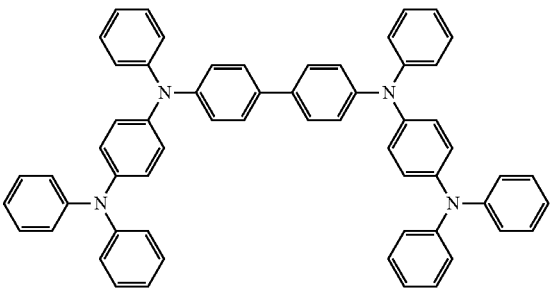

HT7
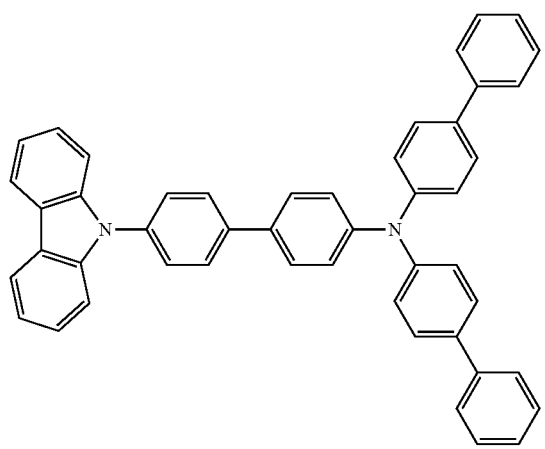
HT8
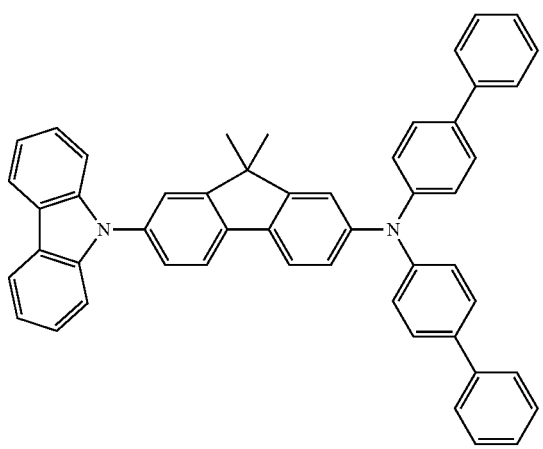
HT9
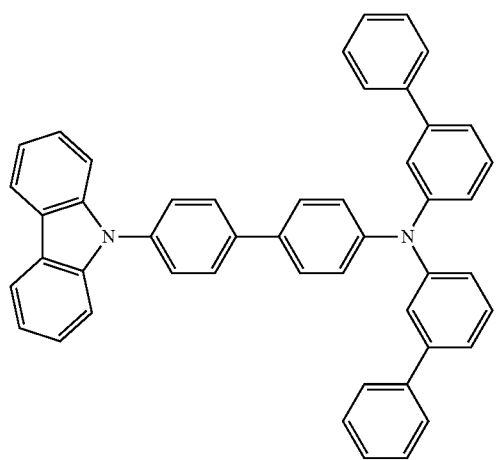
HT10
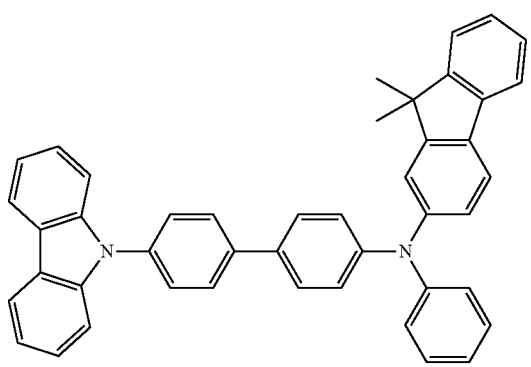
HT11
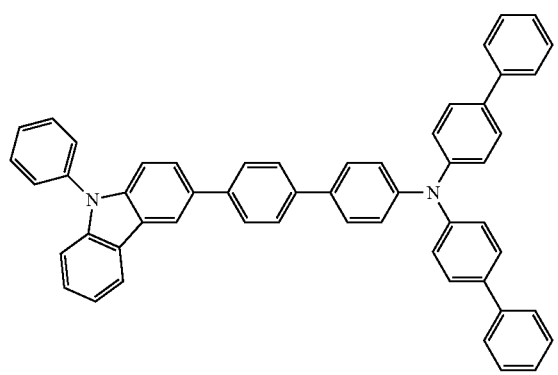
HT12
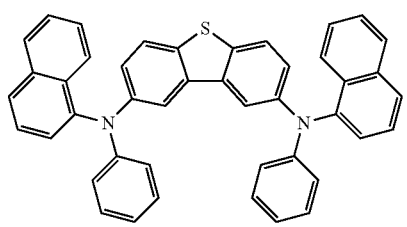

HT13

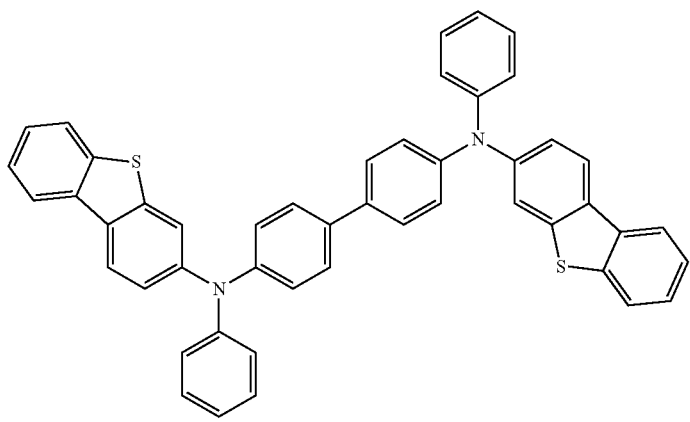

HT14

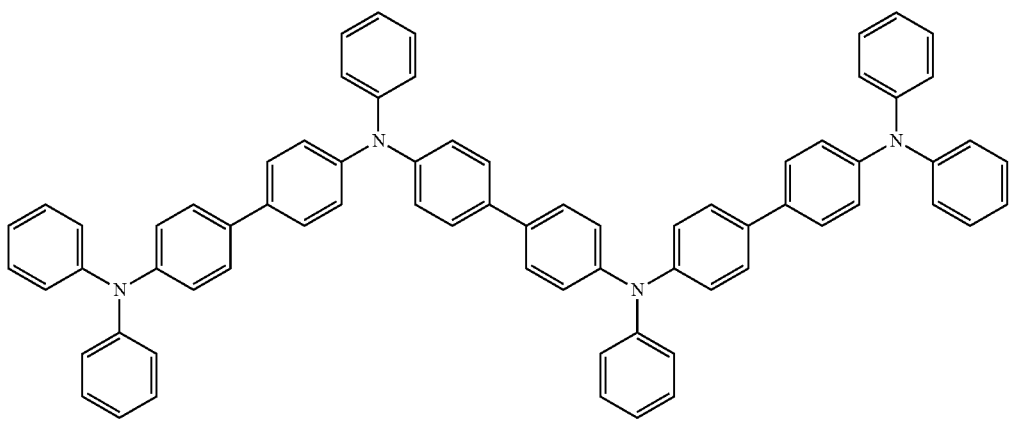

Examples of the light-emitting material mainly involved in a light-emitting function include: condensed ring compounds (such as a fluorene derivative, a naphthalene derivative, a pyrene derivative, a perylene derivative, a tetracene derivative, an anthracene derivative, and rubrene); a quinacridone derivative; a coumarin derivative; a stilbene derivative; an organic aluminum complex such as tris(8-quinolinolato)aluminum; a platinum complex; a rhenium complex; a copper complex; a europium complex; a ruthenium complex; and polymer derivatives such as a poly(phenylene vinylene) derivative, a poly(fluorene) derivative, and a poly(phenylene) derivative in addition to the iridium complex represented by the general formula [1] or a derivative thereof.

Specific examples of a compound to be used as the light-emitting material are shown below. However, the compound is of course not limited thereto.

BD1

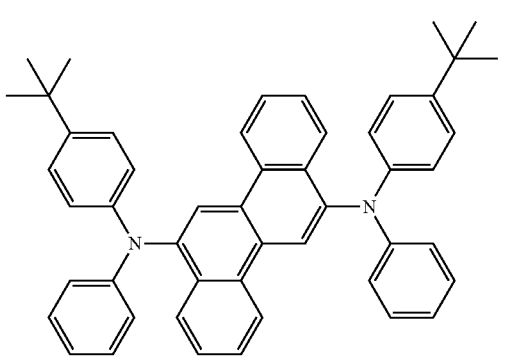

BD2
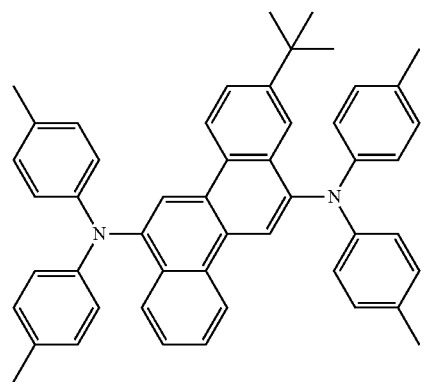
BD6
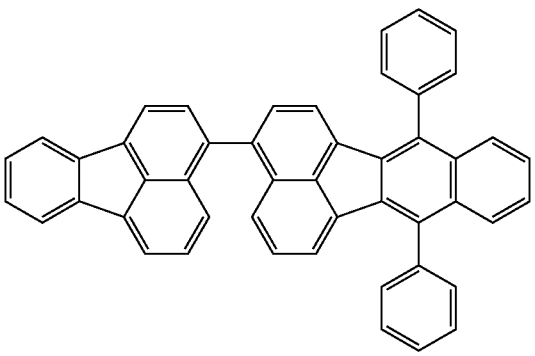
BD3
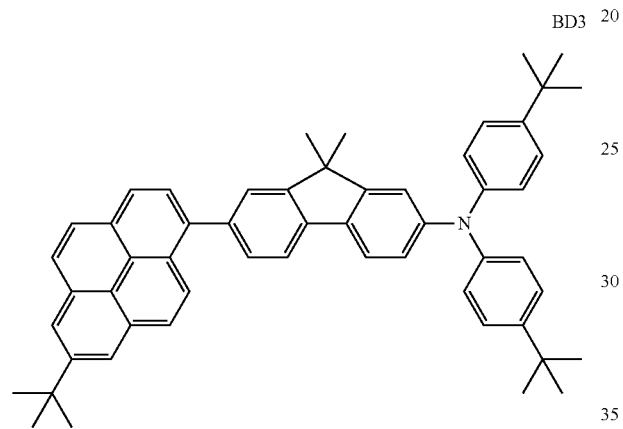
BD7
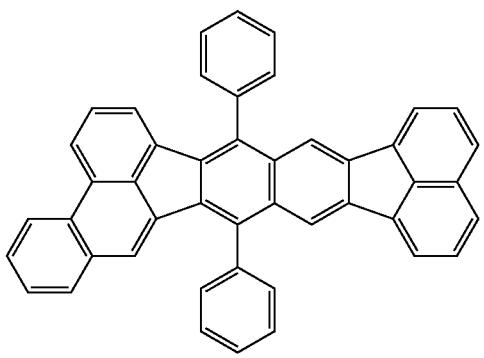
BD4
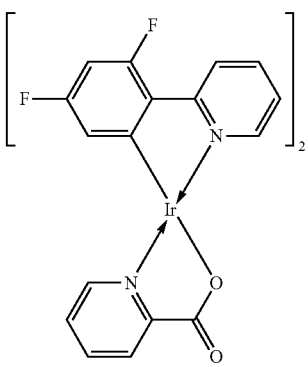
BD8
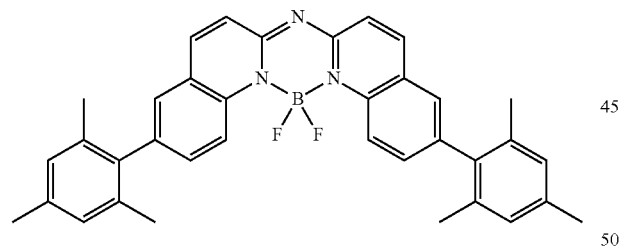
BD5
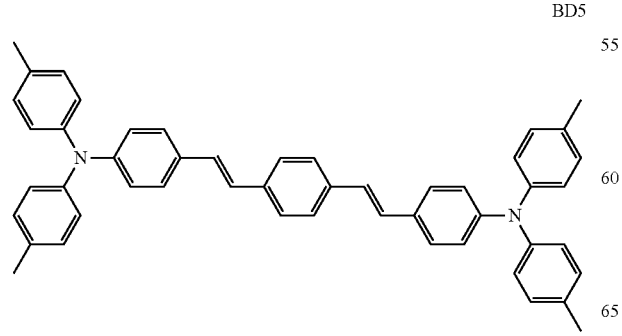
GD1
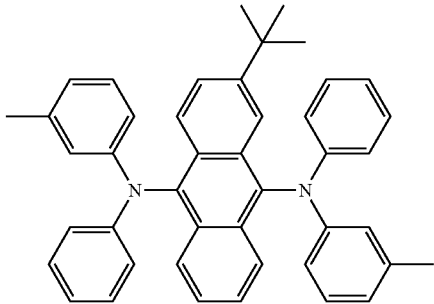

-continued
GD2
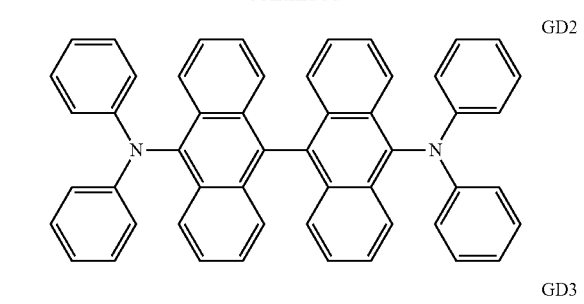
GD3
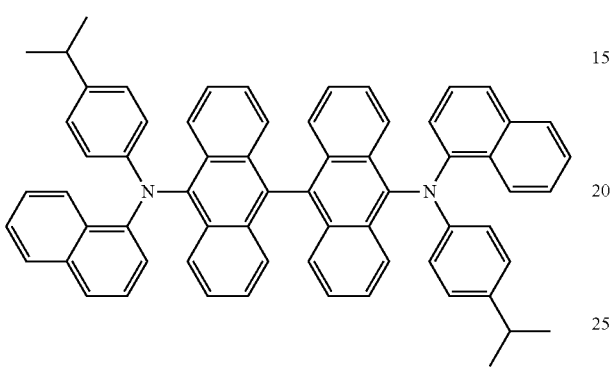
GD4
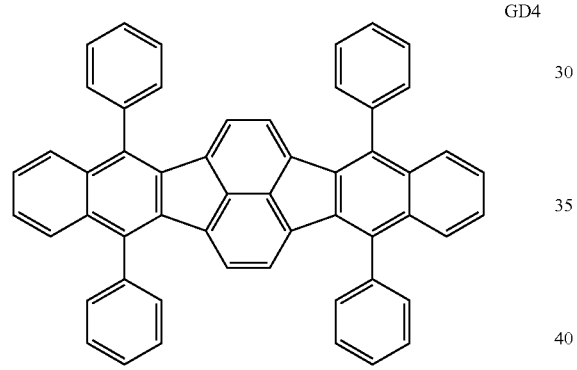
GD5
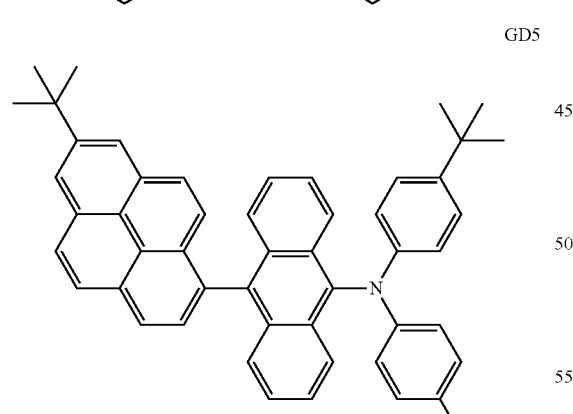
GD6
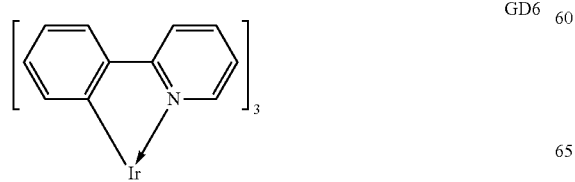
-continued
GD7
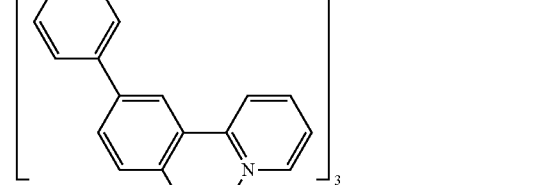
GD8
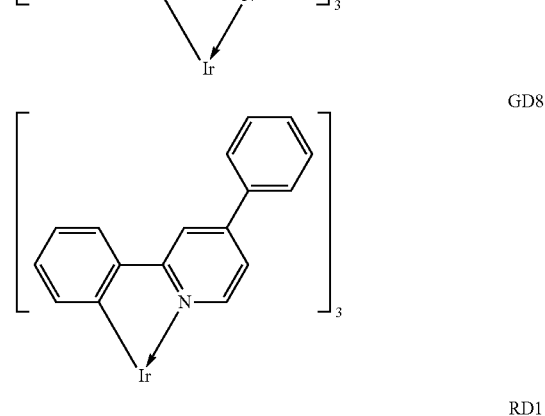
RD1
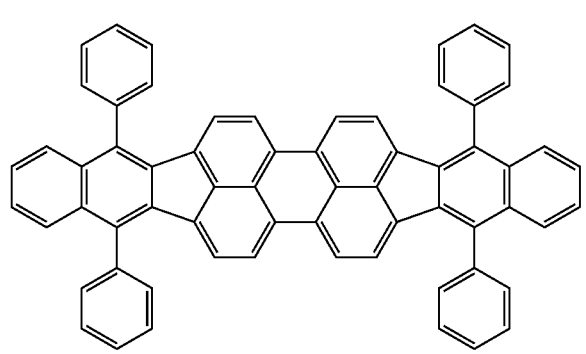
RD2
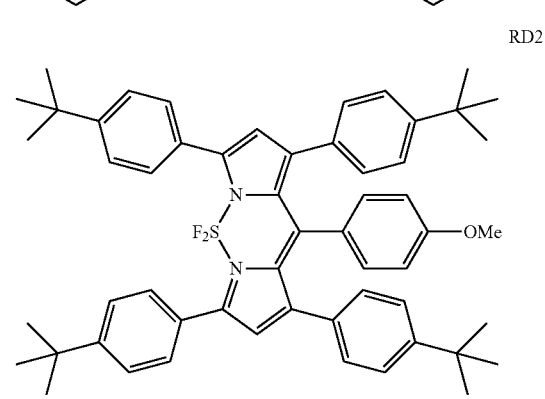
RD3
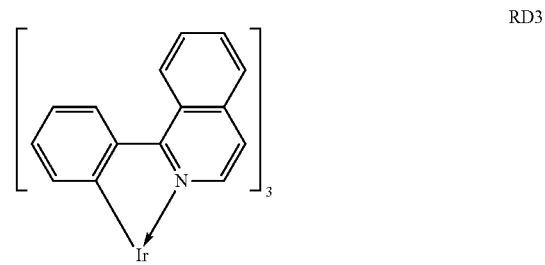

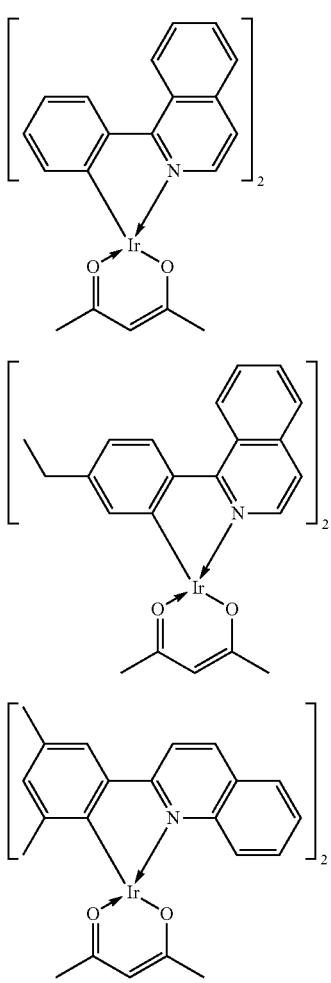

RD4

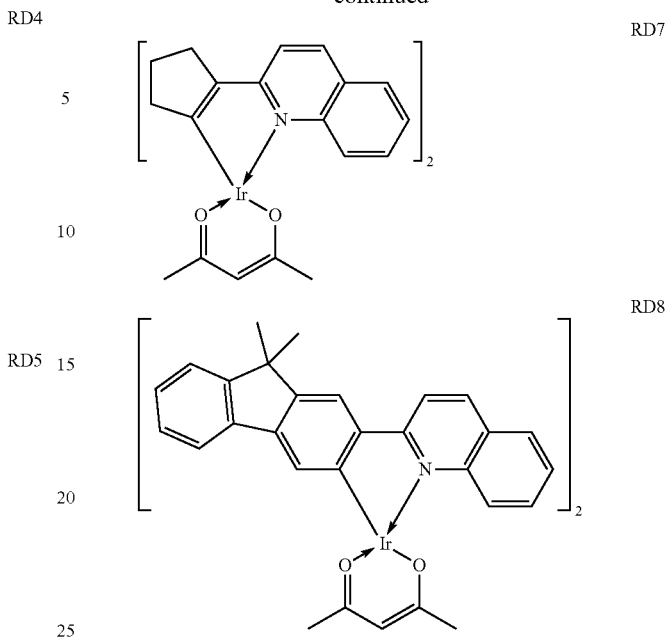

RD5

RD6

Examples of the host or assist material to be incorporated into the emission layer include: an aromatic hydrocarbon compound or a derivative thereof; a carbazole derivative; a dibenzofuran derivative; a dibenzothiophene derivative; an organic aluminum complex such as tris(8-quinolinolato) aluminum; and an organic beryllium complex in addition to the hydrocarbon compound represented by the general formula [5].

Specific examples of a compound to be used as the host or assist material to be incorporated into the emission layer are shown below. However, the compound is of course not limited thereto.

EM1

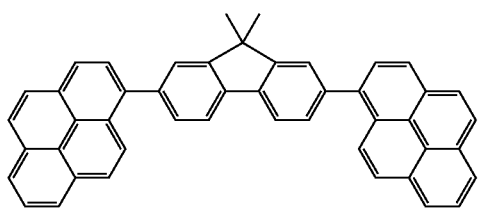

EM2

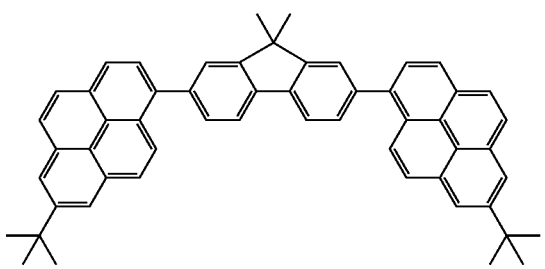

EM3

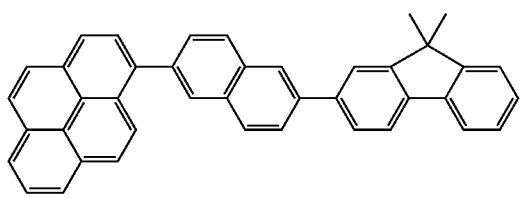

EM4

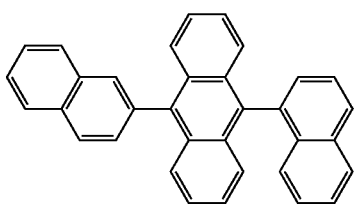

-continued
EM5
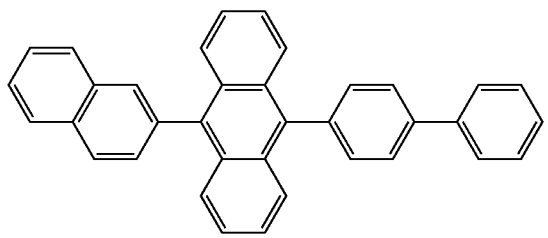
EM6
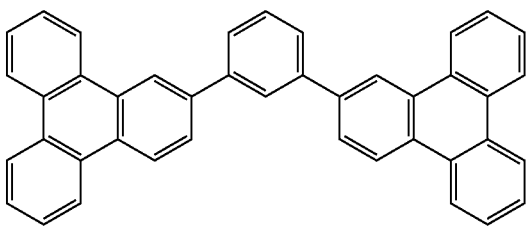
EM7
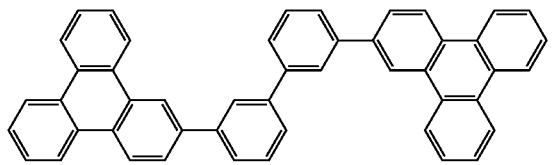
EM8
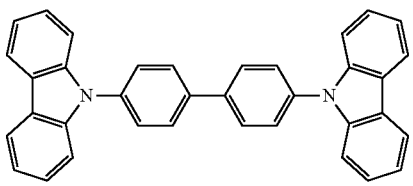
EM9
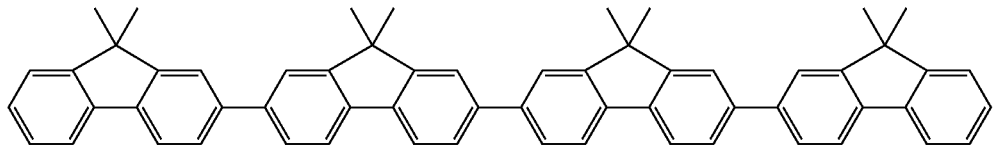
EM10
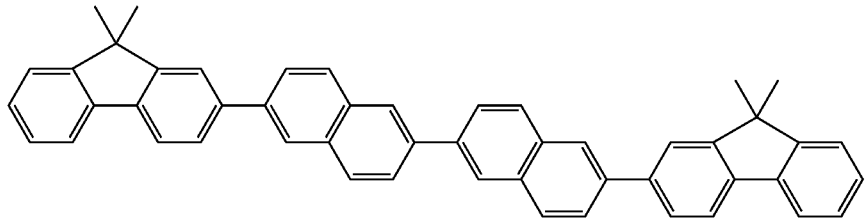
EM11
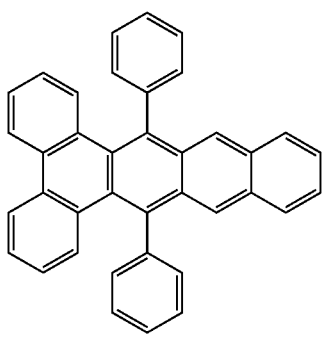
EM12
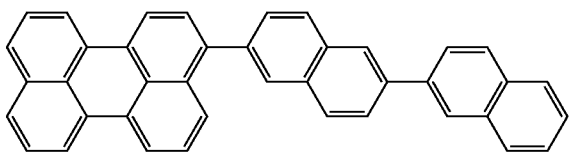
EM13
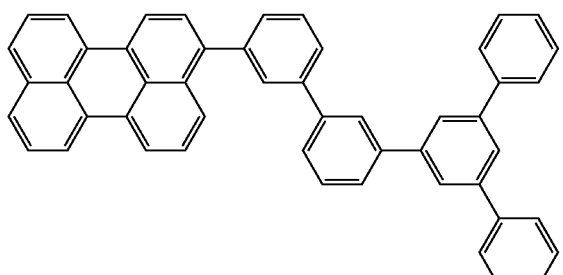
EM14
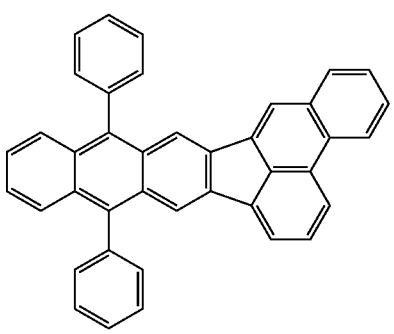

EM15

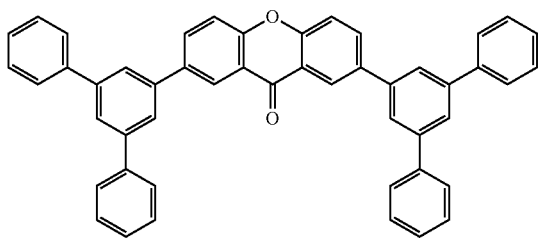

EM16

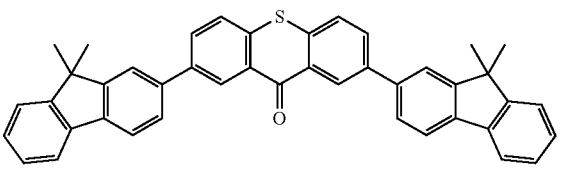

EM17

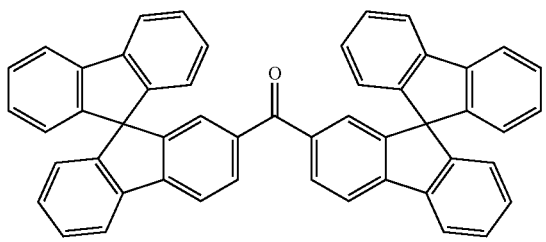

The electron-injecting/transporting material can be arbitrarily selected from materials that allow electrons to be easily injected from the cathode and can transport the injected electrons to the emission layer in consideration of, for example, the balance with the hole mobility of the hole-transporting material. Examples of the material having electron-injecting performance and electron-transporting performance include an oxadiazole derivative, an oxazole derivative, a pyrazine derivative, a triazole derivative, a triazine derivative, a quinoline derivative, a quinoxaline derivative, a phenanthroline derivative, and an organic aluminum complex. Further, the electron-injecting/transporting material is suitably used for the hole-blocking layer as well.

Specific examples of a compound to be used as the electron-injecting/transporting material are shown below. However, the compound is of course not limited thereto.

ET2

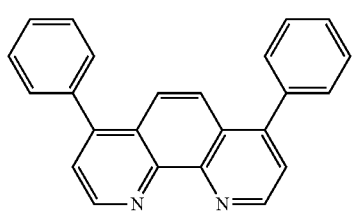

ET2

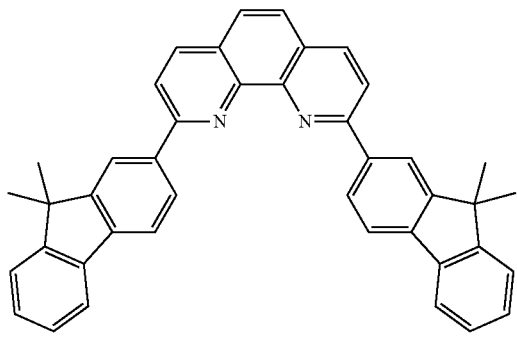

ET3

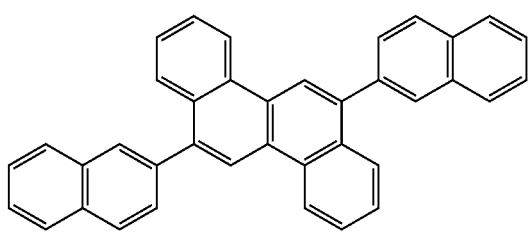

ET4

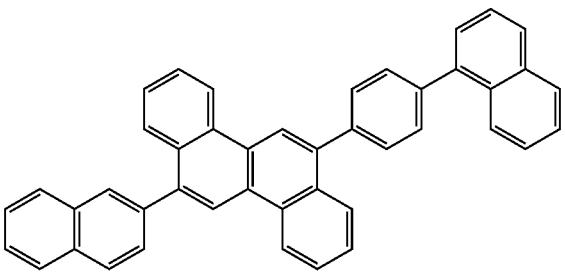

ET5

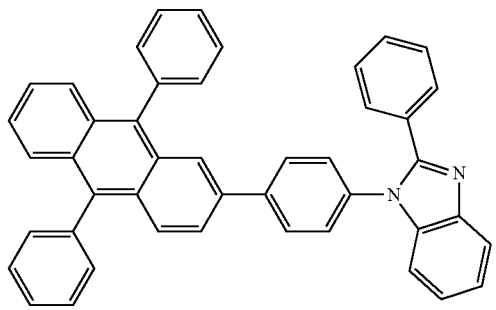

ET6

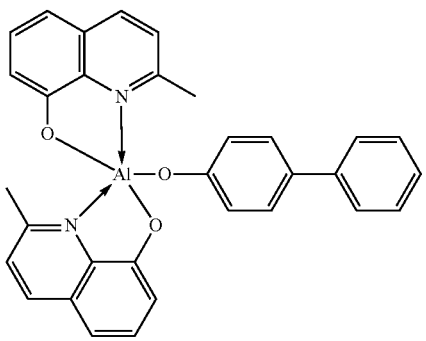

ET7

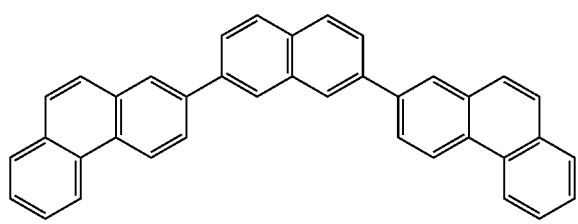

ET8

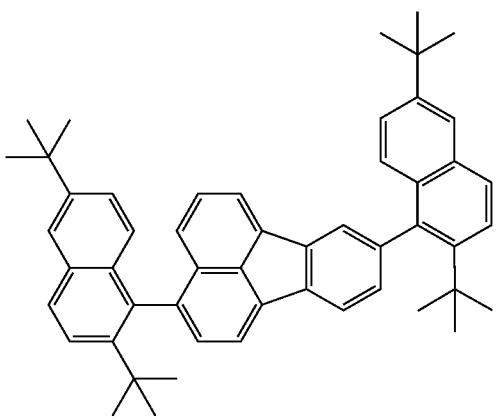

In addition, a mixture obtained by mixing the electron-injecting/transporting material and a compound of an alkali metal or an alkaline earth metal may be used as the electron-injecting/transporting material. Examples of the metal compound to be mixed with the electron-injecting/transporting material include LiF, KF, $Cs_2CO_3$, and CsF.

A constituent material for the anode desirably has as large a work function as possible. Examples thereof may include: metal simple substances such as gold, platinum, silver, copper, nickel, palladium, cobalt, selenium, vanadium, and tungsten or alloys obtained by combining these metal simple substances; metal oxides such as tin oxide, zinc oxide, indium oxide, indium tin oxide (ITO), and indium zinc oxide; and conductive polymers such as polyaniline, polypyrrole, and polythiophene.

One kind of those electrode substances may be used alone, or two or more kinds thereof may be used in combination. In addition, the anode may be of a single-layer construction or may be of a multilayer construction.

On the other hand, a constituent material for the cathode desirably has as small a work function as possible. Examples thereof include: alkali metals such as lithium; alkaline earth metals such as calcium; and metal simple substances such as aluminum, titanium, manganese, silver, lead, and chromium. Alternatively, alloys obtained by combining those metal simple substances can be used. For example, a magnesium-silver alloy, an aluminum-lithium alloy, or an aluminum-magnesium alloy can be used. A metal oxide such as indium tin oxide (ITO) can also be utilized. One kind of those electrode substances may be used alone, or two or more kinds thereof may be used in combination. In addition, the cathode may be of a single-layer construction or may be of a multilayer construction.

The organic compound layer (such as the hole-injecting layer, the hole-transporting layer, the electron-blocking layer, the emission layer, the hole-blocking layer, the electron-transporting layer, or the electron-injecting layer) for forming the organic light-emitting device of the present invention is formed by the following method.

A dry process such as a vacuum vapor deposition method, an ionized vapor deposition method, sputtering, or a plasma process can be used for the formation of the organic compound layer for forming the organic light-emitting device of the present invention. In addition, a wet process involving dissolving the constituent materials in an appropriate solvent and forming a layer by a known application method (such as spin coating, dipping, a casting method, an LB method, or an ink jet method) can be used instead of the dry process.

Here, when the layer is formed by the vacuum vapor deposition method, the solution application method, or the like, the layer hardly undergoes crystallization or the like and is excellent in stability over time. In addition, when the layer is formed by the application method, the film can be formed by using the constituent materials in combination with an appropriate binder resin.

Examples of the binder include, but not limited to, a polyvinyl carbazole resin, a polycarbonate resin, a polyester resin, an ABS resin, an acrylic resin, a polyimide resin, a phenol resin, an epoxy resin, a silicone resin, and a urea resin.

In addition, one kind of those binder resins may be used alone as a homopolymer or a copolymer, or two or more kinds thereof may be used as a mixture. Further, a known additive such as a plasticizer, an antioxidant, or a UV absorber may be used in combination as required.

(10) Application of Organic Light-Emitting Device of the Present Invention

The organic light-emitting device of the present invention can be used as a constituent member for a display apparatus or lighting apparatus. In addition, the device finds use in applications such as an exposure light source for an image-forming apparatus of an electrophotographic system, a backlight for a liquid crystal display apparatus, and a light-emitting apparatus including a white light source and a color filter. Examples of the color filter include filters that transmit light beams having three colors, i.e., red, green, and blue colors.

A display apparatus of the present invention includes the organic light-emitting device of the present invention in its display portion. It is to be noted that the display portion includes multiple pixels.

In addition, the pixels each have the organic light-emitting device of the present invention and a transistor as an example of an active device (switching device) or amplifying device for controlling emission luminance, and the anode or cathode of the organic light-emitting device and the drain electrode or source electrode of the transistor are electrically connected to each other. Here, the display apparatus can be used as an image display apparatus for a PC or the like. The transistor is, for example, a TFT device and the TFT device is provided on, for example, the insulating surface of a substrate.

The display apparatus may be an information processing apparatus that includes an image input portion for inputting image information from, for example, an area CCD, a linear CCD, or a memory card, and displays an input image on its display portion.

In addition, the display portion of an imaging apparatus or inkjet printer may have a touch panel function. The drive system of the touch panel function is not particularly limited.

In addition, the display apparatus may be used in the display portion of a multifunction printer.

A lighting apparatus is an apparatus for lighting, for example, the inside of a room. The lighting apparatus may emit light having any one of the following colors: a white color (having a color temperature of 4,200 K), a daylight color (having a color temperature of 5,000 K), and colors ranging from blue to red colors.

A lighting apparatus of the present invention includes the organic light-emitting device of the present invention and an AC/DC converter circuit (circuit for converting an AC voltage into a DC voltage) connected to the organic light-emitting device. It is to be noted that the lighting apparatus may further have a color filter.

An image-forming apparatus of the present invention is an image-forming apparatus including: a photosensitive member; charging means for charging the surface of the photosensitive member; exposing means for exposing the photosensitive member to form an electrostatic latent image; and a developing unit for developing the electrostatic latent image formed on the surface of the photosensitive member. Here, the exposing means to be provided in the image-forming apparatus includes the organic light-emitting device of the present invention.

In addition, the organic light-emitting device of the present invention can be used as a constituent member for an exposing apparatus for exposing a photosensitive member. An exposing apparatus including a plurality of the organic light-emitting devices of the present invention is, for example, an exposing apparatus in which the organic light-emitting devices of the present invention are disposed to form a line along a predetermined direction.

Figure 3:
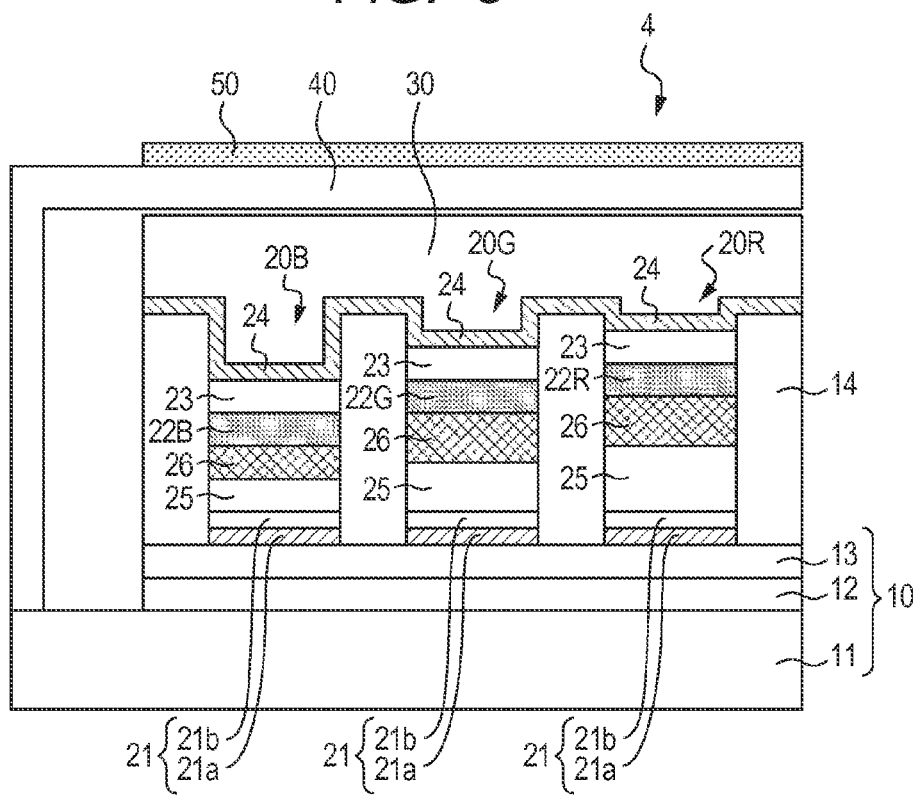
FIG. 3 is a schematic sectional view illustrating a display apparatus according to an embodiment of the present invention.

The display apparatus of the present invention is described below with reference to the drawings. FIG. 3 is a schematic sectional view illustrating a display apparatus according to an exemplary embodiment of the present invention.

The display apparatus 4 of FIG. 3 includes, on the substrate 10, three kinds of organic light-emitting devices, i.e., the organic red-light-emitting device 20R, the organic green-light-emitting device 20G, and the organic blue-light-emitting device 20B. In the display apparatus 4 of FIG. 3, the substrate 10 has the base material 11, the TFT driving circuit 12 provided on the base material 11, and the planarizing layer 13 provided on the TFT driving circuit 12 for filling irregularities produced by providing the TFT driving circuit 12. In the display apparatus 4 of FIG. 3, the TFT driving circuit 12 is a circuit provided for driving the respective organic light-emitting devices (20R, 20G, 20B) individually. In the present invention, a transistor constituting the TFT driving circuit 12 preferably includes an electrode formed of a transparent oxide semiconductor. In addition, the pixel separation film 14 for separating the respective organic light-emitting devices (20R, 20G, 20B) individually is provided on the substrate 10.

Each organic light-emitting device (20R, 20G, 20B) includes an emission layer (the red-light-emitting layer 22R, the green-light-emitting layer 22G, or the blue-light-emitting layer 22B) for outputting red, green, or blue light emission, and the entire layer construction of the device is the same as that of the organic light-emitting device of FIG. 1C. Although the cathode 24 in the display apparatus 4 of FIG. 3 is formed as a layer common to the respective organic light-emitting devices (20R, 20G, 20B), the present invention is not limited to this aspect. In addition, when each organic light-emitting device (20R, 20G, 20B) is an organic light-emitting device of a top emission type (a system in which light is extracted from a side opposite to the substrate 10), the anode 21 may be a laminated electrode formed of the reflecting electrode layer 21a and the transparent electrode layer 21b as illustrated in FIG. 3.

Each organic light-emitting device (20R, 20G, 20B) is encapsulated with the encapsulating film 30 provided on the cathode 24 and the encapsulating glass 40 bonded to the substrate 10 at the outer edge of the substrate 10. It is to be noted that in the display apparatus 4 of FIG. 3, the degree of polarization of light output from each organic light-emitting device (20R, 20G, 20B) may be regulated by providing the circularly polarizing plate 50 on the encapsulating glass 40.

EXAMPLES

Hereinafter, Examples of the present invention are described. However, the present invention is not limited to Examples below.

[Synthesis Example 1] (Synthesis of Ir-206)

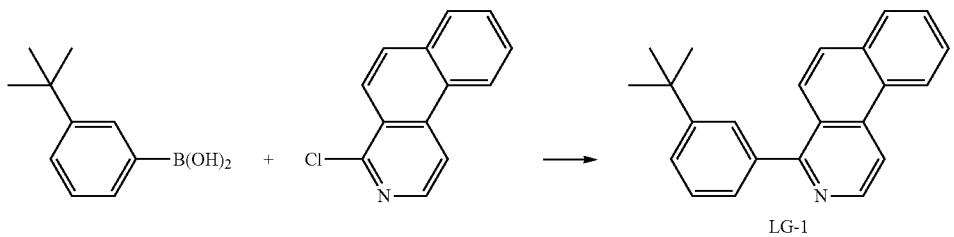

LG-1

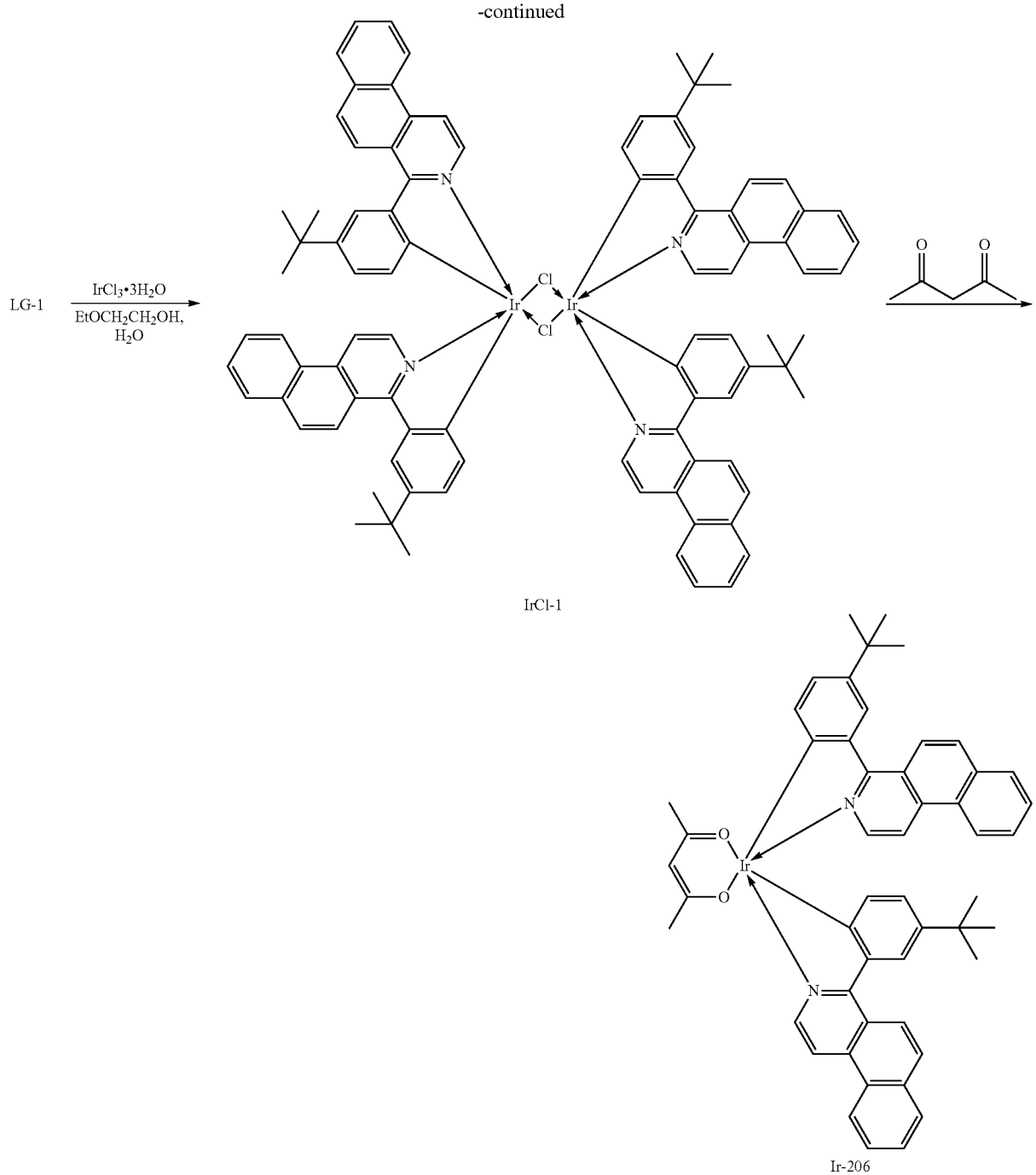

(1-1) Synthesis of Intermediate LG-1

Under an argon atmosphere, the following reagents and solvents were loaded into a 100-ml reaction vessel.
5-tert-Butylboronic acid: 1.95 g (11 mmol)
4-Chlorobenzo[f]isoquinoline: 1.13 g (10 mmol)
Pd(PPh$_3$)$_4$: 0.3 g (0.26 mmol)
Na$_2$CO$_3$: 2.5 g
Toluene (Toluene that had been subjected to degassing treatment was used): 25 ml
Ethanol: 10 ml
Distilled water: 25 ml Next, the reaction solution was heated to 80° C. with an oil bath. After that, the solution was stirred at the temperature (80° C.) for 6 hours. After the completion of the reaction, an organic layer was extracted from the reaction solution. Next, 0.5 g of sodium sulfate was added to the extracted organic layer to dehydrate the layer. After that, the dehydrated product was filtered and then concentrated under reduced pressure to provide a crude product. Next, the crude product was purified by silica gel column chromatography (developing solvent: chloroform) and then recrystallized to provide 2.5 g of Intermediate LG-1 as a white solid (yield: 76%).

(1-2) Synthesis of Ir-206

The following reagents and solvents were loaded into a 100-ml three-necked flask.
Iridium(III) trichloride trihydrate: 0.714 g (2 mmol)
Intermediate LG-1: 1.37 g (4.4 mmol)
Ethoxyethanol: 25 ml
Water: 5 ml Next, the reaction solution was stirred in a stream of nitrogen at room temperature for 30 minutes. Next, the reaction solution was heated to 100° C. and then stirred at the temperature (100° C.) for 8 hours. Next, a precipitate produced when the reaction solution was cooled to room temperature was collected by filtration. Next, the precipitate was sequentially washed with water and ethanol, and was then dried at room temperature under reduced pressure to provide 1.42 g of IrCl-1 as brownish red powder (yield: 80%).

Next, the following reagents and solvent were loaded into a 100-ml three-necked flask.
Ethoxyethanol: 30 ml
IrCl-1: 0.85 g (0.5 mmol)
Acetylacetone: 0.15 g (1.5 mmol)
Sodium carbonate: 0.21 g (2 mmol)

Next, the reaction solution was stirred in a stream of nitrogen at room temperature for 1 hour. Next, the reaction solution was heated to 120° C. and then stirred at the temperature (120° C.) for 6 hours. Next, a precipitate produced when the reaction solution was cooled with ice was collected by filtration. Next, the precipitate was sequentially washed with water and ethanol, and was then dissolved in chloroform. Next, a component insoluble in chloroform was separated by filtration by performing filtration on filter paper on which a thin film of alumina had been disposed. Next, the filtrate was concentrated under reduced pressure to provide a crude product. Next, the crude product was recrystallized with a chloroform-methanol mixed solvent to provide 0.69 g of Ir-206 as red powder (yield: 67%).

Ir-206 thus obtained was identified by $^1$H-NMR and MALDI-TOF-MS. At this time, an Avance-500 (trade name; manufactured by Bruker) was used in the $^1$H-NMR measurement and an Autoflex LRF (trade name; manufactured by Bruker) was used in the MALDI-TOF-MS measurement. Further, the PL spectrum of the resultant iridium complex in a toluene dilute solution having a concentration of $1\times10^{-5}$ M was measured with an F-4500 (trade name; manufactured by Hitachi, Ltd.) and its maximum emission peak wavelength $\lambda_{max}$ was measured (excitation wavelength: 510 nm).

The measurement results of MALDI-TOF-MS and the PL spectrum are shown below.
PL: ($\lambda_{max}$=) 614 nm
MS: measured value=912.56 (calculated value: 912.33)

[Synthesis Example 2] (Synthesis of Ir-105)

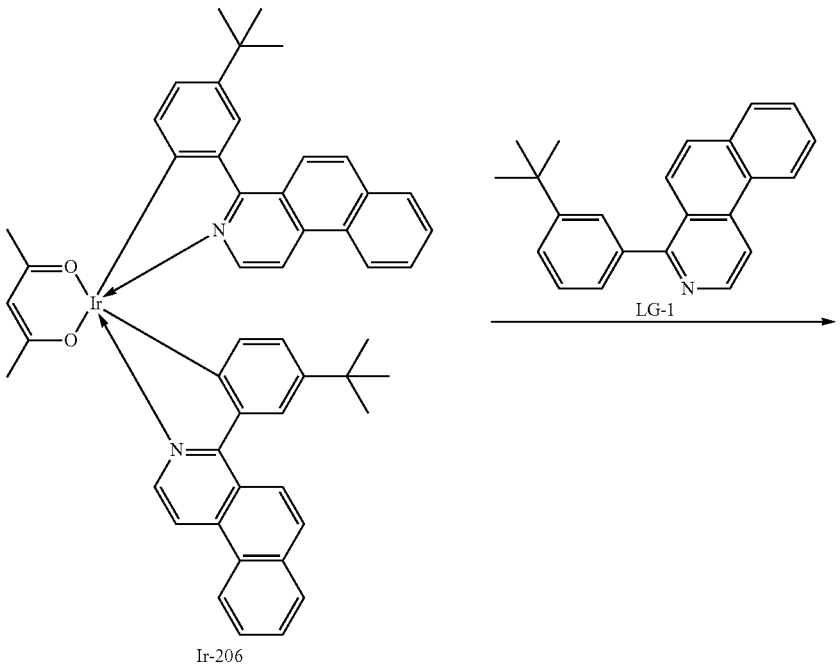

Ir-206

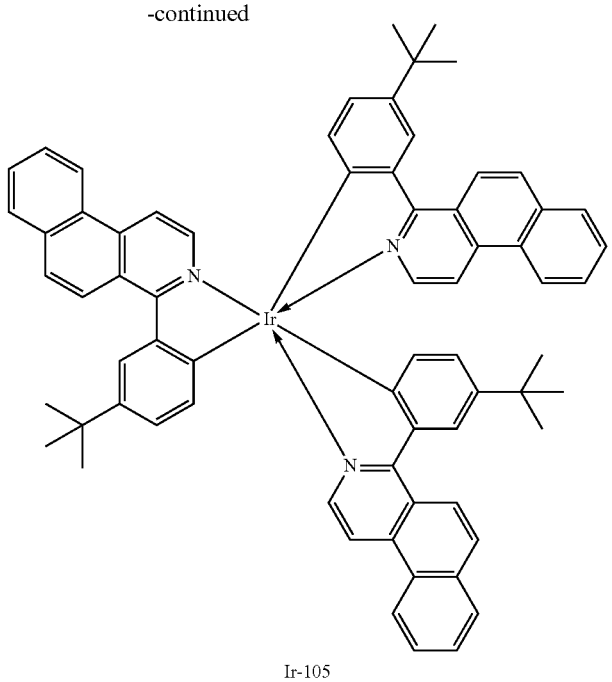

Ir-105

Ir-105 was synthesized from Ir-206 as a starting raw material through the utilization of a ligand exchange reaction between acac and LG-1.

The structure of Ir-105 thus obtained was confirmed by performing identification in the same manner as in the iridium complex obtained in Synthesis Example 1. In addition, its maximum emission peak wavelength was measured by PL spectrum measurement. The results are shown below.
PL: ($\lambda_{max}=$) 606 nm
MS: measured value=1124.94 (calculated value: 1123.44)

[Synthesis Example 3] (Synthesis of Ir-213)

Intermediate LG-2 represented below was obtained by the same method as that of the section (1-1) of Synthesis Example 1 except that in the section (1-1) of Synthesis Example 1, 5-methylboronic acid was used instead of 5-tert-butylboronic acid and 4-chloro-8-tert-butylbenzo[f]isoquinoline was used instead of 4-chlorobenzo[f]isoquinoline.

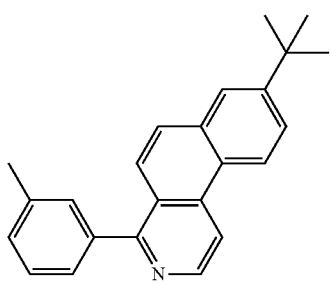

LG-2

Next, Ir-213 as an iridium complex was synthesized by the same method as that of the section (1-2) of Synthesis Example 1 except that in the section (1-2) of Synthesis Example 1, LG-2 was used instead of LG-1.

The structure of Ir-213 thus obtained was confirmed by performing identification in the same manner as in the iridium complex obtained in Synthesis Example 1. In addition, its maximum emission peak wavelength was measured by PL spectrum measurement. The results are shown below.
PL: ($\lambda_{max}=$) 614 nm
MS: measured value=940.85 (calculated value: 940.36)

[Synthesis Example 4] (Synthesis of Ir-301)

Intermediate LG-3 represented below was obtained by the same method as that of the section (1-1) of Synthesis Example 1 except that in the section (1-1) of Synthesis Example 1, 4-phenylboronic acid was used instead of 5-tert-butylboronic acid.

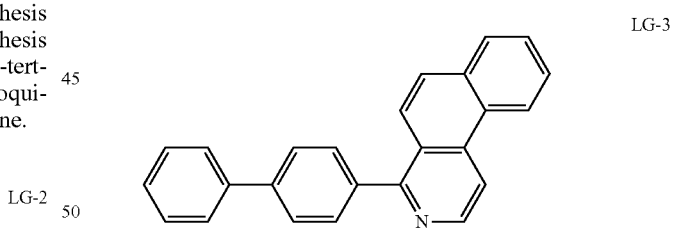

LG-3

Next, Ir-301 as an iridium complex was synthesized by the same method as that of the section (1-2) of Synthesis Example 1 except that in the section (1-2) of Synthesis Example 1, LG-3 was used instead of LG-1.

The structure of Ir-301 thus obtained was confirmed by performing identification in the same manner as in the iridium complex obtained in Synthesis Example 1. In addition, its maximum emission peak wavelength was measured by PL spectrum measurement. The results are shown below.
PL: ($\lambda_{max}=$) 615 nm
MS: measured value=952.52 (calculated value: 952.26)

[Synthesis Example 5] (Synthesis of Ir-316)

Ir-316 as an iridium complex was obtained by the same method as that of Synthesis Example 4 except that in Synthesis Example 4, 2,2,6,6-tetramethylheptane-3,5-dione was used instead of acetylacetone.

The structure of Ir-301 thus obtained was confirmed by performing identification in the same manner as in the iridium complex obtained in Synthesis Example 1. In addition, its maximum emission peak wavelength was measured by PL spectrum measurement. The results are shown below.
PL: $(\lambda_{max}=)$ 619 nm
MS: measured value=1036.61 (calculated value: 1036.36)

[Synthesis Example 6] (Synthesis of Ir-310)

Intermediate LG-4 represented below was obtained by the same method as that of the section (1-1) of Synthesis Example 1 except that in the section (1-1) of Synthesis Example 1,4-phenyl-5-methylboronic acid was used instead of 5-tert-butylboronic acid.

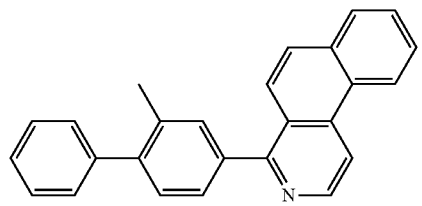

LG-4

Next, Ir-310 as an iridium complex was synthesized by the same method as that of the section (1-2) of Synthesis Example 1 except that in the section (1-2) of Synthesis Example 1, LG-4 was used instead of LG-1.

The structure of Ir-310 thus obtained was confirmed by performing identification in the same manner as in the iridium complex obtained in Synthesis Example 1. In addition, its maximum emission peak wavelength was measured by PL spectrum measurement. The results are shown below.
PL: $(\lambda_{max}=)$ 615 nm
MS: measured value=1064.24 (calculated value: 1065.40)

[Synthesis Example 7] (Synthesis of Ir-317)

Ir-317 as an iridium complex was synthesized by the same method as that of Synthesis Example 6 except that in Synthesis Example 6, 2,2,6,6-tetramethylheptane-3,5-dione was used instead of acetylacetone.

The structure of Ir-317 thus obtained was confirmed by performing identification in the same manner as in the iridium complex obtained in Synthesis Example 1. In addition, its maximum emission peak wavelength was measured by PL spectrum measurement. The results are shown below.
PL: $(\lambda_{max}=)$ 619 nm
MS: measured value=1065.24 (calculated value: 1064.39)

[Synthesis Example 8] (Synthesis of Ir-318)

Intermediate LG-5 represented below was obtained by the same method as that of the section (1-1) of Synthesis Example 1 except that in the section (1-1) of Synthesis Example 1, 4-phenylboronic acid was used instead of 5-tert-butylboronic acid and 4-chloro-8-tert-butylbenzo[f]isoquinoline was used instead of 4-chlorobenzo[f]isoquinoline.

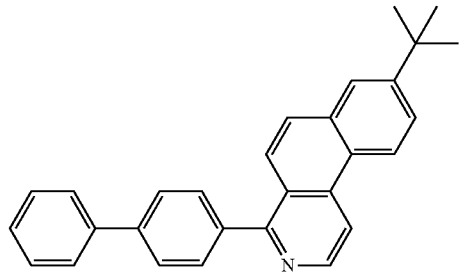

LG-5

Next, Ir-318 as an iridium complex was synthesized by the same method as that of the section (1-2) of Synthesis Example 1 except that in the section (1-2) of Synthesis Example 1, LG-5 was used instead of LG-1 and 2,2,6,6-tetramethylheptane-3,5-dione was used instead of acetylacetone.

The structure of Ir-318 thus obtained was confirmed by performing identification in the same manner as in the iridium complex obtained in Synthesis Example 1. In addition, its maximum emission peak wavelength was measured by PL spectrum measurement. The results are shown below.
PL: $(\lambda_{max}=)$ 616 nm
MS: measured value=1149.72 (calculated value: 1148.48)

[Synthesis Example 9] (Synthesis of Ir-405)

Intermediate LG-6 represented below was obtained by the same method as that of the section (1-1) of Synthesis Example 1 except that in the section (1-1) of Synthesis Example 1, 5-phenylboronic acid was used instead of 5-tert-butylboronic acid.

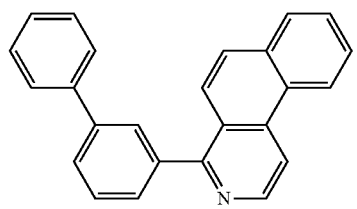

LG-6

Next, Ir-405 as an iridium complex was synthesized by the same method as that of the section (1-2) of Synthesis Example 1 except that in the section (1-2) of Synthesis Example 1, LG-6 was used instead of LG-1 and 2,2,6,6-tetramethylheptane-3,5-dione was used instead of acetylacetone.

The structure of Ir-405 thus obtained was confirmed by performing identification in the same manner as in the iridium complex obtained in Synthesis Example 1. In addition, its maximum emission peak wavelength was measured by PL spectrum measurement. The results are shown below.
PL: $(\Delta_{max}=)$ 616 nm
MS: measured value=1037.39 (calculated value: 1036.36)

[Synthesis Example 10] (Synthesis of Exemplified Compound Ir-515)

Ir-515 was synthesized according to the following synthesis scheme with reference to, for example, PTL 4.

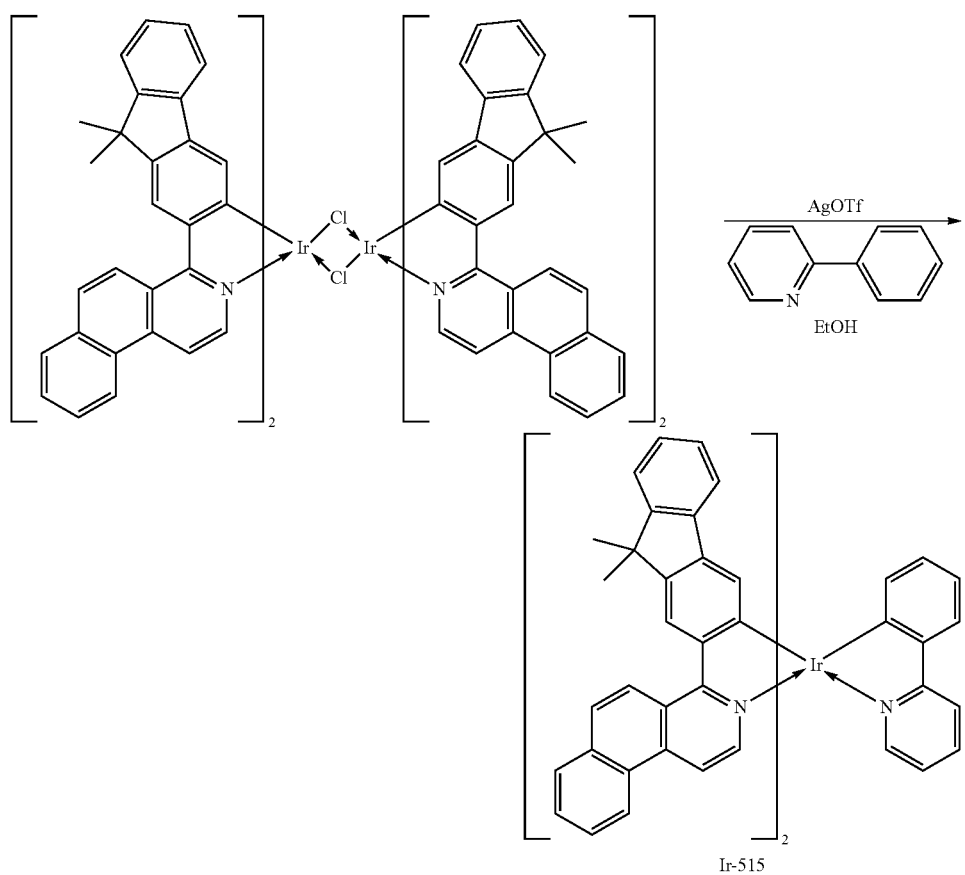

The structure of Ir-515 thus obtained was confirmed by performing identification in the same manner as in the iridium complex obtained in Synthesis Example 1. In addition, its maximum emission peak wavelength was measured by PL spectrum measurement. The results are shown below.

PL: ($\lambda_{max}$=) 623 nm
MS: measured value=1087.34 (calculated value: 1087.35)

[Synthesis Example 11] (Synthesis of Compound H-105)

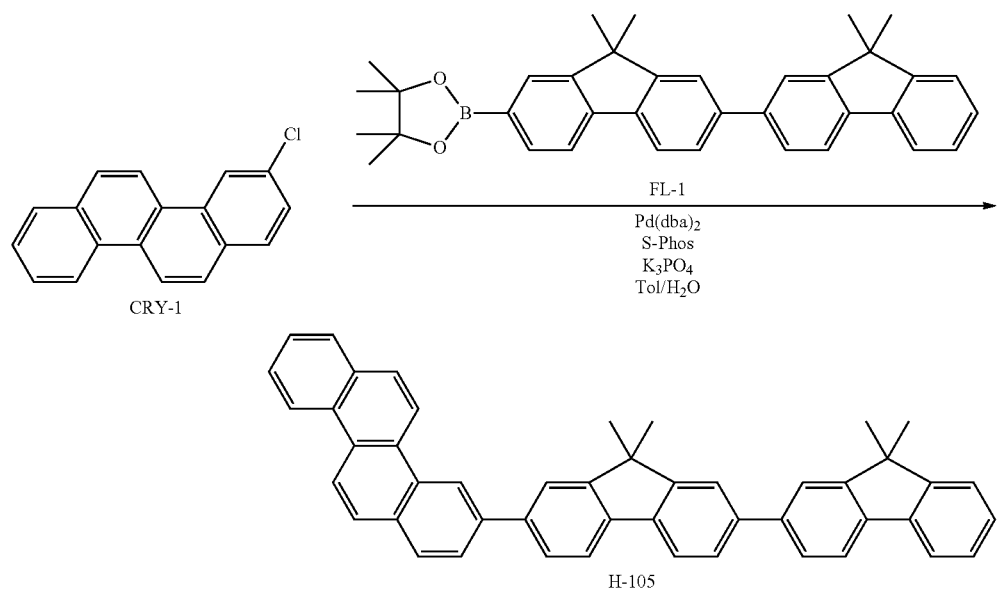

The following reagents and solvent were loaded into a 100-mL recovery flask.
3-Chlorochrysene (CRY-1): 525 mg (2.00 mmol)
Boronic acid compound (FL-1): 1,017 mg (2.00 mmol)
Palladium(II) acetate: 18 mg (80 μmol)
Dicyclohexyl(2',6'-dimethoxybiphenyl-2-yl)phosphine: 80 mg (194 μmol)
Potassium phosphate: 1.06 g (5.00 mmol)
Toluene: 50 mL Next, the reaction solution was refluxed by heating for 8 hours while being stirred. After the completion of the reaction, water was added to the resultant, a liquid-separating operation was performed, and an organic layer was recovered. After that, the organic layer was dried. Next, the organic layer was concentrated under reduced pressure to provide a crude product. After that, the crude product was purified by employing silica gel column chromatography (developing solvent: heptane/toluene=4/1). Next, the purified product was recrystallized with a toluene/ethanol mixed solvent and then the resultant crystal was vacuum-dried at 150° C. Next, sublimation purification was performed to provide 830 mg of Exemplified Compound H-105 (yield: 68%). The resultant compound was evaluated for its purity by employing HPLC. As a result, it was confirmed that the purity was 99% or more.

The resultant compound was identified by matrix-assisted laser desorption/ionization time-of-flight mass spectrometry (MALDI-TOF-MS) with an Autoflex LRF (trade name; manufactured by Bruker). The result is shown below.
MS: measured value=612.88 (calculated value=612.28)

The following reagents and solvent were loaded into a 100-mL recovery flask.
3-Chlorochrysene (CRY-1): 578 mg (2.2 mmol)
Boronic acid compound (NP-1): 380 mg (1.0 mmol)
Palladium(II) acetate: 18 mg (80 μmol)
Dicyclohexyl(2',6'-dimethoxybiphenyl-2-yl)phosphine: 80 mg (194 μmol)
Potassium phosphate: 1.06 g (5.00 mmol)
Toluene: 50 mL Next, the reaction solution was refluxed by heating for 8 hours while being stirred. After the completion of the reaction, water was added to the resultant, a liquid-separating operation was performed, and an organic layer was recovered. After that, the organic layer was dried. Next, the organic layer was concentrated under reduced pressure to provide a crude product. After that, the crude product was purified by employing silica gel column chromatography (developing solvent: heptane/toluene=4/1). Next, the purified product was recrystallized with a toluene/ethanol mixed solvent and then the resultant crystal was vacuum-dried at 150° C. Next, sublimation purification was performed to provide 337 mg of Exemplified Compound D-102 (yield: 58%). The resultant compound was evaluated for its purity by employing HPLC. As a result, it was confirmed that the purity was 99% or more.

The resultant compound was identified by the same method as that of Synthesis Example 11. The result is shown below.
MS: measured value=580.43 (calculated value=580.22)

[Synthesis Example 13] (Synthesis of Compound F-101)

F-101 was obtained by the same method as that of Synthesis Example 11 except that in Synthesis Example 11, 3-chlorophenanthrene was used instead of 3-chlorochrysene and FL-2 represented below was used instead of FL-1.

[Synthesis Example 12] (Synthesis of D-102)

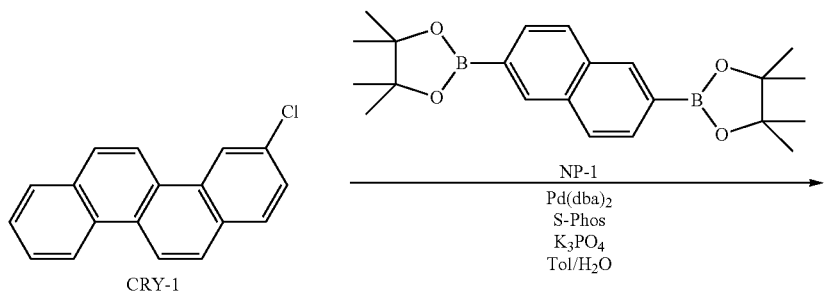

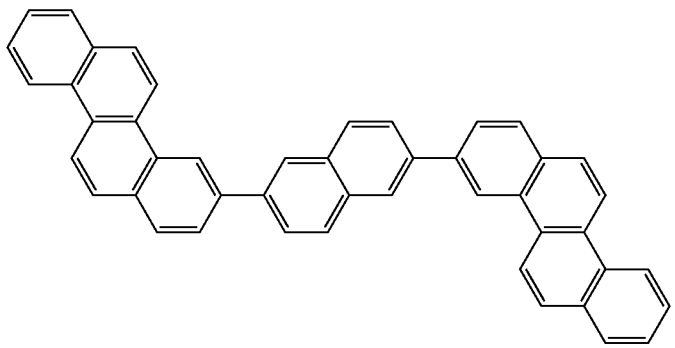

D-102

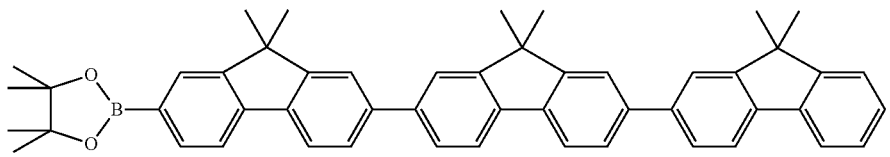

FL-2

The resultant compound was identified by the same method as that of Synthesis Example 11. The result is shown below.

MS: measured value=754.39 (calculated value=755.00)

[Synthesis Example 14] (Synthesis of Compound H-102)

H-102 was obtained by the same method as that of Synthesis Example 11 except that in Synthesis Example 11, 3-chlorophenanthrene was used instead of 3-chlorochrysene.

[Synthesis Example 15] (Synthesis of Compound L-104)

L-104 was obtained by the same method as that of Example 11 except that in Synthesis Example 11, NPTRP-1 represented below was used instead of FL-1.

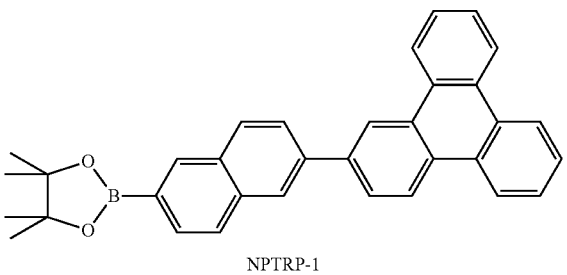 [SMILES: CC1(C)OB(c2ccc3cc(-c4ccc5c6ccccc6c6ccccc6c5c4)ccc3c2)OC1(C)C]

NPTRP-1

The resultant compound was identified by the same method as that of Synthesis Example 11. The result is shown below.

MS: measured value=580.13 (calculated value=580.22)

[Synthesis Example 16] (Synthesis of Compound L-105)

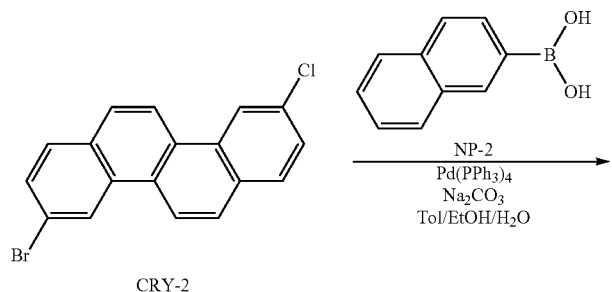

CRY-2

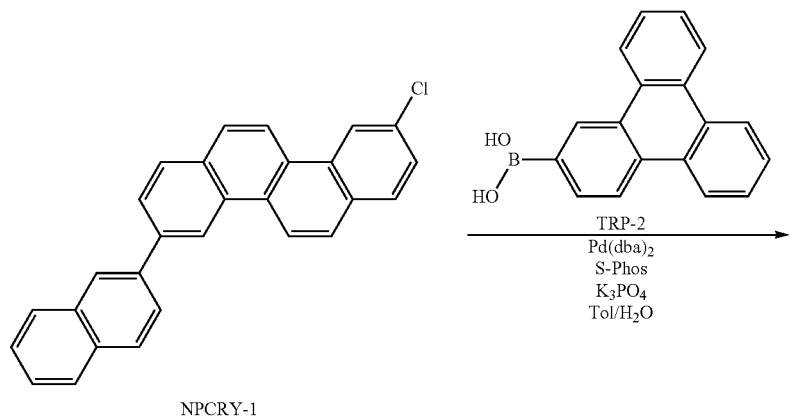

NPCRY-1

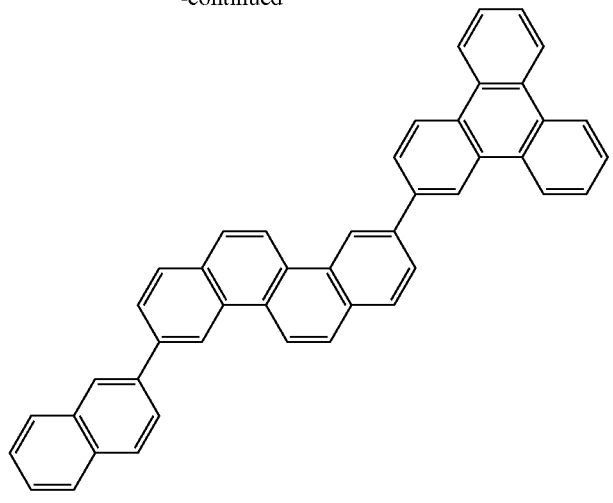

L-105

(16-1) Synthesis of Intermediate NPCRY-1

The following reagents and solvents were loaded into a 100-mL three-necked flask.
CRY-2: 1.23 g (3.0 mmol)
NP-2: 0.53 g (3.1 mmol)
Tetrakis(triphenylphosphine)palladium(0): 0.1 g (0.08 mmol)
Toluene: 10 mL
Ethanol: 5 mL
10 wt % aqueous solution of sodium carbonate: 5 mL Next, the reaction solution was refluxed by heating for 5 hours while being stirred under nitrogen. After the completion of the reaction, the reaction solution was washed with water, dried over sodium sulfate, and then concentrated under reduced pressure to provide a crude product. Next, the crude product was purified by silica gel column chromatography (developing solvent: toluene/heptane=2/1) to provide 0.99 g (yield: 85%) of Intermediate NPCRY-1.

(16-2) Synthesis of Exemplified Compound L-105

The following reagents and solvent were loaded into a 100-mL recovery flask.
Intermediate NPCRY-1: 389 mg (1.0 mmol)
Boronic acid compound TRP-2: 272 mg (1.0 mmol)
Palladium(II) acetate: 18 mg (80 µmol)
Dicyclohexyl(2',6'-dimethoxybiphenyl-2-yl)phosphine: 80 mg (194 µmol)
Potassium phosphate: 0.53 g (2.5 mmol)
Toluene: 10 mL Next, the reaction solution was refluxed by heating for 8 hours while being stirred under nitrogen. After the completion of the reaction, water was added to the reaction solution, a liquid-separating operation was performed, and an organic layer was recovered. After that, the organic layer was dried. Next, the organic layer was concentrated under reduced pressure to provide a crude product. After that, the crude product was purified by silica gel column chromatography (developing solvent: heptane/toluene=4/1). After that, the purified product was recrystallized with a toluene/ethanol mixed solvent and then the resultant crystal was vacuum-dried at 150° C. After that, sublimation purification was performed to provide 458 mg of Exemplified Compound L-105 (yield: 79%). The resultant compound was evaluated for its purity by employing HPLC. As a result, it was confirmed that the purity was 99% or more.

The resultant compound was identified by the same method as that of Synthesis Example 11. The result is shown below.

MS: measured value=580.01 (calculated value=580.22)

[Synthesis Example 17] (Synthesis of Compound J-105)

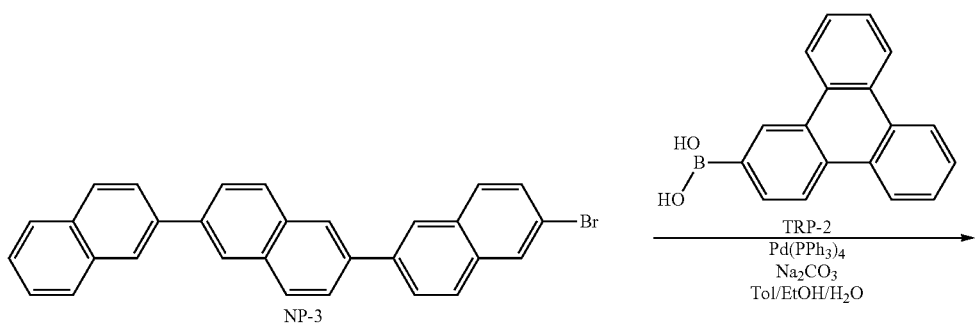

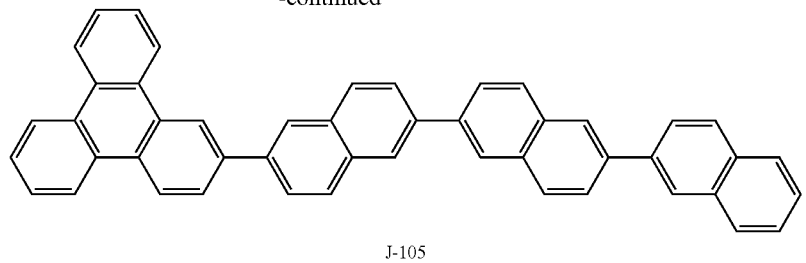

J-105

J-105 was obtained by the same method as that of Synthesis Example 16 except that in Synthesis Example 16, NP-3 was used instead of CRY-2 and TRP-2 was used instead of NP-2. The result of the identification of the resultant compound is shown below.

The resultant compound was identified by the same method as that of Synthesis Example 11. The result is shown below.

MS: measured value=606.88 (calculated value=606.23)

Example 1

In this example, an organic light-emitting device (anode/hole-injecting layer/hole-transporting layer/emission layer/hole/exciton-blocking layer/electron-transporting layer/cathode) described as the fifth example of the multilayer-type organic light-emitting device was produced.

First, ITO was formed into a film on a glass substrate and then subjected to desired patterning processing by photolithography to form an ITO electrode (anode). At this time, the thickness of the ITO electrode was set to 100 nm. The substrate on which the ITO electrode had been thus formed was used as an ITO substrate in the following steps.

Organic compound layers and electrode layers shown in Table 2 below were continuously formed on the ITO substrate. It is to be noted that a vacuum vapor deposition method based on resistance heating in a vacuum chamber having a pressure condition of $1 \times 10^{-5}$ Pa was adopted as a film-forming method. In addition, the electrode area of the opposing electrode (metal electrode layers, cathode) was set to 3 mm².

TABLE 2

| | Material | Thickness [nm] |
|---|---|---|
| Hole-injecting layer | HT-1 | 50 |
| Hole-transporting layer | HT-8 | 10 |
| Emission layer | H-103 (host) Ir-105 (guest) (H-103:Ir-105 = 95:5 (weight ratio)) | 30 |
| Hole/exciton-blocking layer | ET-3 | 10 |
| Electron-transporting layer | ET-2 | 50 |
| First metal electrode layer | LiF | 0.5 |
| Second metal electrode layer | Al | 100 |

Next, the produced device was encapsulated with a glass cap with a moisture absorbent in an inert atmosphere to provide an organic light-emitting device.

The current-voltage characteristics of the resultant organic light-emitting device were measured with an ammeter 2700 (trade name; manufactured by Keithley Instruments, Inc.) and its emission luminance was measured with a BM7-Fast (trade name; manufactured by TOPCON CORPORATION). Table 3 shows the results.

Example 2

An organic light-emitting device was produced by the same method as that of Example 1 except that in Example 1, the host and the guest were changed to B-105 and Ir-301, respectively. The current-voltage characteristics and emission luminance of the resultant organic light-emitting device were measured in the same manner as in Example 1. Table 3 shows the results.

Example 3

An organic light-emitting device was produced by the same method as that of Example 1 except that in Example 1, the host and the guest were changed to D-102 and Ir-317, respectively. The current-voltage characteristics and emission luminance of the resultant organic light-emitting device were measured in the same manner as in Example 1. Table 3 shows the results.

Example 4

An organic light-emitting device was produced by the same method as that of Example 1 except that in Example 1, the host and the guest were changed to F-101 and Ir-206, respectively. The current-voltage characteristics and emission luminance of the resultant organic light-emitting device were measured in the same manner as in Example 1. Table 3 shows the results.

Example 5

An organic light-emitting device was produced by the same method as that of Example 1 except that in Example 1, the host and the guest were changed to H-102 and Ir-405, respectively. The current-voltage characteristics and emission luminance of the resultant organic light-emitting device were measured in the same manner as in Example 1. Table 3 shows the results.

Example 6

An organic EL device was produced by the same method as that of Example 1 except that in Example 1, the host was changed to J-105. The current-voltage characteristics and emission luminance of the resultant organic light-emitting device were measured in the same manner as in Example 1. Table 3 shows the results.

Example 7

An organic light-emitting device was produced by the same method as that of Example 1 except that in Example 1, the host was changed to K-104. The current-voltage characteristics and emission luminance of the resultant organic light-emitting device were measured in the same manner as in Example 1. Table 3 shows the results.

Example 8

An organic light-emitting device was produced by the same method as that of Example 1 except that in Example 1, the host and the guest were changed to L-104 and Ir-213, respectively. The current-voltage characteristics and emission luminance of the resultant organic light-emitting device were measured in the same manner as in Example 1. Table 3 shows the results.

Example 9

An organic light-emitting device was produced by the same method as that of Example 1 except that in Example 1, the host was changed to L-105. The current-voltage characteristics and emission luminance of the resultant organic light-emitting device were measured in the same manner as in Example 1. Table 3 shows the results.

Example 10

An organic EL device was produced by the same method as that of Example 1 except that in Example 1, the host and the guest were changed to H-103 and Ir-515, respectively. The current-voltage characteristics and emission luminance of the resultant organic light-emitting device were measured in the same manner as in Example 1. Table 3 shows the results.

Example 11

An organic light-emitting device was produced by the same method as that of Example 1 except that in Example 1, H-103 (host), Ir-206 (guest), and M-103 (third component) were used in the formation of the emission layer, and the emission layer was formed so that a weight ratio among the three components "H-103:Ir-206:M-103" became 75:5:20. The current-voltage characteristics and emission luminance of the resultant organic light-emitting device were measured in the same manner as in Example 1. Table 3 shows the results.

Example 12

An organic light-emitting device was produced by the same method as that of Example 1 except that in Example 1, L-104 (host), Ir-316 (guest), and M-105 (third component) were used in the formation of the emission layer, and the emission layer was formed so that a weight ratio among the three components "L-104:Ir-316:M-105" became 75:5:20. The current-voltage characteristics and emission luminance of the resultant organic light-emitting device were measured in the same manner as in Example 1. Table 3 shows the results.

Example 13

An organic light-emitting device was produced by the same method as that of Example 1 except that in Example 1, L-104 (host), Ir-318 (guest), and N-105 (third component) were used in the formation of the emission layer, and the emission layer was formed so that a weight ratio among the three components "L-104:Ir-318:N-105" became 75:5:20. The current-voltage characteristics and emission luminance of the resultant organic light-emitting device were measured in the same manner as in Example 1. Table 3 shows the results.

Example 14

An organic light-emitting device was produced by the same method as that of Example 1 except that in Example 1, L-105 (host), Ir-318 (guest), and O-101 (third component) were used in the formation of the emission layer, and the emission layer was formed so that a weight ratio among the three components "L-105:Ir-318:O-101" became 75:5:20. The current-voltage characteristics and emission luminance of the resultant organic light-emitting device were measured in the same manner as in Example 1. Table 3 shows the results.

Comparative Example 1

An organic light-emitting device was produced by the same method as that of Example 1 except that in Example 1, 4,4'-di(9H-carbazol-9-yl)-1,1'-biphenyl (CBP) was used instead of H-103 as the host. The current-voltage characteristics and emission luminance of the resultant organic light-emitting device were measured in the same manner as in Example 1. Table 3 shows the results.

Comparative Example 2

An organic EL device was produced by the same method as that of Example 2 except that in Example 2, 2,2':6',2":6",2'''-quaternaphthalene (NP4) was used instead of B-105 as the host. The current-voltage characteristics and emission luminance of the resultant organic light-emitting device were measured in the same manner as in Example 1. Table 3 shows the results.

TABLE 3

| | Host | Guest | Third component | Emission efficiency (cd/A) | Luminance half-life [h] |
|---|---|---|---|---|---|
| Example 1 | H-103 | Ir-103 | — | 28 | 250 |
| Example 2 | B-105 | Ir-301 | — | 20 | 400 |
| Example 3 | D-102 | Ir-317 | — | 22 | 300 |
| Example 4 | F-101 | Ir-206 | — | 30 | 200 |
| Example 5 | H-102 | Ir-405 | — | 33 | 150 |
| Example 6 | J-105 | Ir-301 | — | 20 | 650 |
| Example 7 | K-104 | Ir-301 | — | 20 | 120 |
| Example 8 | L-104 | Ir-213 | — | 24 | 750 |
| Example 9 | L-105 | Ir-301 | — | 23 | 550 |
| Example 10 | H-103 | Ir-515 | — | 23 | 200 |
| Example 11 | H-103 | Ir-206 | M-103 | 31 | 300 |
| Example 12 | L-104 | Ir-316 | M-105 | 26 | 800 |
| Example 13 | L-104 | Ir-206 | N-105 | 24 | 380 |
| Example 14 | L-105 | Ir-318 | O-101 | 26 | 800 |
| Comparative Example 1 | CBP | Ir-316 | — | 20 | 40 |
| Comparative Example 2 | NP4 | Ir-317 | — | 19 | 50 |

The organic light-emitting devices of Examples have been improved in emission efficiency and luminance half-life as compared with the organic light-emitting devices of Comparative Examples. This may result from the fact that the compound incorporated as the host into the emission layer is formed only of a hydrocarbon and the fact that the structure of the compound serving as the host is not linear.

Further, in each of Examples 11 to 14, the emission efficiency or the luminance half-life has been additionally improved by further incorporating the material except the host and the guest (third component) into the emission layer. This may result from the fact that the following was able to be avoided: the benzo[f]isoquinoline skeleton in the complex serving as the guest was brought into a radical state.

Example 15

A top emission-type organic light-emitting device was produced by a method described below.

First, Al was formed into a film on a glass substrate (transparent substrate) by a sputtering method to form an Al layer. Next, an indium zinc oxide was formed into a film on the Al layer by the sputtering method to form a transparent electrode layer. At this time, the thickness of the transparent electrode layer was set to 80 nm. Next, an acrylic resin was formed into a film on the transparent electrode layer and then patterning was performed by employing a photolithography process. Thus, a pixel separation film was obtained. At this time, a laminated electrode layer formed by laminating the Al layer and the transparent electrode layer in the stated order was divided by the pixel separation film, and an electrode area per one pixel was 3 mm². Thus, a substrate with an electrode was obtained.

Organic compound layers and electrode layers shown in Table 4 below were continuously formed on the ITO substrate. It is to be noted that a vacuum vapor deposition method based on resistance heating in a vacuum chamber having a pressure condition of $1\times10^{-5}$ Pa was adopted as a film-forming method.

TABLE 4

| | Material | Thickness [nm] |
|---|---|---|
| Hole-injecting layer | HT-1 | 50 |
| Hole-transporting layer | HT-8 | 10 |
| Emission layer | L-105 (host) Ir-316 (guest) M-103 (third component) (L-105:Ir-316:M-103 = 75:5:20 (weight ratio)) | 30 |
| Hole/exciton-blocking layer | ET-3 | 10 |
| Electron-injecting layer | ET-2, cesium carbonate (ET-2:Cs$_2$CO$_3$ = 97:3 (weight ratio)) | 50 |
| Transparent electrode layer | Indium zinc oxide | 30 |

Next, the produced device was encapsulated with a glass cap with a moisture absorbent in an inert atmosphere to provide an organic light-emitting device.

The emission efficiency of the resultant organic light-emitting device was measured and evaluated in the same manner as in Example 1. As a result, the emission efficiency was 40 cd/A.

The foregoing shows that the organic compound represented by the general formula [5] or [10] is a host that provides high emission efficiency, and the compound can improve the light-emitting characteristics (such as emission efficiency) of an organic light-emitting device when used in the device together with the iridium complex represented by the general formula [1] ([6]).

As described above with reference to the embodiments and Examples, according to the present invention, it is possible to provide the organic light-emitting device improved in emission efficiency and lifetime.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-285620, filed Dec. 27, 2012, and Japanese Patent Application No. 2013-264147, filed Dec. 20, 2013, which are hereby incorporated by reference herein in their entirety.

The invention claimed is:

1. An organic light-emitting device comprising:

a pair of electrodes; and an organic compound layer disposed between the pair of electrodes, wherein the organic compound layer includes an iridium complex represented by the following general formula [1] and a hydrocarbon compound represented by the following general formula [5]; and the hydrocarbon compound comprises a compound formed only of an SP² carbon atom and a hydrogen atom:

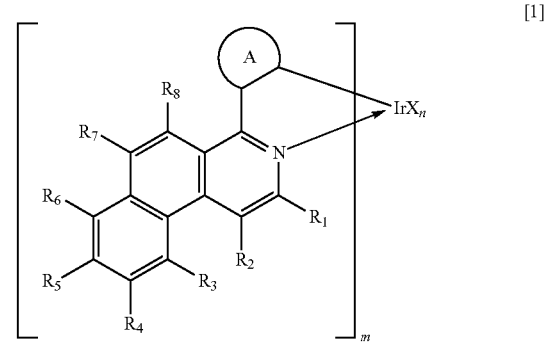

[1]

in the formula [1]:

R$_1$ to R$_8$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group;

m represents an integer of 1 to 3 and n represents an integer of 0 to 2, provided that m+n equals 3;

a ring A represents a cyclic structure selected from a benzene ring, a naphthalene ring, a fluorene ring, a phenanthrene ring, a 9,9-spirobifluorene ring, and a chrysene ring, and is covalently bonded to a benzo [f]isoquinoline skeleton and an Ir metal, and the ring A may further have a substituent;

X represents a bidentate ligand; and a partial structure IrX$_x$ comprises any one of structures represented by the following general formulae [2] to [4]:

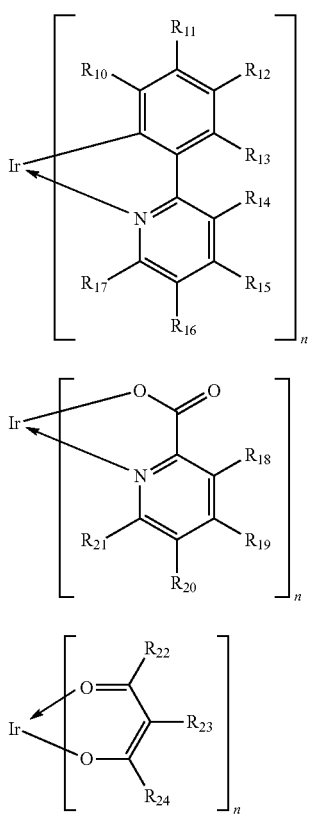

in the formulae [2] to [4]:

R$_{10}$ to R$_{24}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group;

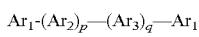   [5]

in the formula [5]:

p and q each represent 0 or 1, and p+q is equal to or more than 1;

Ar$_1$ represents any one of substituents represented in the following substituent group α; and Ar$_2$ and Ar$_3$ each represent any one of substituents represented in the following substituent group β, and Ar$_2$ and Ar$_3$ may be identical to or different from each other

[Substituent group α]

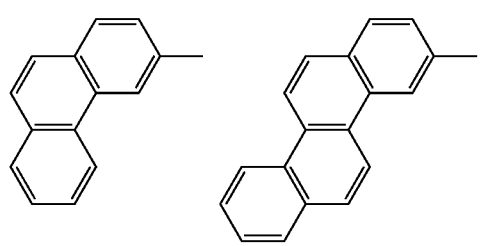

[Substituent group β]

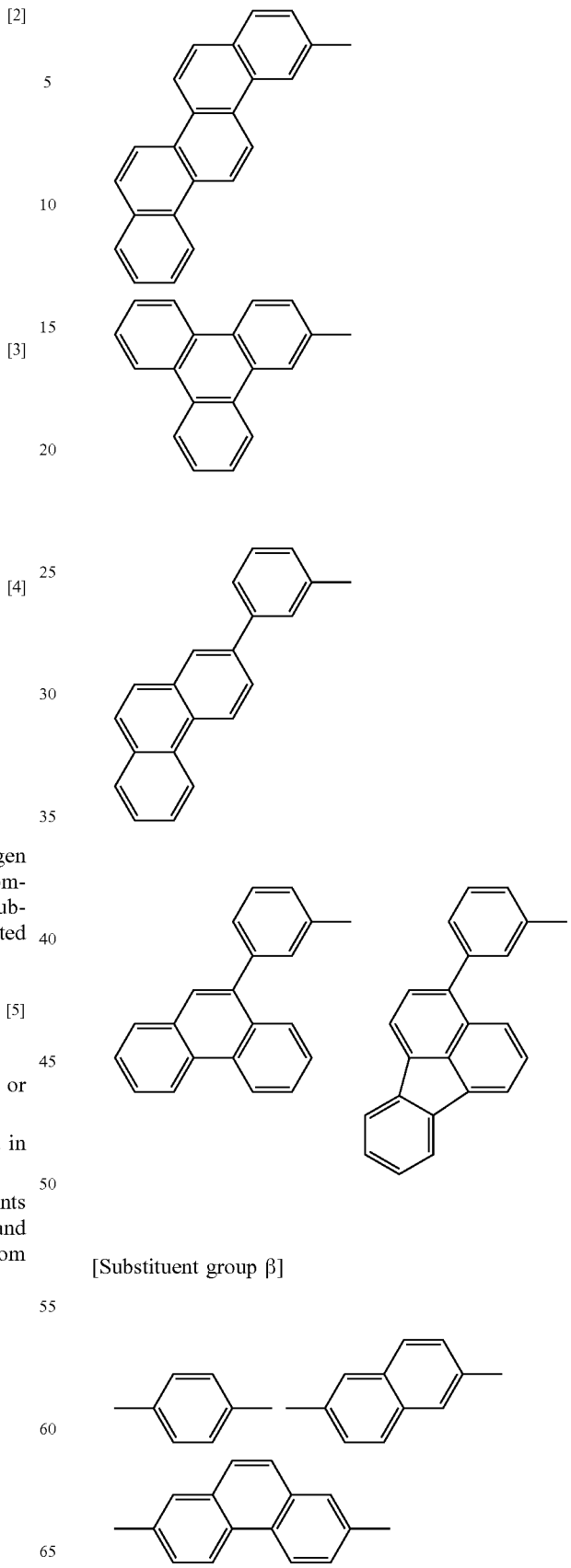

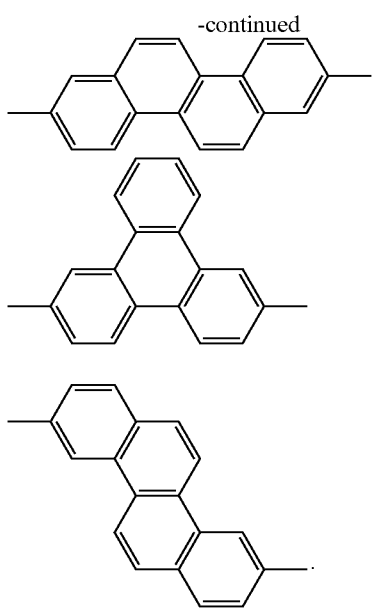

2. The organic light-emitting device according to claim 1, wherein m represents 2 and n represents 1.

3. The organic light-emitting device according to claim 1, wherein the iridium complex is represented by the following formula [11]:

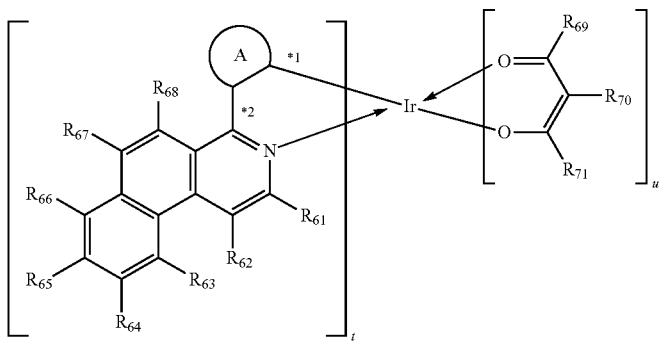

[11]

in the formula [11]:

- $R_{61}$ to $R_{71}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group;
- t represents an integer of 1 to 3 and u represents an integer of 0 to 2, provided that t+u equals 3;
- *1 represents a bond between the ring A and the Ir metal, and *2 represents a bond between the ring A and a carbon atom at a 1-position in the benzo[f]isoquinoline skeleton; and
- the ring A comprises any one of structures represented by the following general formulae [12] to [16]:

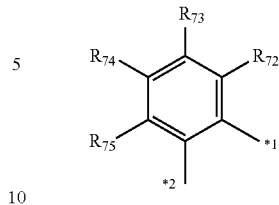

[12]

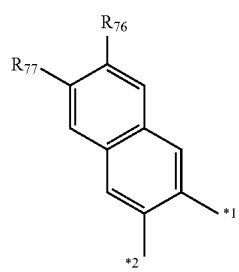

[13]

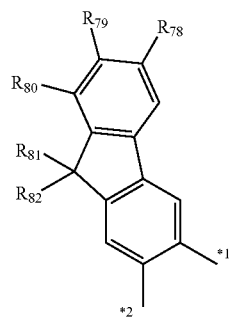

[14]

-continued

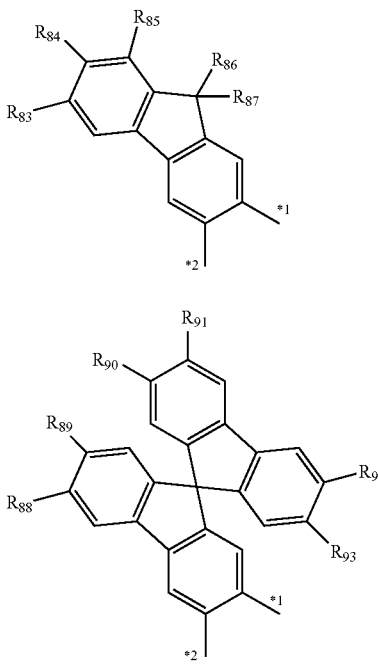

[15]

[16]

in the formulae [12] to [16]:
$R_{72}$ to $R_{93}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group; and 1 represents a bonding position with the Ir metal and *2 represents a bonding position with the carbon atom at the 1-position in the benzo[f]isoquinoline skeleton.

4. The organic light-emitting device according to claim 3, wherein the ring A comprises the structure represented by the general formula [12].

5. The organic light-emitting device according to claim 1, wherein the iridium complex comprises an iridium complex represented by the following general formula [17]:

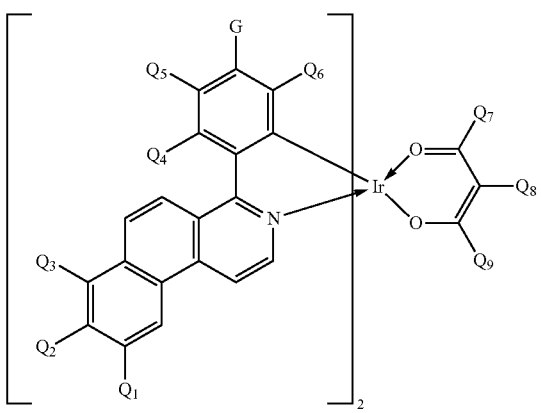

[17]

in the formula [17]:
$Q_1$ to $Q_9$ each represent a hydrogen atom, a halogen atom, an alkyl group, an alkoxy group, a trifluoromethyl group, or a cyano group; and G represents a hydrogen atom, a halogen atom, an alkyl group, an alkoxy group, a trifluoromethyl group, a cyano group, or a substituted or unsubstituted phenyl group.

6. The organic light-emitting device according to claim 1, wherein the organic compound layer is formed of the iridium complex, the hydrocarbon compound, and a third component.

7. The organic light-emitting device according to claim 6, wherein a highest occupied molecular orbital (HOMO) level of the third component is larger in energy than a HOMO of the hydrocarbon compound.

8. The organic light-emitting device according to claim 6, wherein a lowest unoccupied molecular orbital (LUMO) level of the third component is smaller in energy than a LUMO of the hydrocarbon compound.

9. A display apparatus comprising multiple pixels, wherein each pixel has the organic light-emitting device according to claim 1 and a transistor connected to the organic light-emitting device.

10. The display apparatus according to claim 9, wherein the transistor includes an electrode formed of a transparent oxide semiconductor.

11. The display apparatus according to claim 9, further comprising a color filter.

12. An imaging apparatus comprising:
a display portion, the display portion comprising the display apparatus according to claim 9.

13. A lighting apparatus comprising:
the organic light-emitting device according to claim 1; and
an AC/DC converter.

14. An organic light-emitting device comprising:
a pair of electrodes; and
an organic compound layer disposed between the pair of electrodes,
wherein the organic compound layer includes an iridium complex represented by the following general formula [6] and a hydrocarbon compound represented by the following general formula [10]:

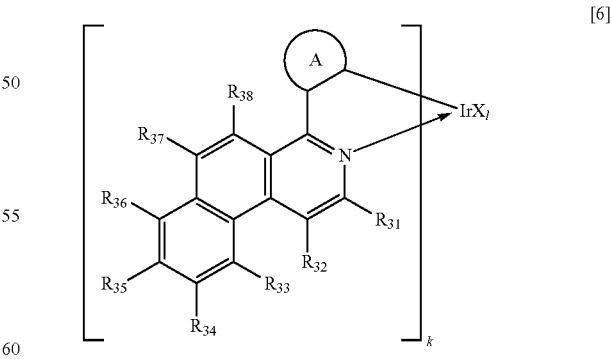

[6]

in the formula [6]:
$R_{31}$ to $R_{38}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group;

k represents an integer of 1 to 3 and l represents an integer of 0 to 2, provided that k+l equals 3;

a ring A represents a cyclic structure selected from a benzene ring, a naphthalene ring, a fluorene ring, a phenanthrene ring, a 9,9-spirobifluorene ring, and a chrysene ring, and is covalently bonded to a benzo[f]isoquinoline skeleton and an Ir metal, and the ring A may further have a substituent;

X represents a bidentate ligand; and a partial structure $IrX_1$ comprises any one of structures represented by the following general formulae [7] to [9]:

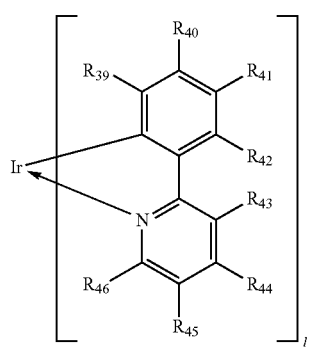

[7]

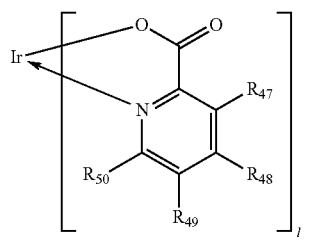

[8]

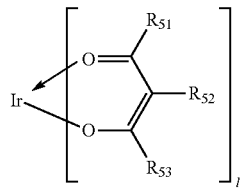

[9]

in the formulae [7] to [9]:
  $R_{39}$ to $R_{53}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group;

$$Ar_5-(Ar_6)_r-(Ar_7)_s-Ar_8 \quad [10]$$

in the formula [10]:
  r and s each represent 0 or 1, and r+s is equal to or more than 1;
  $Ar_5$ represents any one of substituents represented in the following substituent group α';
  $Ar_6$ and $Ar_7$ each represent any one of substituents represented in the following substituent group β', and $Ar_6$ and $Ar_7$ may be identical to or different from each other; and
  $Ar_8$ represents any one of substituents represented in the following substituent group γ'

[Substituent group α']

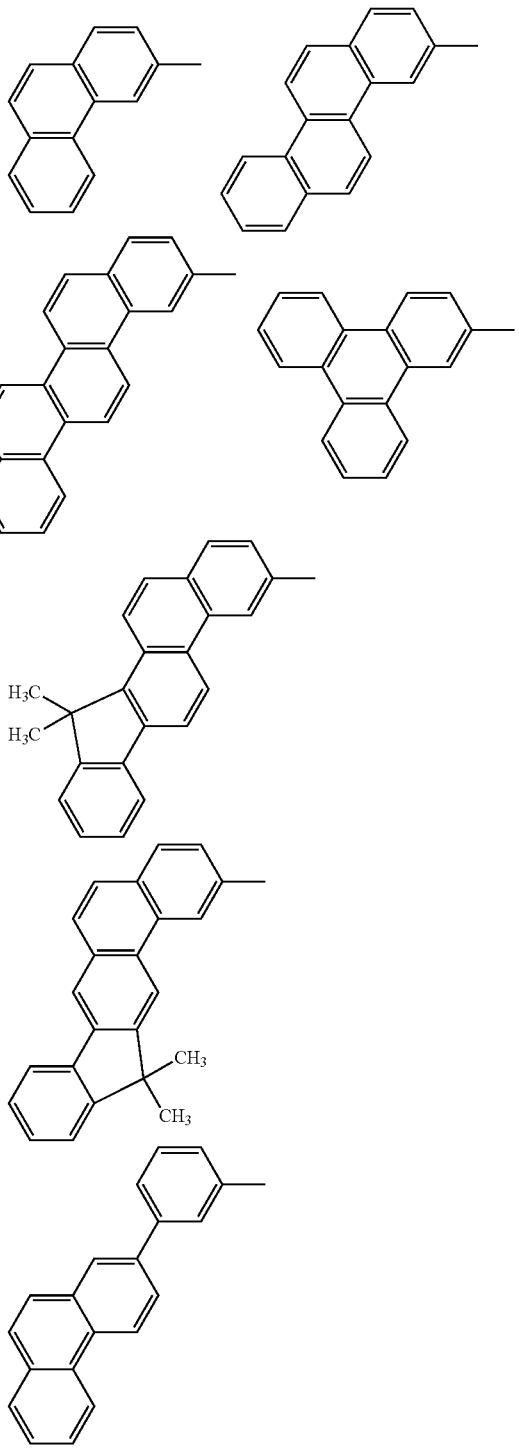

[Substituent group β']

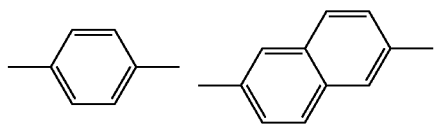

-continued

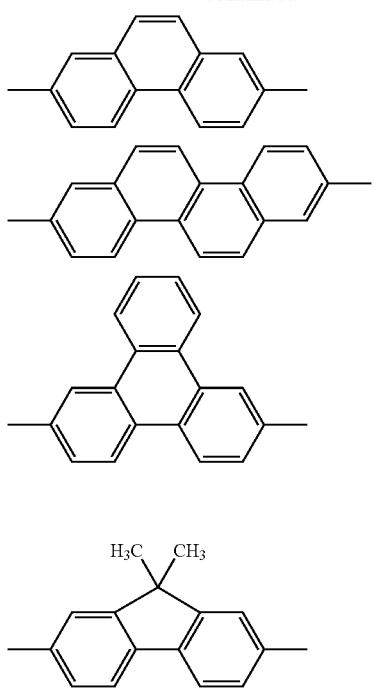

[Substituent group γ′]

-continued

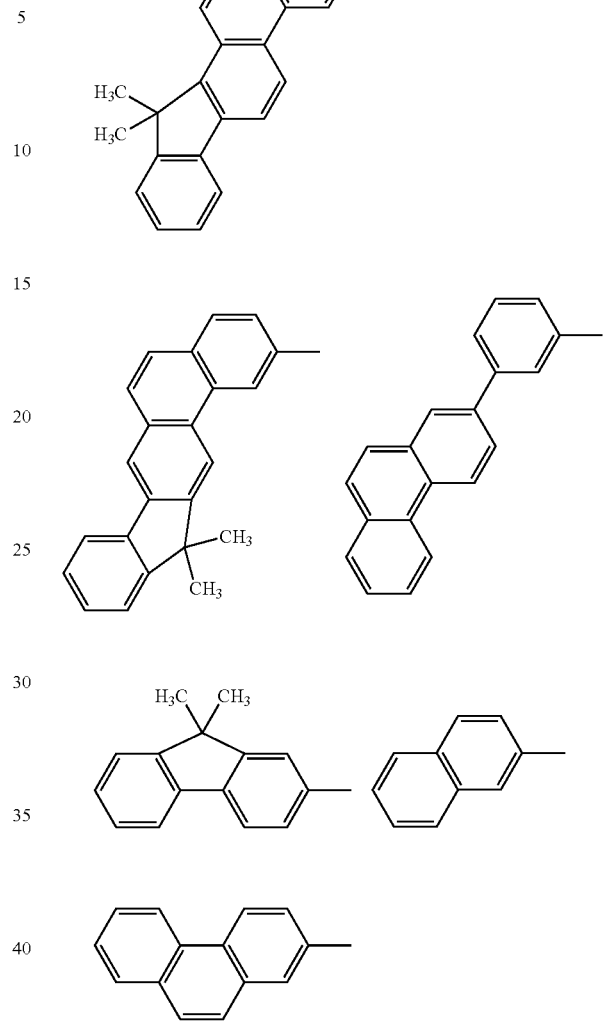

provided that the hydrocarbon represented by general formula [10] is not

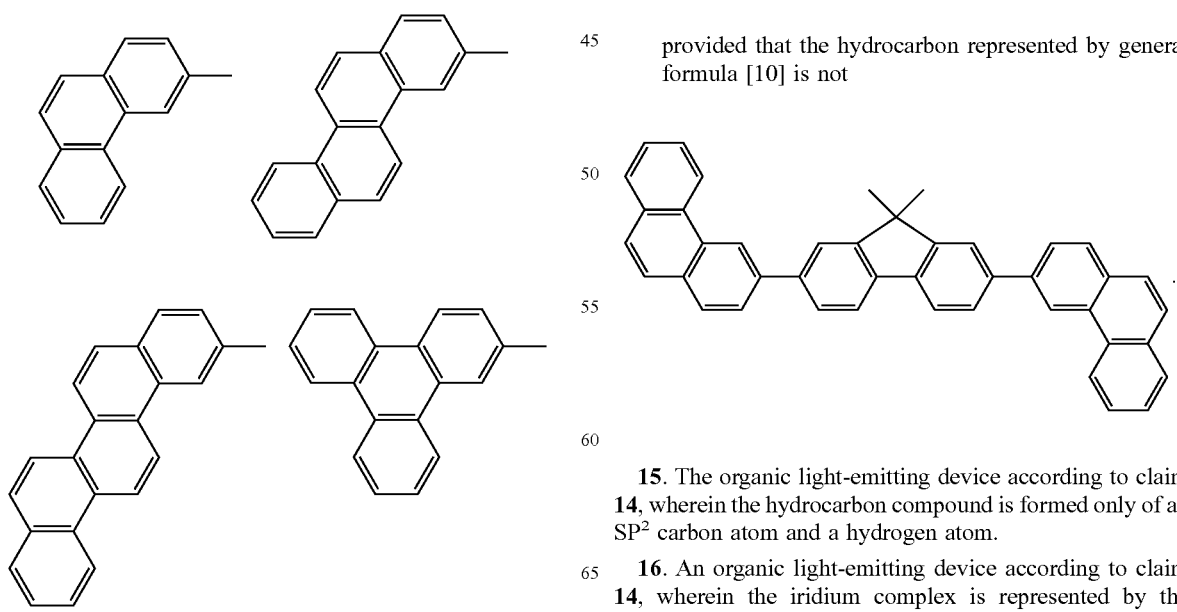

15. The organic light-emitting device according to claim 14, wherein the hydrocarbon compound is formed only of an $SP^2$ carbon atom and a hydrogen atom.

16. An organic light-emitting device according to claim 14, wherein the iridium complex is represented by the following formula [11]:

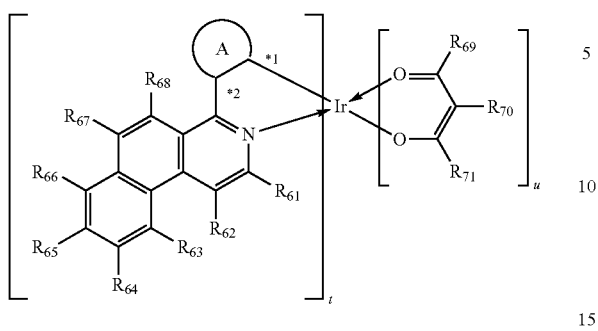
[11]

in the formula [11]:

R$_{61}$ to R$_{71}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group;

t represents an integer of 1 to 3 and u represents an integer of 0 to 2, provided that t+u equals 3;

1 represents a bond between the ring A and the Ir metal, and *2 represents a bond between the ring A and a carbon atom at a 1-position in the benzo[f]isoquinoline skeleton; and the ring A comprises any one of structures represented by the following general formulae [12] to [16]:

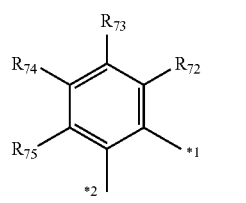
[12]

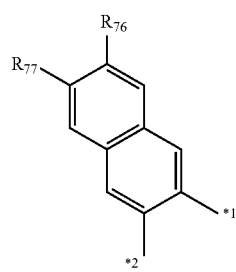
[13]

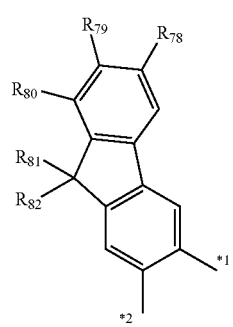
[14]

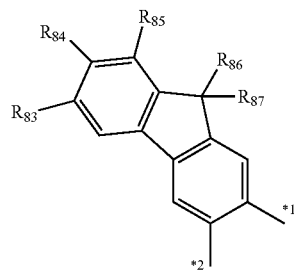
[15]

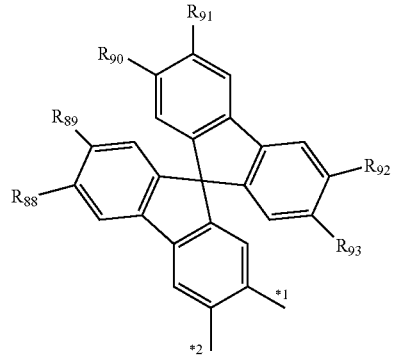
[16]

in the formulae [12] to [16]:

R$_{72}$ to R$_{93}$ each represent a hydrogen atom, a halogen atom, an alkyl group, an alkoxy group, a trifluoromethyl group, a cyano group, a substituted or unsubstituted aromatic hydrocarbon group, or a substituted or unsubstituted heteroaromatic group; and 1 represents a bonding position with the Ir metal and *2 represents a bonding position with the carbon atom at the 1-position in the benzo[f]isoquinoline skeleton.

17. The organic light-emitting device according to claim 16, wherein the ring A comprises the structure represented by the general formula [12].

18. The organic light-emitting device according to claim 14, wherein the iridium complex comprises an iridium complex represented by the following general formula [17]:

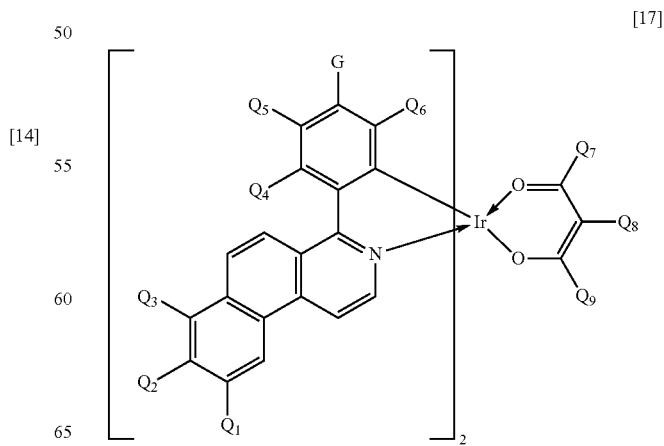
[17]

in the formula [17]:

Q$_1$ to Q$_9$ each represent a hydrogen atom, a halogen atom, an alkyl group, an alkoxy group, a trifluoromethyl group, or a cyano group; and G represents a hydrogen atom, a halogen atom, an alkyl group, an alkoxy group, a trifluoromethyl group, a cyano group, or a substituted or unsubstituted phenyl group.

19. The organic light-emitting device according to claim 14, wherein the organic compound layer is formed of the iridium complex, the hydrocarbon compound, and a third component.

20. The organic light-emitting device according to claim 19, wherein a highest occupied molecular orbital (HOMO) level of the third component is higher than an HOMO of the hydrocarbon compound.

21. The organic light-emitting device according to claim 19, wherein a lowest unoccupied molecular orbital (LUMO) level of the third component is higher than an LUMO of the hydrocarbon compound.

22. A display apparatus, comprising multiple pixels, wherein each pixel has the organic light-emitting device according to claim 14 and a transistor connected to the organic light-emitting device.

23. The display apparatus according to claim 22, wherein the transistor includes an electrode formed of a transparent oxide semiconductor.

24. A display apparatus according to claim 22, further comprising a color filter.

25. An imaging apparatus comprising:

a display portion, the display portion comprising the display apparatus according to claim 22.

26. A lighting apparatus comprising:

the organic light-emitting device according to claim 14; and an AC/DC converter.

* * * * *